United States Patent
Nagahama et al.

(10) Patent No.: US 7,095,051 B2
(45) Date of Patent: Aug. 22, 2006

(54) NITRIDE SEMICONDUCTOR ELEMENT

(75) Inventors: Shinichi Nagahama, Anan (JP); Tomoya Yanamoto, Anan (JP)

(73) Assignee: Nichia Corporation, Tokushima (JP)

( * ) Notice: Subject to any disclaimer, the term of this patent is extended or adjusted under 35 U.S.C. 154(b) by 193 days.

(21) Appl. No.: 10/473,159

(22) PCT Filed: Mar. 28, 2002

(86) PCT No.: PCT/JP02/03052

§ 371 (c)(1),
(2), (4) Date: Sep. 29, 2003

(87) PCT Pub. No.: WO02/080320

PCT Pub. Date: Oct. 10, 2002

(65) Prior Publication Data

US 2004/0051107 A1    Mar. 18, 2004

(30) Foreign Application Priority Data

| Mar. 28, 2001 | (JP) | 2001-091578 |
| May 15, 2001 | (JP) | 2001-144214 |
| Jul. 9, 2001 | (JP) | 2001-208553 |
| Jul. 30, 2001 | (JP) | 2001-230684 |

(51) Int. Cl.
H01L 27/15 (2006.01)

(52) U.S. Cl. ............... 257/79; 257/13; 257/86; 257/94; 257/99; 257/103

(58) Field of Classification Search ............. 257/79–103
See application file for complete search history.

(56) References Cited

U.S. PATENT DOCUMENTS 6,359,292 B1 *  3/2002  Sugawara et al. .......... 257/103
6,434,178 B1     8/2002  Ubukata

FOREIGN PATENT DOCUMENTS

| EP | 0661782 A1 | 7/1995 |
| EP | 0 908 988 A2 | 4/1999 |
| JP | 6-77592 | 3/1994 |
| JP | 6-260719 | 9/1994 |
| JP | 9-260725 | 10/1997 |
| JP | 10-126006 | 5/1998 |
| JP | 11-74607 | 3/1999 |

(Continued)

OTHER PUBLICATIONS

Shin-ichi Nagahama et al., "Characteristics of Ultravoilet Laser Diodes Composed of Quaternary AlxInyGa (1-x-y)N" Aug. 1, 2002, pp L778-L791.

(Continued)

Primary Examiner—Wai-Sing Louie
(74) Attorney, Agent, or Firm—Morrison & Foerster LLP

(57) ABSTRACT

In a nitride semiconductor device having an active layer 12 between a first electrically conductive type of layer and a second electrically conductive type of layer, a quantum well structure is adopted in which an active layer 12 has at least a well layer 11 formed of a nitride semiconductor containing In and Al and a barrier layer 2 formed of a nitride semiconductor containing Al, whereby a laser device excellent in emitting efficacy at a short wavelength region is obtained. It is particularly preferable that said well layer 1 is formed of $Al_xIn_yGa_{1-x-y}N$ ($0<x\leq1$, $0<y\leq1$, $x+y<1$) and said barrier layer 2 is formed of $Al_uIn_vGa_{1-u-v}N$ ($0<u\leq1$, $0\leq v\leq1$, $u+v<1$).

Such a light emitting device is realized to obtain excellent efficacy in emitting light of short wavelength in a region of 380 nm.

27 Claims, 14 Drawing Sheets

FOREIGN PATENT DOCUMENTS

| | | |
|---|---|---|
| JP | 11-224969 | 8/1999 |
| JP | 11-261105 | 9/1999 |
| JP | 11-274644 | 10/1999 |
| JP | 11-307866 | 11/1999 |
| JP | 11-340580 | 12/1999 |
| JP | 2000-12982 | 1/2000 |
| JP | 2000-31537 | 1/2000 |
| JP | 2000-77795 | 3/2000 |
| JP | 2000-91708 | 3/2000 |
| JP | 2000-196194 | 7/2000 |
| JP | 2000-223790 | 8/2000 |
| JP | 2001-168471 | 6/2001 |
| WO | WO-99/16156 A1 | 4/1999 |

OTHER PUBLICATIONS

Shin-ichi Nagahama et al., "Ultraviolet GaN Single Quantum Well Laser Diodes" Aug. 1, 2001, pp. L785-L787.
Translation of International Preliminary Examination Report; Form PCT/IPEA/409; International Application No. PCT/JP02/03052.
International Search Report directed to PCT/JP02/11491.
Translation of International Preliminary Examination Report; Form PCT/IPEA/409; International Application No. PCT/J2/03052.

\* cited by examiner

Growing direction

NITRIDE SEMICONDUCTOR ELEMENT

TECHNICAL FIELD

The present invention relates to a nitride semiconductor device which uses III–V Group nitride semiconductor, used in a light emitting device such as a light emitting diode device (LED), a laser diode device(LD), super photoluminescent diode and the like, a light receiving device such as a solar battery, a photosensor and the like, or an electronic device such as a transistor, a power device and the like, in particular, a nitride semiconductor light emitting device operable to emit light of wavelength of 380 nm or shorter.

BACKGROUND

Currently, a semiconductor laser using a nitride semiconductor has an increased demand on utilization of an optical disk system which can record and reproduce information at a large capacity and a high density. For this reason, a semiconductor laser device using a nitride semiconductor has been intensively studied. In addition, it is thought that a semiconductor laser device and a light emitting device using a nitride semiconductor can be oscillated at a wide region from ultraviolet to red color. Therefore, it is applied not only to a light source for the aforementioned optical disk system but also to a light source for a laser printer and an optical network. The present applicant have already announced a laser which can continuously oscillate for longer than ten thousands hours under the conditions of 405 nm, room temperature and 5 mW.

In addition, a laser device, a light emitting device and a light receiving device using a nitride semiconductor have a structure in which an active layer may be formed by using a nitride semiconductor containing In and, therefore, formation of a more excellent active region in an active layer becomes important for improving the device properties.

In addition, in a nitride semiconductor device, particularly, in a laser device and a light emitting device, light emitting and oscillation at a wavelength of 380 nm or shorter are highly required. In the aforementioned optical disk system, a recording density is improved by a shorter wavelength and, in a light emitting device, a nitride semiconductor device becomes important as a light source for exciting a fluorescent body. Also in other applications, many uses can be realized by a light source of further shorter wavelength.

In order to obtain light emitting at a short wavelength in a nitride semiconductor laser device or light emitting device, an emitting wavelength can be varied by changing an In crystal mixing ratio in a nitride semiconductor containing In in an active layer or a light emitting layer and more specifically, an emitting wavelength can be shortened by decreasing an In crystal mixing ratio. In addition, when an active layer has a structure in which said active layer is sandwiched between an upper cladding layer and a lower cladding layer in an end emitting device or a laser device, by rendering a refractive index of both cladding layers small and rendering a refractive index of inside of a waveguide between an upper cladding layer and a lower cladding layer high, the light is effectively confined in a waveguide, which results in contribution to decrease in a threshold current density in a laser device.

However, as a wavelength grows shorter, it becomes difficult to use a quantum well structure of InGaN or InGaN/InGaN which have previously been used as a light emitting layer and, at a wavelength of not greater than 365 nm corresponding to a band gap for GaN, it becomes difficult to use InGaN as a light emitting layer. In addition, when a wavelength becomes shorter, the loss occurs due to light absorption in a guiding layer in a waveguide, resulting in an enhanced threshold current. Further, also in light confinement by an upper cladding layer and a lower cladding layer, since the use of GaN maintains a difference in a refractive index for loss due to light absorption and light confinement in a waveguide, it is necessary to use a nitride semiconductor having a great Al ratio and, thus, a problem of the crystallizing property becomes more important.

In addition, as an attempt to make a wavelength of such the nitride semiconductor device shorter, a quantum well structure of AlGaN/AlGaN is used and, however, there is a tendency that sufficient output can not be obtained as compared with the conventional InGaN system.

In addition, in the case where a nitride semiconductor containing Al such as AlGaN is used in an device, a difference in the thermal expansion coefficient and the elasticity are greatly different as compared with other nitride semiconductors containing no Al and, thus, when a nitride semiconductor containing Al is used, crack is easily produced, production of crack destroys an device unlike the other crystallizing properties and, therefore, if crack is not prevented from occurring, an device does not serve as a nitride semiconductor device. For this reason, in a light emitting device and a laser device using the aforementioned active layer having an emitting wavelength of 380 nm or shorter, since a nitride semiconductor containing Al can make the band gap energy greater in a nitride semiconductor, it is used in an active layer, as well as a carrier confining layer, a light guiding layer and a light confining layer having the greater band gap energy than that of the active layer. That is, in the aforementioned light emitting device of a shorter wavelength area, a nitride semiconductor containing Al has a multi-layered structure. On the other hand, the aforementioned problem of production of crack becomes serious and, therefore, there is a tendency that shorter wavelength and prevention of crack production has the contradictory relationship, and this becomes a serious barrier to more shorter wavelength in a light emitting device of a nitride semiconductor. Further, since GaN has an absorption end for light at 360 nm and has a high absorption coefficient even at a region of a longer wavelength than that of the end by around 10 nm, it becomes difficult to use GaN in a light emitting device and a laser device in the aforementioned shorter wavelength area of 380 nm or shorter.

In addition, since an active layer in a light emitting device or a laser device has the emitting efficacy and the internal quantum efficacy depending greatly upon the crystallizing property thereof as described above, the crystallizing property of an electrically conductive type of layer arranged below an active layer becomes an extremely important factor for improving the properties of an device. Usually, a nitride semiconductor light emitting device has a structure in which a n-type layer, an active layer and a p-type layer are laminated in this order and, in this case, it is necessary to make the crystallizing property of a n-type layer better. On the other hand, as described above, there is a tendency that the crystallizing property of a nitride semiconductor containing Al is greatly deteriorated as compared with other nitride semiconductors containing no Al and, previously, for the purpose of avoiding such the problem, a nitride semiconductor layer containing In is used as a substrate layer for a nitride semiconductor containing Al to alleviate occurrence of the internal stress due to a difference in the thermal expansion coefficient, a nitride semiconductor containing no Al such as Ga is provided adjacent to a nitride semiconductor layer containing Al to realize recovery of the crystallizing property and alleviation of the internal stress, whereby, it allows an device such as a laser device having a structure in which a nitride semiconductor layer containing Al is provided therein, to be practically exerted. However, in the aforementioned light emitting device and laser device having a shorter wavelength, a nitride semiconductor containing no Al becomes a light-absorbing layer and use of it in an device structure is not preferable and, for this reason, most of device structures use a nitride semiconductor layer containing Al. Thus, a light emitting device and a laser device having the practical threshold Vf and emitting efficacy can not be obtained due to the aforementioned crystallizing property and occurrence of crack and, in particular, in a laser device which uses much nitride semiconductors containing Al and having a greater Al crystal mixing ratio in a light-guiding layer or a cladding layer for light confinement, a laser device which can be continuously oscillated at room temperature can not be obtained.

SUMMARY OF THE INVENTION

An object of the present invention is to increase emitting output in a nitride semiconductor device, more specifically, in a laser device or a light emitting device having a light wavelength of 380 nm or shorter, to suppress light absorption low in a waveguide in which an active layer has a decreased threshold current density and is provided between cladding layers, to confine the light effectively into a waveguide including an active layer, and to form a device structure with the better crystallizing property.

An another object of the present invention is to elucidate a cause for a problem that a particularly remarkable increase in a threshold appears at laser oscillation at 380 nm or shorter and provide the means for solving the problem.

In view of the aforementioned circumstances, the present invention can obtain a nitride semiconductor device which is excellent in the device properties such as a threshold current density, has the better crystallizing property, is excellent in emitting output, and can realize a shorter wavelength.

That is, a nitride semiconductor device of the present invention can attain the above object by the following features.

(1) A nitride semiconductor device, which comprises an active layer provided between a first electrically conductive type of layer and a second electrically conductive type of layer, wherein said active layer has a quantum well structure including at least a well layer formed of a nitride semiconductor containing In and Al, and a barrier layer formed of a nitride semiconductor containing Al.

Whereby, inclusion of In in a well layer improves the emitting efficacy and, on the other hand, variation of an Al ratio, a desired emitting wavelength corresponding to a band gap energy thereof can be obtained, resulting in a laser device or a light emitting device excellent in the emitting efficacy and the internal quantum efficacy. In addition, by allowing a barrier layer to contain at least Al, an active layer having a quantum well structure can be realized in which the band gap energy thereof is larger than that of a well layer so as to adjust an emitting wavelength and, thus, an active layer having the excellent device properties at a short wavelength region of a wavelength of 380 nm or shorter is obtained.

(2) It is preferable in the above feature that said well layer is formed of $Al_xIn_yGa_{1-x-y}N$ ($0<x\leq 1$, $0<y\leq 1$, $x+y<1$) and said barrier layer is formed of $Al_uIn_vGa_{1-u-v}N$ ($0<u\leq 1$, $0\leq v\leq 1$, $u+v<1$).

By formation of a well layer of InAlGaN quaternary mixed crystal, the number of constituent elements is minimized and deterioration of the crystallizing property is suppressed, resulting in a well layer and an active layer having the high emitting efficacy. For this reason, $0<x<1$, and $0<y<1$ is preferable. In addition, formation of a barrier layer of AlGaN or InAlGaN, a quantum well structure is formed in which a desired difference in the band gap energy is set between a well layer and a barrier layer. On the other hand, by using the same constituent elements as those of a well layer or by rendering smaller, the crystallizing property in an active layer can be maintained better. Preferably, $x<u$ can afford an active layer having the excellent crystallizing property.

(3) It is preferable in the above feature that a thickness of said well layer is smaller than that of the barrier layer.

Whereby, carriers can be injected efficiently in an active layer, resulting in a quantum well structure excellent in the emitting efficacy. In particular, by adopting a thickness of an n-side barrier layer arranged within an active layer in a side nearest to an n-type nitride semiconductor layer greater than a thickness of a well layer, a thickness of other barrier layer, especially, a thickness of a barrier layer between well layers, p-type carriers can be effectively confined into an active layer. Preferably, by rendering a thickness of an n-side barrier layer 10 nm or greater, it functions as an excellent hole-confinement layer, resulting in an active layer having the better properties.

(4) It is preferable in the above feature that an In composition ratio y in said well layer is in a range of not less than 0.02 and not greater than 0.05.

Whereby, by adopting y of 0.02 or greater, a well layer and an active layer excellent in the emitting efficacy and the internal quantum efficacy can be obtained. By adopting y of 0.05 or smaller, an active layer can be obtained in which deterioration of the crystallizing property is suppressed in a mixed crystal system containing In and Al. By adopting y of a range 0.02 to 0.05, threshold current density can be maintained lower.

(5) It is preferable in the above feature that an In composition ratio y in said well layer is in a range of not less than 0.03 and not greater than 0.05.

Whereby, by adopting y of 0.03 or greater, a well layer and an active layer excellent in the emitting efficacy and the internal quantum efficacy can be obtained. By adopting 0.05 or smaller, an active layer can be obtained in which deterioration of the crystallizing property is suppressed in a mixed crystal system containing In and Al.

(6) It is preferable in the above feature that an emitting wavelength of said active layer is 380 nm or shorter.

The aforementioned active layer structures can afford a device having the excellent properties in a short wavelength region of 380 nm or shorter.

(7) It is preferable in the above feature that said device has a laser device structure in which said first electrically conductive type of layer has a first light guiding layer, said second electrically conductive type of layer has a second light guiding layer, and said active layer is provided between said first light guiding layer and said second light guiding layer, and the band gap energies $E_g$ of both said first light guiding layer and said second light guiding layer are greater than the photon energy $E_p$ of laser light by 0.05 eV or greater ($E_g-E_p\geq 0.05$ eV).

Whereby, in a laser device and an end-emitting type device, a waveguide excellent in guiding the light can be obtained. More preferably, $E_g-E_p\geq 0.1$ can form the further better waveguide in the aforementioned short wavelength, resulting in improvement in the device properties.

(8) It is preferable in the above feature that said first light guiding layer and/or said second light guiding layer are formed of $Al_xGa_{1-x}N$ ($0 \leq x \leq 1$).

Whereby, a waveguide structure with low light loss in a short wavelength region can be obtained, which results in improvement in the properties of a laser device and an end emitting device.

(9) It is preferable in the above feature that said active layer emitts light of wavelength of 380 nm or shorter, and said first electrically conductive type of layer and/or said second electrically conductive type of layer are formed of $Al_xGa_{1-x}N$ ($0<x \leq 1$).

For example, by forming a cladding layer of AlGaN, carrier confinement and light confinement can be realized better. When a light guiding layer is provided between a cladding layer and an active layer, by varying an Al ratio among these of the cladding layer and the light guiding layer to set a desired difference in a refractive index between both layers, a laser device and an end emitting device excellent in the properties are obtained.

(10) A nitride semiconductor device having an active layer between a first electrically conductive type of layer and a second electrically conductive ype of layer, wherein said active layer has a quantum well structure including at least a well layer formed of a nitride semiconductor containing Al, and a first barrier layer formed of a nitride semiconductor having a band gap energy larger than that of the well layer in a side near to the first electrically conductive type of layer from the well layer, and said first electrically conductive type of layer includes a first nitride semiconductor layer having a band gap energy smaller than that of said first barrier layer, and said first nitride semiconductor layer is provided near said first barrier layer.

In the conventional AlGaN series active layer, the band gap energy larger than that of a well layer is usually required in respective electrically conductive type of layers provided in both sides of the active layer as a carrier injecting layer. However, in this construction, by providing at a first electrically conductive type of layer a first nitride semiconductor layer having a band gap energy smaller than that of a first barrier layer within an active layer, a novel device structure can be realized, which forms an active layer having the better crystallizing property and which has the function of confinement of carriers from a second electrically conductive type of layer into a well layer with the first barrier layer.

For a well layer, a nitride semiconductor containing Al having the band gap energy which is at least the same as that of GaN or larger may be used and, specifically, the aforementioned composition may be used. Also for a first barrier layer, a nitride semiconductor having the aforementioned composition may be used.

For a first nitride semiconductor layer, by using preferably a nitride semiconductor having the band gap energy larger than that of the well layer, it functions as a layer for effectively injecting carriers into an active layer and a well layer. More specifically, a nitride semiconductor containing Al may be used, and an active layer having the preferable crystallizing property can be formed by using preferably $Al_xGa_{1-x}N$ ($0 \leq x<1$).

(11) It is preferable in the above feature that said first barrier is arranged in a side nearest to the first electrically conductive type of layer within the active layer, and said first nitride semiconductor layer is contacted with the active layer.

Whereby, by arranging a first barrier layer in a side near to a first electrically conductive type of layer, that is, nearest to a first electrically conductive type of layer than other barrier layers within an active layer, as described above, a first barrier layer suitably functions as a carrier confining layer in a side of a first electrically conductive type of layer and, thus, the emitting efficiency in a well layer can be enhanced. Upon this, preferably, arrangement at the mostouter side of an active layer and nearest to a first electrically conductive type of layer can permit the carrier confinement function aforementioned.

(12) It is preferable in the above feature that said first electrically conductive type of layer is of n-type, and said second electrically conductive type of layer is of p-type.

That is, by this feature, the aforementioned first barrier layer functions for confinement of holes, whereby, in the aforementioned first nitride semiconductor layer, since the barrier layer can function to inject electrons (carriers of first electrically conductive type) into a first electrically conductive type of layer and, on the other hand, functions for confinement of holes (carriers of second electrically conductive type) with difficulty, an active layer structure can be obtained which can realize confinement of holes by a first barrier layer.

(13) It is preferable in the above feature that an Al crystal mixing ratio $X_{B1}$ in said first barrier layer and an Al crystal mixing ratio $X_w$ in the well layer satisfy the following relation: $X_{B1} - X_W \geq 0.05$.

That is, by setting an Al crystal mixing ratio by the aforementioned equational relationship, a first barrier layer can suitably function for confinement of carriers (preferably holes) of a second electrically conductive type. More preferably, by $X_{B1} - X_w \geq 0.1$, offset (potential barrier) can be formed which sufficiently functions for the aforementioned carrier confinement. Upon this, an upper limit of a difference in an Al crystal mixing ratio ($X_{B1} - X_w$) is not limited in the confinement effects, but considering the crystallizing property, 0.5 or smaller is preferable. More preferably, by an upper limit of 0.3 or smaller, a device structure containing an active layer and a first electrically conductive type of layer can be formed with the better crystallizing property and sufficient light confinement.

(14) It is preferable in the above feature that a thickness of said first barrier layer is 30 Å or greater.

By this feature, a first barrier layer can have a thickness allowing carrier confinement. Preferably, by a thickness of 50 Å or greater, a structure with enhanced confinement efficacy can be obtained because, when a thickness of a first barrier layer is small, the tunneling phenomenon for carriers occurs as shown in FIG. 14B. By a thickness of 50 Å or greater, the confinement efficacy can be enhanced. An upper limit is not particularly limited in the confinement efficacy, but considering the crystallizing property, an upper limit is 300 Å or smaller. In order to obtain the more preferable crystallizing property, an upper limit is 200 Å or smaller. When an upper limit is 150 Å or smaller, a first barrier layer can be obtained which has the better crystallizing property and suitably suppresses tunneling effect.

(15) It is preferable in the above feature that a waveguide is constructed of a pair of light guiding layers and an active layer therebetween, and the light guiding layer is provided in the first electrically conductive type of layer, and has said first nitride semiconductor layer.

By allowing the aforementioned nitride semiconductor layer to function as a light guiding layer or a part thereof, even when a guiding layer having a necessary thickness for light guiding is formed, by using a first nitride semiconductor layer in which an Al crystal mixing ratio is suppressed, an active layer may be formed with the better crystallizing property. Examples of a light emitting device having such the waveguide include a laser device, an end emitting device and super luminescent diode.

(16) It is preferable in the above feature that said device is operable to oscillate light of wavelength of 375 nm or shorter, an $Al_xGa_{1-x}N$ quantum well layer ($x \geqq 0$) is provided between barrier layers which are formed of $Al_yIn_zGa_{1-y-z}N$ ($z \geqq 0$), and a band gap energy $E_w$ of the well layer is larger than a band gap energy $E_b$ of the barrier layer by 0.2 eV or greater.

When a quantum well layer is GaN, it is preferable to determine the composition of $Al_yGa_{1-y}N$ and that of $Al_yIn_zGa_{1-y-z}N$ by considering the aforementioned difference in band gap. Also when a quantum well layer is AlGaN, it is preferable to determine the composition of $Al_yGa_{1-y}N$ and that of $Al_yIn_zGa_{1-y-z}N$ by considering the aforementioned difference in band gap.

Although an active layer may be formed only of the aforementioned quantum well layer, a single quantum well layer may be formed by arranging the barrier layers both sides of a quantum well layer.

When a multiple quantum well layer is formed, an active layer is formed by combining a quantum well layer and a barrier layer, and a final layer may be formed of a well layer or a barrier layer. Adjustment can be performed depending upon the relationship with a layer structure (capping layer, guiding layer, cladding layer) connected to an active layer. Although the number of layers of a multiple quantum well is sufficiently around 2 or 3, the number of well layers may be increased in such a range that the internal quantum efficacy in an active layer is not suppressed. Alternatively, since a recombination rate in a well layer in a region near a p-side is high in many cases, variation may be made so that a region near a p-side may be a non-doped layer and a well layer in a region near n-side may be doped with silicon or the like.

(17) It is preferable in the above feature that a thickness of the well layer is 300 Å or smaller, preferably 200 Å or smaller.

(18) It is preferable in the above feature that a thickness of the barrier layer is 300 Å or smaller, preferably 200 Å or smaller.

(19) It is preferable in the above feature that said device has a SCH (separate confinement hetero) structure in which a light guiding layer and a cladding layer are provided apart from each other, and the band gap energy $E_g$ of the guiding layer is greater than the photon energy $E_p$ at oscillation by 0.05 eV.

(20) It is preferable in the above feature that the light guiding layer comprises an $Al_aGa_{1-a}N/Al_bGa_{1-b}N$ ($a \neq b$) superlattice layers.

(21) It is preferable in the above feature that the cladding layer comprises an $Al_cGa_{1-c}N/Al_dGa_{1-d}N$ ($c \neq d$) superlattice layers, and the band gap energy $E_c$ of the cladding layer is greater than that of the light guiding layer.

(22) It is preferable in the above feature that said device has a GRIN (graded index) structure in which a light confining layer with a stepwise varying refractive index is formed outside the quantum well layer, and non-doped layers are provided above and below the active layer. This GRIN structure may be used together with the aforementioned SCH to obtain a GRIN-SCH structure.

In addition, another aspect of the present invention will be explained below and this aspect may be used by combining with any one of the aforementioned features.

2{Means to Solve the Problem]

One aspect thereof is an AlGaN series semiconductor light emitting device, which comprises an $Al_xGa_{1-x}N$ quantum well layer ($x \geqq 0$) as an active layer formed on a GaN substrate, wherein said device can be oscillated at 375 nm or shorter. Another aspect is to obtain a device structure which can be also used in a light emitting device and a laser device having a waveguide, at a shorter wavelength, which can avoid a problem of occurrence of crack.

A GaN substrate can generally decrease a defect density of an epitaxial layer formed thereon in comparison with a sapphire substrate or a silicon carbide substrate. In particular, it is preferable that the crystal defect of a GaN substrate is $10^7/cm^2$ or smaller, further $10^4/cm^2$. Upon this, the crystal defect is mainly due to penetration dislocation, a light emitting device in which a waveguide or a current injection region is formed in this less defective region is preferable. This value of crystal defect density or lower can manufacture a laser device having no defect in a waveguide.

As used herein, a GaN substrate means a substrate in which GaN can be vapor phase-grown by MOCVD(metal oxide chemical vapor phase deposition)or MBE(molecular beam epitaxy) method, such as a GaN substrate formed by laterally growing, by selective growth, GaN on a heterogenous substrate such as a sapphire substrate or the like according to ELO (epitaxial lateral overgrowth) method (for example, comprising a GaN layer formed by laterally growing GaN by growth selective for a plurality of $SiO_2$ stripe regions formed on a GaN layer and GaN regions exposed between those regions), a GaN substrate obtained by laminating and vapor phase-growing a GaN layer on this substrate by HVPE(halide vapor phase epitaxy) method, or a combination with the MOCVD method, a GaN substrate obtained by vapor phase-growing GaN on this substrate according to the aforementioned ELO method, a GaN substrate formed by recrystallizing GaN on a GaN seed crystal in a supercritical fluid $NH_3$ and the like.

In the case where a GaN substrate is a GaN substrate formed by utilizing the aforementioned ELO method and a light emitting device formed on the substrate is a ridge type semiconductor laser, it is preferable that a waveguide formed from the aforementioned quantum well layer is formed parallel with the aforementioned $SiO_2$ stripe, because the crystal defects are developed by concentration parallel to $SiO_2$ stripes and form a less dense stripe shape and, therefore, the defect in a waveguide can be excluded by forming a waveguide in a region having the low defect density.

DESCRIPTION OF THE PREFERRED EMBODIMENT

Figure 1:
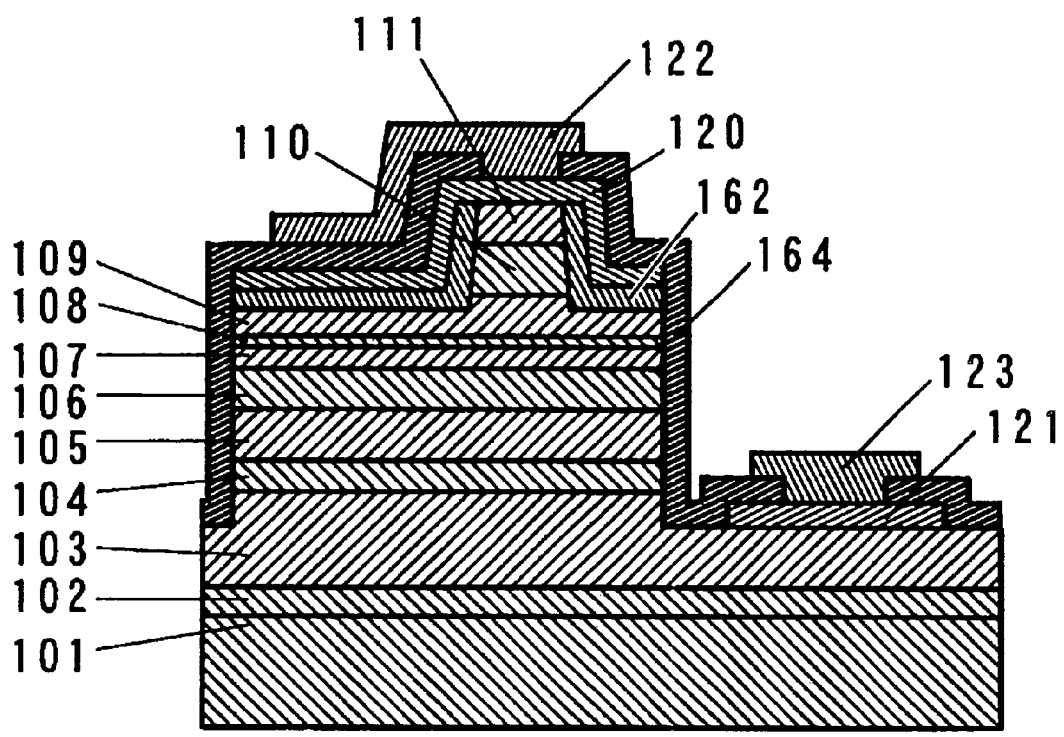
FIG. 1 is a schematic cross-sectional view explaining a laser device structure according to one embodiment of the present invention.

A nitride semiconductor used in a nitride semiconductor device of the present invention is III–V Group nitride semiconductor (In$_\alpha$Al$_\beta$Ga$_{1-\alpha-\beta}$N, $0 \leq \alpha$, $0 \leq \beta$, $\alpha+\beta \leq 1$) such as GaN, AlN or InN, or a mixed crystal thereof. Besides, a mixed crystal may be used in which B(boron) is used as a III Group element, or a part of N(nitrogen) as a V Group element is substituted with P(phosphorous) or As(arsenic). In addition, a nitride semiconductor containing Al has $\beta \geq 0$, and a nitride semiconductor containing In has $\alpha > 0$.

In addition, as n-type impurity used in a nitride semiconductor layer, IV Group elements or VI Group elements such as Si(silicon), Ge(germanium), Sn(tin), S(sulfur), O(oxygen), Ti(titanium), Zr(zirconium) and the like can be used. Preferably, Si, Ge and Sn are used and, most preferably, Si is used. In addition, a p-type impurity is not particularly limited but examples thereof include Be(bertllium), Zn(zinc), Mn(manganese), Cr(chromium), Mg(magnesium) and Ca(calcium). Preferably, Mg is used. Whereby, each electrically conductive type of nitride semiconductor layer is formed, constituting each electrically conductive type of layer to be described later.

[Embodiment 1A (Quantum Well Structure)]

A nitride semiconductor device of the present invention has a structure in which an active layer is provided at least between a first electrically conductive type of layer and a second electrically conductive type of layer. The nitride semiconductor device of the present invention will be explained in detail below.

(Active Layer)

An active layer in the present invention has a quantum well structure, has a well layer formed of a nitride semiconductor containing at least In(indium) and Al(aluminum), and a barrier layer formed of a nitride semiconductor containing Al. In addition, an active layer emits light of, preferably a short wavelength of 380 nm or shorter and, specifically, the aforementioned well layer has the band gap energy of a wavelength of 380 nm or shorter. Upon this, a nitride semiconductor used in the active layer may be either of undoped, n-type impurity doped or p-type impurity doped. Preferably, by provision of non-doped or undoped, or n-type impurity doped nitride semiconductor in an active layer, high output is attained in a nitride semiconductor device such as a laser device and a light emitting device. Preferably, by rendering a well layer undoped and rendering a barrier layer n-type impurity doped, a laser device and a light emitting device having high output are obtained, resulting in a device having the high emitting efficacy. Here, a quantum well structure may be a multiple quantum well structure or a single quantum well structure. Preferably, by adopting a multiple quantum well structure, improvement in output and decrease in an oscillating threshold becomes possible. As a quantum well structure for an active layer, a structure may be used in which at least one layer of the aforementioned well layer and at least one layer of the aforementioned barrier layer are laminated. Upon this, in the case of a quantum well structure, by adopting the number of well layers of not less than 1 and not greater than 4, decrease in a threshold current can be decreased, for example, in a laser device and a light emitting device, being preferable. More preferably, by adopting a multiple quantum well structure having the number of well layers of 2 or 3, high output laser device and light emitting device are obtained.

(Well Layer)

In a well layer in the present invention, it is preferable that a nitride semiconductor containing In and Al is used, and at least one well layer comprising a nitride semiconductor containing In and Al is contained in an active layer. In a multiple quantum well structure, preferably, by adopting such a well layer that all well layers are formed of a nitride semiconductor containing In and Al, a shorter wavelength is obtained, resulting in a light emitting device and a laser device having the high output and efficacy. When light emitting spectrum has an almost single peak, this construction is preferable. On the other hand, in a multi-color light emitting device having a plurality of peaks, by adopting at least one well layer comprising the aforementioned nitride semiconductor containing In and Al, an emitting peak at a shorter wavelength region can be obtained and, thus, a light emitting apparatus in a combination with a light emitting device having a variety of emitting colors or a fluorescent body which is excited at the shorter wavelength region, can be obtained. Upon this, in the case of a device of multicolor emitting, by using In$_\alpha$Ga$_{1-\alpha}$N ($0 < \alpha \leq 1$) as a specific composition for a well layer, a well layer is obtained which can emit and oscillate from ultraviolet to visible light area. Upon this, an emitting wavelength can be determined by an In crystal mixing ratio.

A well layer formed of a nitride semiconductor containing In and Al of the present invention affords a wavelength region which is difficult in the conventional InGaN well layer, specifically, a wavelength of around 365 nm corresponding to the band gap energy of GaN, or a shorter wavelength. In particular, the well layer is a well layer having the band gap energy at which light emitting and oscillation are possible at a wavelength of 380 nm or shorter. In the conventional InGaN well layer, at a wavelength around 365 nm corresponding the band gap energy of GaN, for example, at 370 nm, it is necessary to adjust an In ratio at around 1% or smaller. When an In ratio grows extremely small like this, the emitting efficacy is decreased, and a light emitting device and a laser device having the sufficient output are difficult to be obtained. On the other hand, when an In ratio is 1% or smaller, it is also difficult to control the growth thereof. In the present invention, by using a well layer formed of a nitride semiconductor containing In and Al, at a wavelength region of 380 nm at which effective light emitting was difficult previously, the band gap energy can be increased by increasing an Al ratio x. On the other hand, by inclusion of In, it can be used in a light emitting device and a laser device having the better internal quantum efficacy and emitting efficacy.

A specific composition of a nitride semiconductor containing In and Al used in a well layer is a composition represented by $Al_xIn_yGa_{1-x-y}N$ ($0<x\leq 1$, $0<y\leq 1$, $x+y<1$). In a vapor phase growing method such as MOCVD and the like used for growing a nitride semiconductor, when the number of constituent elements is increased, a reaction between constituent elements becomes easier to occur. For this reason, although, pluralization of a quinary or more mixed crystal is possible using B, P, As, Sb and the like as described above, preferably, by adopting an AlInGaN quaternary mixed crystal, this reaction between elements can be prevented and a well layer can be grown with the better crystallizing property. By adopting an In ratio y of not less than 0.02, the better emitting efficacy and internal quantum efficacy are realized as compared with less than 0.02 as described above. Further, by adopting $y \geq 0.03$, since the efficacy is further improved, a light emitting device and a laser device having the excellent properties in a well layer at a wavelength of 380 nm or shorter are obtained, being preferable. In addition, an upper limit of an In ratio is not particularly limited but, by adopting $y \leq 0.1$, deterioration of the crystallizing property due to inclusion of In is suppressed. More preferably, by adopting $y \leq 0.05$, a well layer can be formed without deteriorating the crystallizing property and, thus, when a plurality of well layers are provided as in a multiple quantum well structure, the crystallizing properties of each well layer can be better. Therefore, an In ratio y is preferably in a range of not less than 0.02 and not greater than 0.1, more preferably in a range of not less than 0.03 and not greater than 0.05, which can be applied to the aforementioned InAlGaN quaternary mixed crystal, being preferable. Here, an Al ratio x is not particularly limited but, by varying an Al ratio, the desired band gap energy and wavelength can be obtained.

Figure 9A:
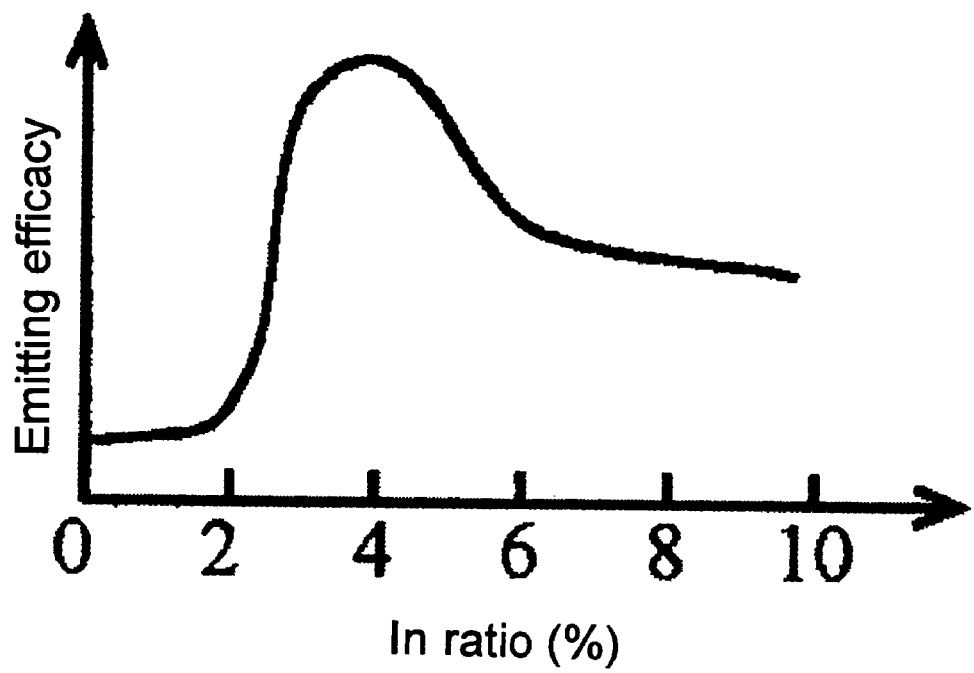
FIG. 9A is a schematic view explaining the relationship between an In ratio and emitting efficacy.
Figure 9B:
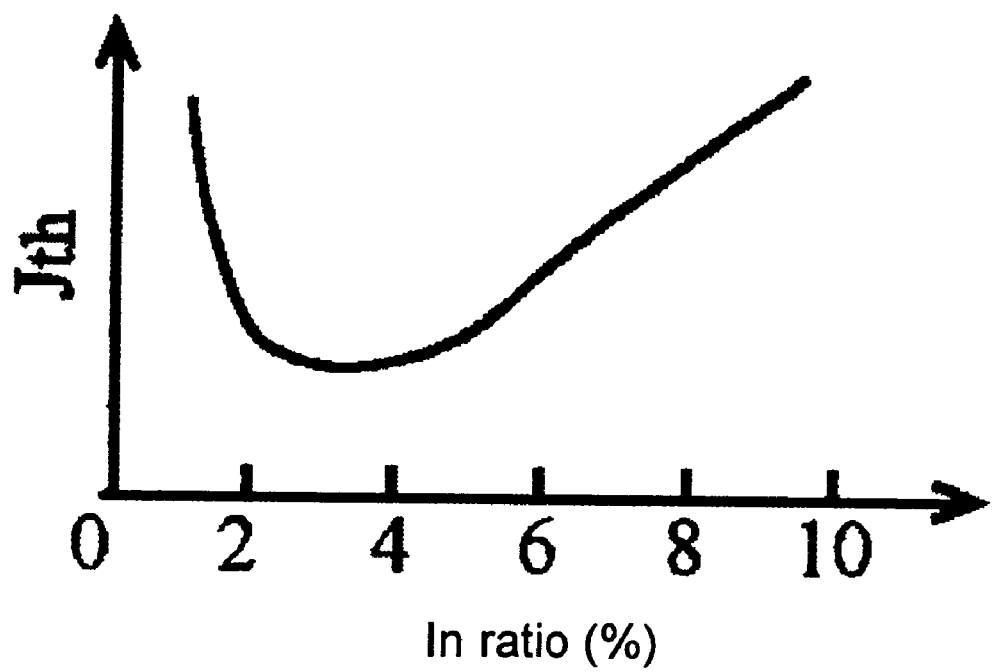
FIG. 9B is a schematic view explaining the relationship between an In ratio and a threshold current density, in an active layer according to the present invention.

In a well layer formed of $Al_xIn_yGa_{1-x-y}N$ ($0<x\leq 1$, $0<y\leq 1$, $x+y<1$) in the present invention, each property is greatly changed in a range of an In ratio y in a nitride semiconductor of 0 to 0.1 as shown in FIGS. 9A and 9B. As shown in FIG. 9A, the emitting efficacy is greatly increased from an In ratio y of around 0.02, and a mild falling curve is shown from around 0.05. On the other hand, in a threshold current density $J_{th}$, a mild falling curve is shown from around 0.02, a minimum value exists in a range of 0.03 to 0.05 and, at an area exceeding 0.05, a rapid increasing curve is shown. Here, FIGS. 9A and 9B show tendency of each property qualitatively in a well layer of $Al_xIn_yGa_{1-x-y}N$ ($0<x\leq 1$, $0<y\leq 1$, $x+y<1$) and a barrier layer of $Al_uIn_vGa_{1-u-v}N$ ($0<u\leq 1$, $0\leq v\leq 1$, $u+v<1$), wherein a y-axis is in an arbitrary unit.

In the present invention, preferably, the band gap energy corresponding to a wavelength of 380 nm or shorter is set by a well layer of a nitride semiconductor containing Al and In. For doing so, an Al ratio X is rendered 0.02 or greater. In addition, in an area of a wavelength of not greater than 365 nm corresponding to the band gap energy of GaN, by adopting x of 0.05 or greater, the better light emitting and oscillation become possible at a short wavelength.

In addition, it is possible to determine a thickness and a number of a well layer arbitrarily. A specific thickness is in a range of not less than 1 nm and not greater than 30 nm. When a thickness is less than 1 nm, there is a tendency that a well layer does not function well. When a thickness exceeds 30 nm, it becomes difficult to grow a nitride semiconductor containing In and Al with the crystallizing property, resulting in decrease in the device properties. Preferably, by adopting a range of not less than 2 nm and not greater than 20 nm, a threshold current density Vf can be reduced. From a viewpoint of the crystal growth, when a thickness is 2 nm or greater, a layer having no great variation in a thickness and having a relatively uniform membrane property is obtained. By adopting 20 nm or smaller, occurrence of the crystal defect is suppressed low and, the crystal growth becomes possible. More preferably, by adopting a thickness of a well layer of not less than 3.5 nm, there is a tendency that high output laser device and light emitting device are obtained. This can be thought as follows: By increasing a thickness of a well layer, light emitting recombination is made with the high emitting efficacy and internal quantum efficacy relative to injection of a large amount of carriers as in a laser device which is driven by a great current. This is considered to have the effect in a multiple quantum well structure. In a single quantum well structure, by adopting a thickness of 5 nm or greater, the similar effects to those described above can be obtained. The number of well layers in an active layer is not particularly limited but is 1 or more. Upon this, in the case where the number of well layers is 4 or more, when a thickness of each layer constituting an active layer grows larger, a thickness of a whole active layer is increased, leading to increase in Vf. Therefore, it is preferable that a thickness of an active layer is suppressed low by adopting a thickness of a well layer in a range of 10 nm or smaller. In a multiple quantum well structure, among a plurality of well layers, at least one well layer having a thickness in the aforementioned range is provided and, preferably, all well layers are rendered to have a thickness in the aforementioned range. In addition, a thickness of each well layer may be different or approximately the same.

A well layer in the present invention may be doped with p-type impurity or n-type impurity, or may be undoped. Preferably, by adopting n-type impurity as impurity to be doped in a well layer, it contributes to improvement in the emitting efficacy. However, there is a tendency that a nitride semiconductor containing In and Al is used in a well layer and, when the impurity concentration grows larger, the crystallizing property is deteriorated. Therefore, it is preferable that a well layer having the better crystallizing property is obtained by suppressing the impurity concentration low. Specifically, in order to make the crystallizing property better maximally, a well layer is grown undoped. Upon this, the impurity concentration is $5\times10^{16}/cm^3$ or smaller, resulting in a well layer containing substantially no impurity. In addition, in the case where a well layer is doped, for example, with n-type impurity, when doped at the n-type impurity concentration in a range of not less than $1\times10^{18}/cm^3$ and not greater than $5\times10^{16}/cm^3$, deterioration of the crystallizing property can be suppressed low and, at the same time, the carrier concentration can be increased and, thus, a threshold current density Vf can be reduced. Upon this, by adopting the n-type impurity concentration in a well layer approximately the same as or slightly smaller than that in a barrier layer, there is a tendency that light emitting recombination in a well layer is promoted and emitting output is improved, being preferable. Upon this, a well layer and a barrier layer may be grown undoped so as to constitute a part of an active layer. In addition, in a multiple quantum well structure in which a plurality of well layers are provided in an active layer, the impurity concentration in each well layer may be approximately the same or different.

In particular, in the case where a device is driven by a great current (such as high output LD, high power LED, and superphotoluminescent diode), when a well layer is undoped and contains substantially no n-type impurity, recombination of carriers in a well layer is promoted and light emitting recombination is realized at the high efficacy. Conversely, when a well layer is doped with n-type impurity, since the carrier concentration is high in a well layer, a probability of light emitting recombination is conversely reduced, a vicious cycle leading to increase in a driving current under a constant output occurs, resulting in tendency of decrease in reliance of a device (device life). For this reason, in such the high output device, the n-type impurity concentration in a well layer is at least $1\times10^{18}/cm^3$ or smaller, preferably, is such the concentration that a well layer is undoped or contains substantially no n-type impurity, a nitride semiconductor device is obtained which has high output and can be driven stably. In addition, a laser device in which a well layer is doped with n-type impurity, there is a tendency that a spectrum width of a laser light at a peak wavelength is widened, being not preferable. The concentration is $1\times10^{18}/cm^3$ or smaller, preferably $1\times10^{17}/cm^3$ or smaller.

(Barrier Layer)

In the present invention, as a composition of a barrier layer, a barrier layer comprising a nitride semiconductor containing Al is used. Here, in an active layer in the present invention, it is necessary that at least one barrier layer in an active layer comprises a nitride semiconductor containing Al. All barrier layers in an active layer may comprise a nitride semiconductor containing Al, or a barrier layer comprising a nitride semiconductor containing no Al may be provided in an active layer. It is necessary that a barrier layer is a nitride semiconductor having the greater band gap energy as compared with a well layer. In a region of an emitting wavelength of 380 nm in a well layer, it is preferable that a nitride semiconductor containing Al is used in a corresponding barrier layer. As a barrier layer of a nitride semiconductor containing Al, preferably, a nitride semiconductor represented by $Al_uIn_vGa_{1-u-v}N$ ($0<u\leq1$, $0\leq v\leq1$, $u+v<1$) is used. Specifically, in a barrier layer of a nitride semiconductor containing Al, an AlInGaN quaternary mixed crystal and AlGaN ternary mixed crystal represented by the composition may be used. In addition, an Al ratio U in a barrier layer is greater than an Al ratio x in a well layer of a nitride semiconductor containing Al and In. By adopting u>x and setting a sufficient difference in a band gap energy between a well layer and a barrier layer, a quantum well layer structure is formed having the better emitting efficacy, a laser device or a light emitting device. In addition, when a barrier layer contains In (v>0), by adopting an In ratio v of preferably not greater than 0.1, deterioration of the crystallizing property can be suppressed. More preferably, a range of not greater than 0.05 can be applied. When an In ratio v exceeds 0.1, a reaction between Al and In at growth is promoted, and the crystallizing property is deteriorated and, thus, the better membrane is not formed. Further, by adopting $v\leq0.05$, a barrier layer is formed with the further better crystallizing property. In addition, as described above, a wider In ratio can be applied to a barrier layer as compared with a well layer, and the band gap energy difference is set mainly by an Al ratio and, thus, $v\geq y$ can be adopted. By adopting such the In ratio, a critical thickness of a well layer or a barrier layer can be changed, a thickness can be set relatively freely in a quantum well structure, and an active layer having a desired property can be designed.

In addition, in an active layer having a quantum well structure, a barrier layer and a well layer may be formed alternately, or a plurality of barrier layers may be provided relative to one well layer. Specifically, 2 or more barrier layers held by well layers may be provided, or a structure may be provided in which a multi-layered barrier layer and a well layer are laminated alternately.

In addition, a barrier layer may be doped with p-type impurity or n-type impurity, or may be undoped as in the aforementioned well layer. Preferably, a barrier layer is doped with n-type impurity or non-doped, or undoped. Upon this, when a barrier layer is doped, for example, n-type impurity, the concentration is at least $5\times10^{16}/cm^3$ or greater. Specifically, for example, in the case of LED, a barrier layer has n-type impurity at a range of not less than $5\times10^{16}/cm^3$ and not greater than $2\times10^{18}/cm^3$. In addition, in the case of higher output LED and high output LED, a barrier layer is preferably doped with a range of not less than $5\times10^{17}/cm^3$ and not greater than $1\times10^{20}/cm^3$, preferably a range of not less than $1\times10^{18}/cm^3$ and not greater than $5\times10^{19}/cm^3$. When a barrier layer is doped at the high concentration like this, it is preferable that a well layer contains substantially no n-type impurity, a well layer is grown undoped. In addition, when a barrier layer is doped with n-type impurity, all barrier layers in an active layer may be doped, a part thereof may be doped and a part thereof may be undoped. When a part of barrier layers are doped with n-type impurity, it is preferable that a barrier layer arranged on an n-type layer side in an active layer is doped. Specifically, by doping an n-th barrier layer $B_n$ (n=1, 2, 3 . . . ) counting from an n-type layer side, electrons are effectively injected into an active layer, resulting in a device excellent in the emitting efficacy and the internal quantum efficacy. This applies not only to a barrier layer but also to a well layer. In addition, when both are doped, by doping n-th barrier layer $B_n$ (n=1, 2, 3 . . . ) counting from an n-type layer and a m-th well layer $W_m$ (m=1, 2, 3 . . . ), that is, by doping from a side near an n-type layer, there is a tendency that the aforementioned effects are obtained.

In addition, as shown Examples to be described later, when a Mg-doped p-side electron confining layer is provided, in particular, provided in contact with an active layer and/or a barrier layer, since Mg is diffused, when a p-side barrier layer arranged on a most p-type layer side in an active layer is doped with n-impurity, there is a tendency that codoping occurs and the function of an active layer is deteriorated. For this reason, when a Mg-doped p-side electron confining layer is provided, preferably, this can be avoided by adopting this p-side barrier layer containing substantially no n-type impurity. Specifically, n-type impurity is less than $5 \times 10^{16}/cm^3$.

A thickness of a barrier layer is not particularly limited but is not greater than 50 nm so as to constitute a quantum well structure. Preferably, a thickness is in a range of not less than 1 nm and not greater than 30 nm as in a well layer. The reason is as follows: By adopting not greater than 30 nm, deterioration of the crystallizing property is suppressed, by adopting not less than 1 nm, such a thickness is obtained that a barrier layer functions well. More preferably, a thickness is not less than 2 nm and not greater than 20 nm, whereby, when a thickness is not less than 2 nm, a relatively uniform membrane is formed, a barrier layer is provided with the better function and, when a thickness is not greater than 20 nm, the better crystallizing property is obtained.

Figure 7:
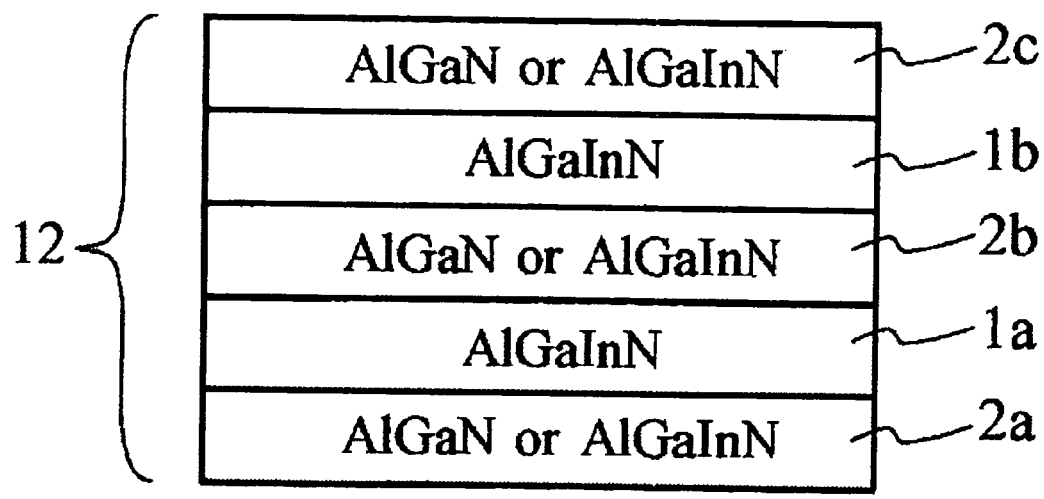
FIG. 7 is a schematic cross-sectional view explaining a laminated structure of an active layer according to one embodiment of the present invention.
Figure 10:
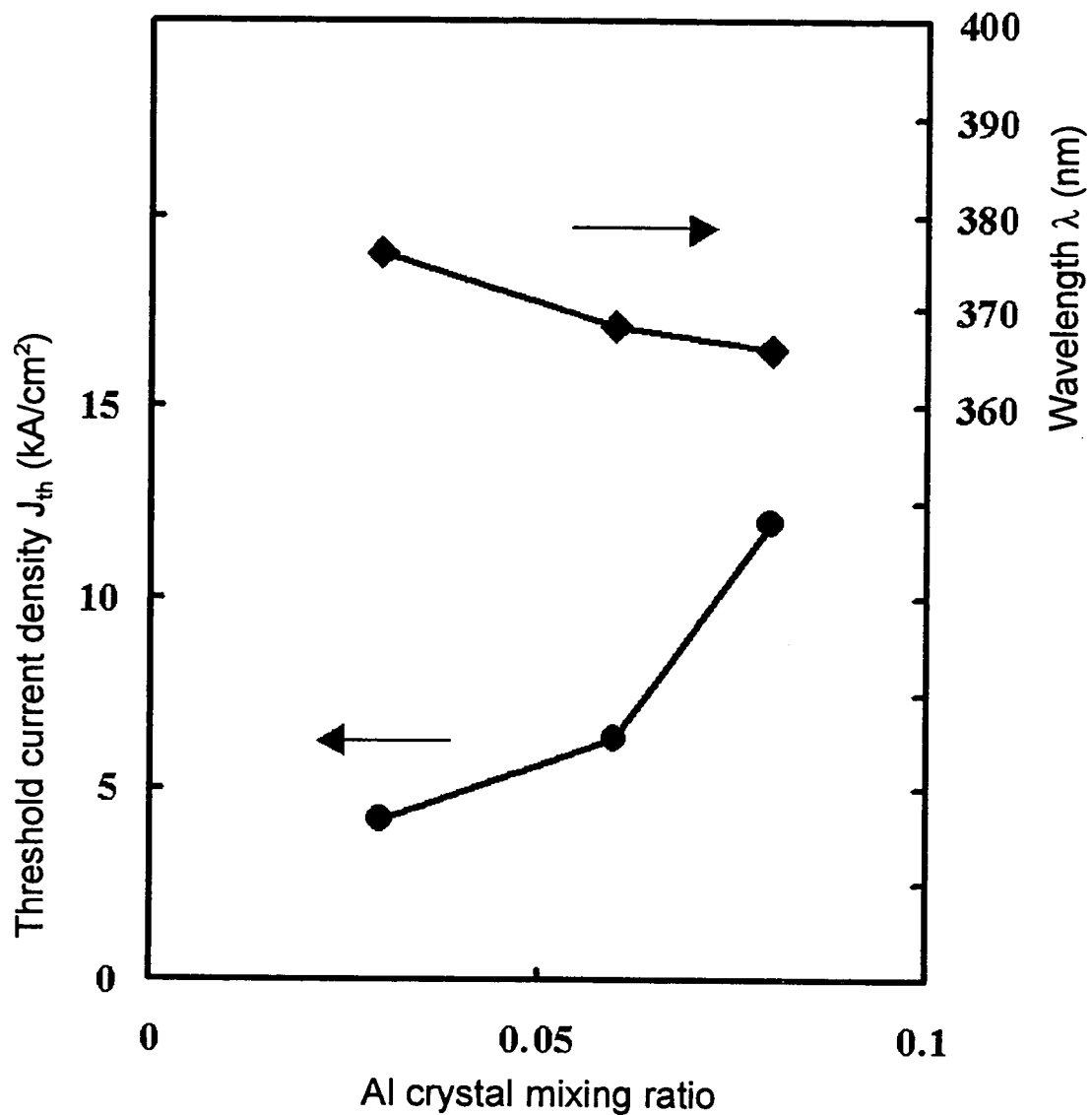
FIG. 10 is a schematic view explaining dependency of an Al crystal mixing ratio on a threshold current density and a wavelength under pulse oscillation, in an active layer according to the present invention.

An active layer having a quantum well structure in the present invention, a preferable embodiment has one or more pairs of a well layer comprising the aforementioned quaternary mixed crystal $Al_xIn_yGa_{1-x-y}N$ (0<x<1, 0<y<1, x+y<1) and a barrier layer comprising quaternary mixed crystal $Al_uIn_vGa_{1-u-v}N$ (0<u<1, 0<v<1, u+v<1) or ternary mixed crystal $Al_uGa_{1-u}N$ (0<u<1). Specifically, as shown in FIG. 7, an active layer 12 has one or more InAlGaN well layers 1 and one or more InAlGaN or AlGaN barrier layers 2. Whereby, a well layer of a nitride semiconductor containing In results in a well layer excellent in the internal quantum efficacy and the emitting efficacy. Further, by adjusting an Al ratio with a nitride semiconductor containing Al, as shown in FIG. 10, a well layer can be obtained which can emit at a short wavelength region of 380 nm or shorter. In addition, by forming a barrier layer 12 having the greater band gap energy than that of a well layer 1 of InAlGaN or AlGaN, also in the aforementioned short wavelength region, an excellent barrier layer can be obtained.

Figure 11:
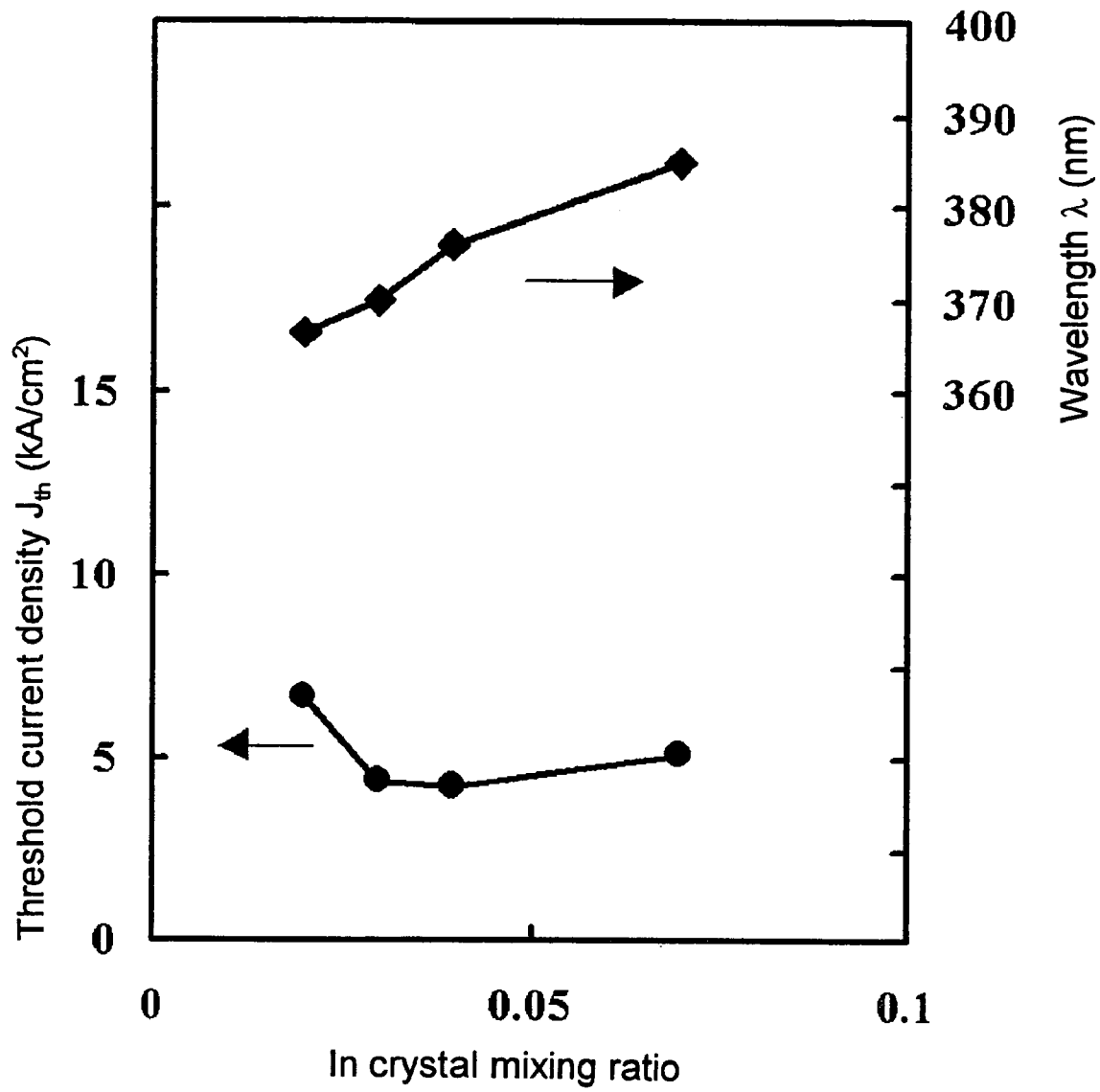
FIG. 11 is a schematic view explaining dependency of an In crystal mixing ratio on a threshold current density and a wavelength under pulse oscillation, in an active layer according to the present invention.

As seen from FIG. 11, at a region of a wavelength of 370 nm or longer, even when an In crystal mixing ratio x in a well layer is made to be not less than an Al crystal mixing ratio y (x≧y), a threshold current density is not greatly changed and a laser device having the better oscillating property is obtained. That is, by adopting x≧y in a range of an Al crystal mixing ratio y of 0<y≦0.1, a better light emitting device and laser device can be obtained. On the other hand, as shown in FIG. 10, by adopting an Al crystal mixing ratio y in a well layer greater than an In crystal mixing ratio x (y≧x), short wavelength light emission is obtained at a range of an emitting wavelength (oscillating wavelength) of not greater than 380 nm. That is, by increasing an Al crystal mixing ratio y as compared with x (y≧x) in a range of an In crystal mixing ratio x in a well layer of 0<x≦0.1, short wavelength emitting is obtained. In the relationship between an Al crystal mixing ratio and an In crystal mixing ratio in a well layer, by adopting a Ga crystal mixing ratio z (z=1−x−y) greater than an In crystal mixing ratio x and an Al crystal mixing ratio y in the well layer of the aforementioned quaternary mixed crystal InAlGaN, that is, z>x and z>y, a well layer and an active layer showing the aforementioned tendency are obtained. Preferably, quaternary mixed crystal InAlGaN is used so as to be z>x and z>y in 0<x≦0.1 and 0<y≦0.1.

[Embodiment 1B (Laser Device, Waveguide Structure)]

Figures 2A, 2B:
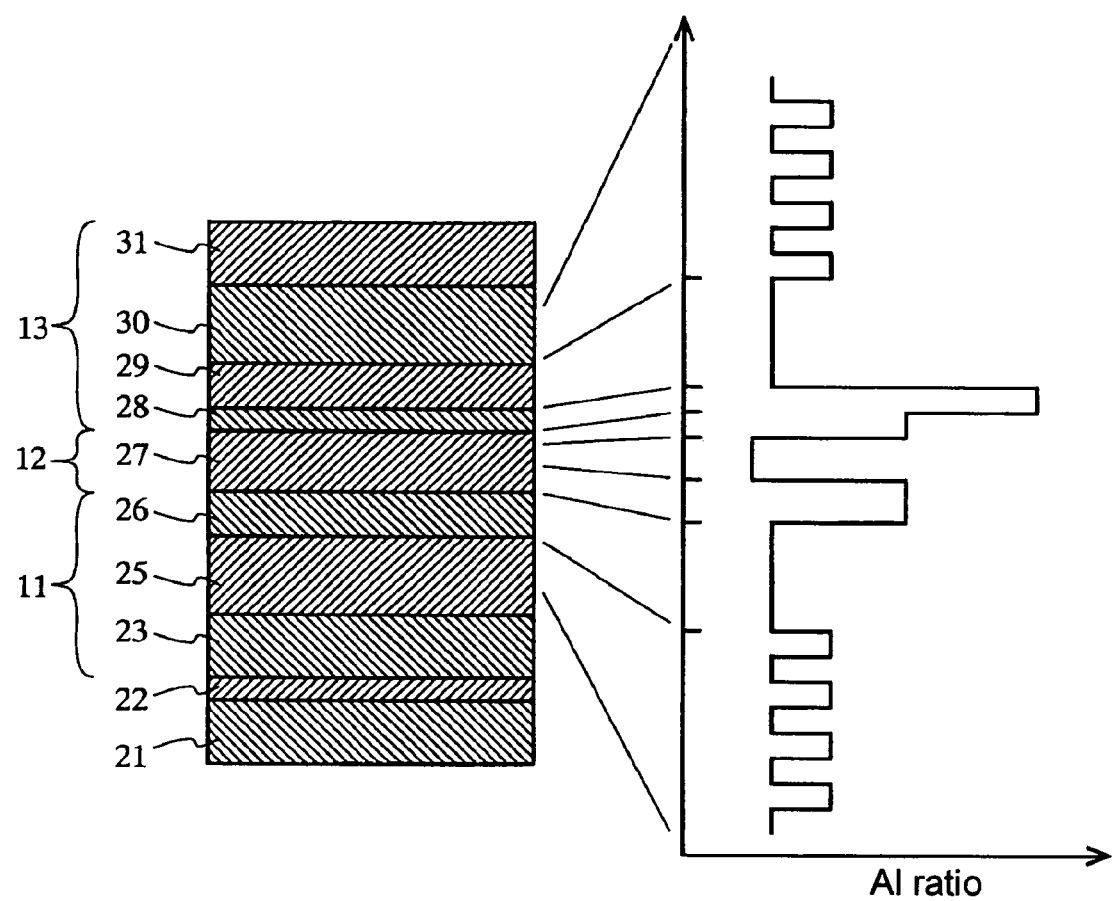
FIG. 2A is a schematic cross-sectional view explaining a laminated structure relating to one embodiment of the present invention and FIG. 2B is a view explaining the relationship between each layer and an Al ratio.

Another embodiment 1B of the present invention is a laser device having, as a nitride semiconductor device structure, a structure in which an active layer of the aforementioned first embodiment is held by a first electrically conductive type of layer and a second electrically conductive type of layer. Specifically, as shown in FIG. 2A, the second embodiment has a structure in which a first electrically conductive type of layer 11, an active layer 12 and a second electrically conductive type of layer 13 are laminated on a substrate, and further has a structure in which at least a first light guiding layer 26 is provided in the first electrically conductive type of layer 11 and the second light guiding layer 29 is provided in the second electrically conductive type of layer 13, and an active layer is held by these first and second light guiding layers 26 and 29, and in which a waveguide is formed by the first and second light guiding layers and the active layer therebetween. Further, as described later, when the first electrically conductive type of layer has a lower cladding layer 25 and the second electrically conductive type of layer has an upper cladding layer 30, respectively, a region containing the active layer is held by these upper and lower cladding layers 25 and 30, resulting in a waveguide. When a light guiding layer is provided in the waveguide held by the upper cladding layer 25 and the lower cladding layer 30, a threshold current density is decreased, which results in a high output laser device. A device structure having a light guiding layer in a waveguide will be explained below.

In the embodiment 1B of the present invention, as shown in FIG. 2A, a waveguide has a structure in which the active layer 12, the first light guiding layer 29 in the first electrically conductive type of layer 11 and the second light guiding layer 26 in the second electrically conductive type of layer are provided. The embodiment is a device characterized in a structure in which, in particular, the aforementioned waveguide using an active layer of a wavelength of 380 nm or shorter is provided.

This waveguide is for guiding the light mainly from the active layer. Depending upon the structure of this waveguide, the emitting efficacy, the threshold current density and other device properties vary variously in a laser device and an end light emitting device. The light guiding layers are formed on both sides of the active layer like this. The light guiding layer may be formed in at least one of the first electrically conductive type of layer and the second electrically conductive type of layer, that is, either of the first light guiding layer or the second guiding layer may exist. Preferably, by providing the light guiding layer on both sides of the active layer, a threshold current density is reduced, resulting in a high output laser device.

As the first light guiding layer 26 or the second light guiding layer 29 in the present invention, a nitride semiconductor containing Al is used. In addition, as shown as a band structure 41 in FIGS. 3B to 6, a waveguide structure is obtained by adopting greater band gap energy than that of at least a well layer 1 in an active layer 27 in a quantum well structure and rendering a difference in a refractive index between the active layer 27 and the light guiding layers 26 and 29 small. In addition, the light guiding layer may have smaller band gap energy than that of the barrier layer and, as shown in FIG. 6, or may have greater band gap energy as shown in FIGS. 3B to 5. As a composition for the light guiding layer, specifically, $In_\alpha Al_\beta Ga_{1-\alpha-\beta}N$ (0≦α, 0<β, α+β≦1) is used. Preferably, by adopting a nitride semiconductor containing no In, that is, by adopting a nitride semiconductor having an In ratio of zero, the light absorption due to inclusion of In is prevented and a waveguide having suppressed light loss can be obtained. Further, by using preferably $Al_\beta Ga_{1-\beta}N$ (0≦β≦1), a waveguide is obtained which can be applied to a wide wavelength region from ultraviolet to red. In order to guide the light of a short wavelength of the aforementioned 380 nm or shorter, preferably, $Al_\beta Ga_{1-\beta}N$ (0<β≦1) is used. The reason in as follows: GaN absorbs the light at the aforementioned short wavelength, which results in the loss, and a threshold current density and the current-light output property are deteriorated. In particular, it is preferable to adjust an Al ratio β in the light guiding layer so as to be greater than the band gap energy $E_g$ in the light guiding layer or the photon energy $E_p$ of light emitting in the active layer by 0.05 eV or greater ($E_g-E_p \geq 0.05$ eV). Whereby, a waveguide is obtained in which the light loss due to a guiding layer is suppressed at the aforementioned short wavelength. More preferably, by adopting $E_g-E_p \geq 0.1$, a more excellent wavelength is formed.

Figure 3A:
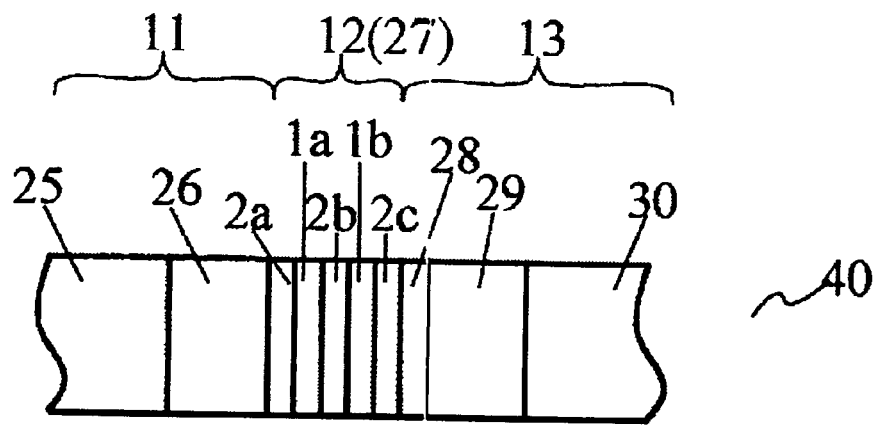
FIG. 3A is a schematic view explaining a laminated structure of a device according to one embodiment of the present invention and FIG. 3B is an energy band view thereof.
Figure 3B:
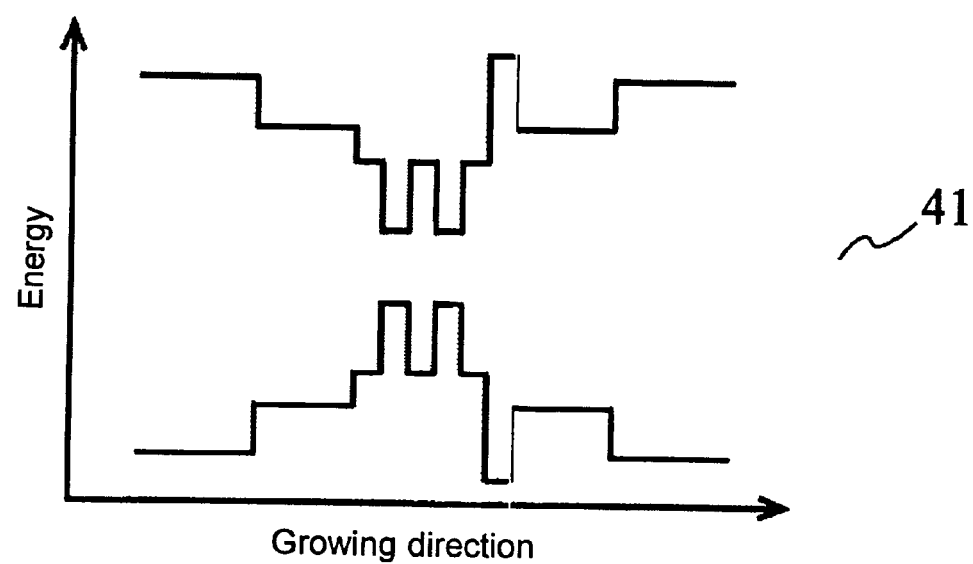

Here, FIGS. 3A and 3B show a laminated structure 40 and a corresponding band structure 41 in the nitride semiconductor device of the present invention. The laminated structure 40 shows the structure in which an active layer 27 of a quantum well structure having the well layer 1 and the a difference in a refractive index between the active layer 27 and the light guiding layers 26 and 29 small. In addition, the light guiding layer may have smaller band gap energy than that of the barrier layer and, as shown in FIG. 6, or may have greater band gap energy as shown in FIGS. 3B to 5. As a composition for the light guiding layer, specifically, $In_\alpha Al_\beta Ga_{1-\alpha-\beta}N$ (0≦α, 0<β, α+β≦1) is used. Preferably, by adopting a nitride semiconductor containing no In, that is, by adopting a nitride semiconductor having an In ratio of zero, the light absorption due to inclusion of In is prevented and a waveguide having suppressed light loss can be obtained. Further, by using preferably $Al_\beta Ga_{1-\beta}N$ (0≦β≦1), a waveguide is obtained which can be applied to a wide wavelength region from ultraviolet to red. In order to guide the light of a short wavelength of the aforementioned 380 nm or shorter, preferably, $Al_\beta Ga_{1-\beta}N$ (0<β≦1) is used. The reason in as follows: GaN absorbs the light at the aforementioned short wavelength, which results in the loss, and a threshold current density and the current-light output property are deteriorated. In particular, it is preferable to adjust an Al ratio β in the light guiding layer so as to be greater than the band gap energy $E_g$ in the light guiding layer or the photon energy $E_p$ of light emitting in the active layer by 0.05 eV or greater ($E_g-E_p \geq 0.05$ eV). Whereby, a waveguide is obtained in which the light loss due to a guiding layer is suppressed at the aforementioned short wavelength. More preferably, by adopting $E_g-E_p \geq 0.1$, a more excellent wavelength is formed.

Figure 4:
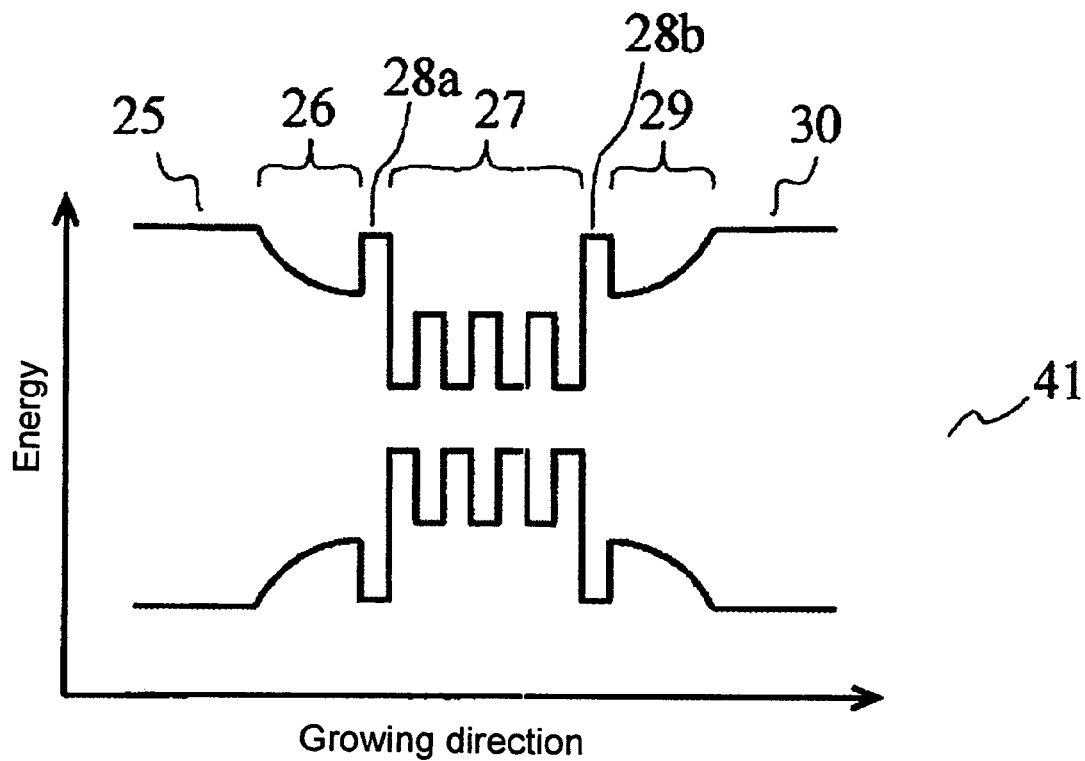
FIG. 4 is a schematic view explaining an energy band according to one embodiment of the present invention.
Figure 5:
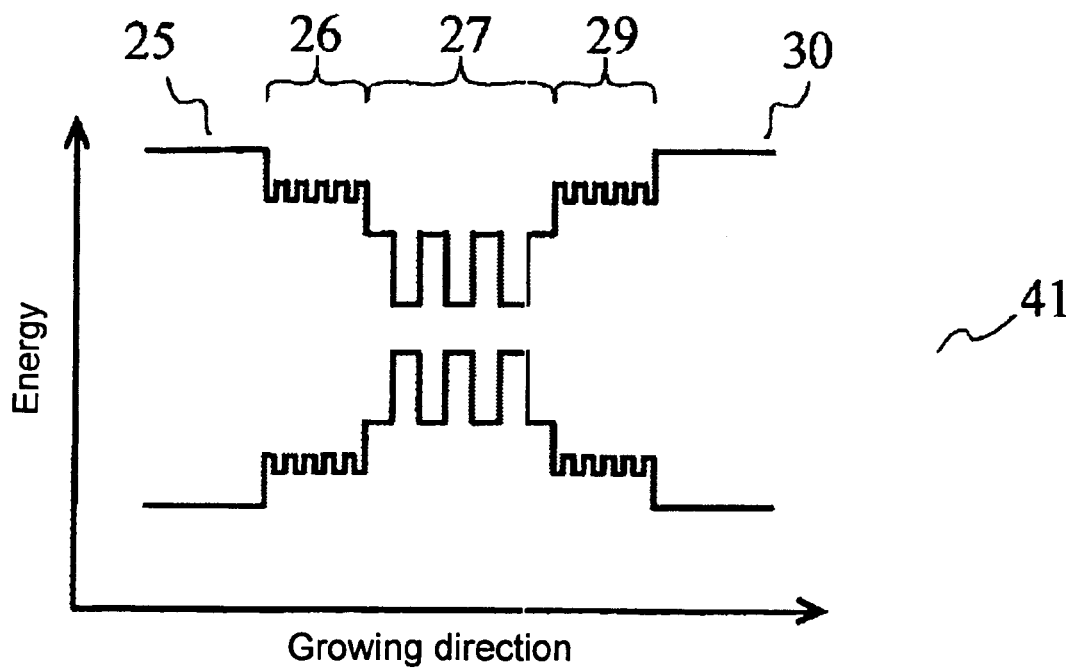
FIG. 5 is a schematic view explaining an energy band according to one embodiment of the present invention.

Here, FIGS. 3A and 3B show a laminated structure 40 and a corresponding band structure 41 in the nitride semiconductor device of the present invention. The laminated structure 40 shows the structure in which an active layer 27 of a quantum well structure having the well layer 1 and the barrier layer 2 is held by the first electrically conductive type of layer 11 and the second electrically conductive type of layer 13. FIGS. 4 to 6 show the band structure 41 like FIG. 3B Any one of or both of the first light guiding layer 26 and the second light guiding layer 29 may be formed of a single membrane, or may be formed of a multi-layered membrane. When a light guiding layer comprising a single membrane nitride semiconductor is formed, as shown in FIG. 3A, the laminated structure 40 is provided in which the first light guiding layer 26 and the second light guiding layer 29 hold the active layer 27, and its band structure 41 is such that the band gap energy is greater than that of the active layer. Specifically, the aforementioned $Al_\beta Ga_{1-\beta}N$ (0≦β≦1) is used and, at the aforementioned short wavelength region, $Al_\beta Ga_{1-\beta}N$ (0≦β≦1) is used. More preferably, as described above, an Al ratio β is adjusted so that the band gap energy $E_g$ of the first light guiding layer and that of the second light guiding layer are greater than the photon energy $E_p$ by 0.05 eV or greater ($E_g-E_p \geq 0.05$ eE, preferably $E_g-E_p \geq 0.1$).

A thickness of the first light guiding layer or the second light guiding layer is not particularly limited but, specifically, is in a range of not less than 10 nm and not greater than 5 μm, preferably in a range of not less than 20 nm and not greater than 1 μm, more preferably in a range of not less than 50 nm and not greater than 300 nm. Whereby, there is a tendency that a waveguide which functions as a guiding layer at not less than 10 nm and which decreases a threshold current density at not less than 20 nm, is formed. There is a tendency that a threshold current density is further decreased at not less than 50 nm. In addition, there is a tendency that a waveguide functions as a guiding layer at not greater than 5 μm, decreases the loss during light guiding at not greater than 1 μm, and further suppresses the light loss at not greater than 300 nm.

The light guiding layer in the present invention may be composed of a multi-layered nitride semiconductor. Also in such the case, as described above, it is preferable to use a nitride semiconductor containing no In, it is more preferable to use the aforementioned $Al_\beta Ga_{1-\beta}N$ (0≦β≦1) and, at the aforementioned short wavelength region, it is preferable to use $Al_\Theta Ga_{1-\beta}N$ (0<β≦1). This nitride semiconductor is used to obtain a multi-layered membrane in which one or more nitride semiconductor layers having a different composition are used in each light guiding layer. Specifically, a first layer and a second layer having a different composition from that of the first layer are used in the first light guiding layer 26, and a third layer and a fourth layer having a different composition from that of the third layer are used in the second light guiding layer 29. Here, the first through fourth layers comprise a nitride semiconductor. Whereby, by adopting a different Al ratio between the first layer and the second layer, between the third layer and the fourth layer in each guiding layer, a multi-layered structure having different band gap energy and refractive index may be obtained.

For example, in a structure in which a first electrically conductive type of layer, an active layer and a second electrically conductive type of layer are laminated, such a structure is obtained that a first light guiding layer has a first layer and a second layer, a second light guiding layer has a third layer and a fourth layer, the second layer and the third layer are arranged on the active layer side, and the first layer and the fourth layer are arranged on a position far from the active layer, resulting in a structure in which the band gap energy is stepwisely decreased as approaching the active layer. Specifically, by adopting Al ratios β2 and β2 of the second layer and the third layer on the active layer side smaller than Al ratios β1 and β4 of the first layer and the fourth layer far from the active layer, that is, β1>β2, β4>β3, a step-wise band structure is obtained, carriers are effectively injected into an active layer in a waveguide, and a refractive index of an active layer and in the vicinity of the active layer becomes larger, whereby, a structure is obtained in which much light is distributed near the active layer in the waveguide. Like this, when a light guiding layer is formed of a multi-layered membrane, there is a tendency that increase in an Al ratio deteriorates the crystallizing property. When it is difficult to form a light guiding layer of a single membrane due to deterioration of the crystallizing property, or when deterioration of the property occurs, formation of a multi-layered membrane can suppress deterioration of the crystallizing property low. In addition, although it is possible to increase the band gap energy of the guiding layer (second layer, third layer) near the active layer and decrease a refractive index of the guiding layer, and decrease the band gap energy of the remote guiding layer (first layer, fourth layer) and increase a refractive index of the remote guiding layer by adopting $\beta 1<\beta 2$, $\beta 4<\beta 3$ contrary to the aforementioned $\beta 1>\beta 2$, $\beta 4>\beta 3$, preferably $\beta 1>\beta 2$, $\beta 4>\beta 3$ is preferably adopted because the aforementioned carrier confinement and light distribution become better. In addition, when a light guiding layer is formed of a multi-layered membrane, each light guiding layer may be composed of 3 or more layers in addition to aforementioned first through fourth layers, and a guiding layer may be constructed by laminating a plurality of a first layer (third layer) and a second layer (fourth layer) alternately, that is, by laminating a plurality of pairs of a first layer and a second layer. In addition, in order to form a light guiding layer of a multi-layered membrane, when the aforementioned conditional equation: $E_g - E_p \geq 0.05$ eV is calculated, calculation is made using an average composition of a whole light guiding layer. For example, in the case where a first light guiding layer is constructed of a first layer comprising $Al_{\beta 1}Ga_{1-\beta 1}N$ ($0<\beta 1 \leq 1$) having a thickness of $d_1$ and a second layer comprising $Al_{\beta 2}Ga_{1-\beta 2}N$ ($0<\beta 2 \leq 1$, $\beta 1 \neq \beta 2$) having a thickness of $d_2$, an average ratio $\beta_m$ of Al is obtained from $\beta_m = (d_1 \times \beta 1 + d_2 \times \beta 2)/(d_1 + d_2)$ In addition, in a light guiding layer in the present invention, as shown in FIG. 4, a GRIN structure may be adopted in which there is a gradient composition so that the band gap energy grows smaller as approaching an active layer. Specifically, by adopting a gradient Al ratio $\beta$, that is, by adopting a gradient composition so that an Al ratio $\beta$ grows smaller as approaching an active layer, a GRIN structure is obtained, which results in improvement of the effects of injecting carriers. Upon this, as shown in FIG. 4, a gradient composition may be continuously gradient composition or a discontinuously and stepwisely gradient composition. In addition, also in a structure in which a plurality of pairs of first layer/second layer for the aforementioned first light guiding layer are laminated, such as a superlattice multi-layered structure, the band gap energy may be made to be smaller as approaching an active layer by a gradient Al ratio. In this case, only at least one of layers, for example, only a first layer may have a gradient composition. Alternatively, all layers constituting a pair, for example, a first layer and a second layer may have a gradient composition. Alternatively, in a thickness direction of a light guiding layer, there may be partially a gradient composition, preferably, when all regions in a thickness direction have a gradient composition, there is a tendency that effects of injecting carriers are more improved.

Further, a multi-layered light guiding layer may have a multi-layered superlattice structure as shown FIG. 5. By using a superlattice structure, deterioration of the crystallizing property due to the aforementioned nitride semiconductor containing Al can be suppressed, and a waveguide having the better crystallizing property can be formed. Specifically, a structure is adopted in which, in the first light guiding layer 26, the aforementioned first layer and second layer are laminated so that at least one of them has 2 or more layers, preferably, each layer has 2 or more layers, or a plurality of pairs of the first layer and the second layer are laminated. Upon this, a composition of a nitride semiconductor in each layer is the same as that described above. Preferably, by using as first layer/second layer $Al_{\beta 1}Ga_{1-\beta 1}N$ ($0 \leq \beta 1 \leq 1$)/$Al_{\beta 2}Ga_{1-\beta 2}N$ ($0 \leq \beta 2 \leq 1$, $\beta 1 \neq \beta 2$) and, at the aforementioned short wavelength region, $Al_{\beta 1}Ga_{1-\beta 1}N$ ($0<\beta 1 \leq 1$)/$Al_{\beta 2}Ga_{1-\beta 2}N$ ($0<\beta 2 \leq 1$, $\beta 1 \neq \beta 2$), a waveguide is formed which suppresses the light loss and suppresses deterioration of the crystallizing property by a superlattice structure. In order that a light guiding layer becomes a superlattice structure, a thickness of each layer constituting a multi-layered membrane is set so as to form a superlattice. A thickness is different depending upon a composition and a combination of each layer but, specifically, is not greater than 10 nm, preferably not greater than 7.5 nm, whereby, the crystallizing property can be maintained better. More preferably, by adopting not greater than 5 nm, the further better crystallizing property can be obtained.

In addition, it is preferable that a light guiding layer in the present invention is at least doped with each electrically conductive impurity because movement and injection of carriers become better. Upon this, electrically conductive-type impurity may be doped into a part of a light guiding layer or may be partially doped, or may be doped into a whole light guiding layer. In addition, in a multi-layered light guiding layer, for example, in the first light guiding layer having the aforementioned first layer and second layer, both layers may be doped, or the first layer and the second layer may be doped at a different amount, or one of them may be doped and the other may be undoped in a modified doping manner. For example, in a superlattice multi-layered structure such as a structure in which the first layer and the second layer are laminated alternately, or a plurality of pairs are provided in the aforementioned first light guiding layer, preferably, by doping only one of layers, for example, only the first layer in a modified doping manner, deterioration of the crystallizing property due to impurity doping can be suppressed. More preferably, by doping only a layer having a low Al ratio, a layer having the better crystallizing property can be obtained, deterioration of the crystallizing property due to impurity doping can be suppressed, and activation due to impurity doping becomes better, being preferable. For example, by doping a second layer having a small Al ratio with impurity and rendering a first layer undoped in a first light guiding layer having a superlattice multi-layered structure in which the aforementioned first layer/second layer is $Al_{\beta 1}Ga_{1-\beta 1}N$ ($0 \leq \beta 1 \leq 1$)/$Al_{\beta 2}Ga_{1-\beta 2}N$ ($0<\beta 2 \leq 1$, $\beta 1<\beta 2$), a second layer having a smaller Al ratio has the better crystallizing property than that of a first layer. For this reason, by doping a layer having the better crystallizing property with impurity, the better activation is realized, resulting in a light guiding layer excellent in movement and injection of carriers.

Further, as shown by a change in a doping amount 42 in FIGS. 6A to 6D regarding impurity doping of the light guiding layer in the present invention, by rendering an impurity doping amount smaller as approaching the active layer, or rendering a doping amount of a region near the active layer smaller as compared with a region far from the active layer in the first and second light guiding layers 26 and 29, the light loss is further reduced in the waveguide, in particular, in the light guiding layer, and better light guiding is realized, resulting in decrease in a threshold current density and decrease in driving current. The reason is as follows: When the light is guided in a region doped with impurity, the light absorption occurs due to impurity and the light loss is caused. Besides, as described above, the waveguide has at least a structure in which the active layer 27 is held by the first light guiding layer 26 and the second light guiding layer 29, and a structure in which an outside of the guiding layer or the waveguide is held by the upper and lower cladding layers 25 and 30 having a smaller refractive index than that of the guiding layer leads to a structure in which the light is confined in the waveguide, whereby, much light is distributed in the active layer in the waveguide or in the vicinity of the active layer. For that reason, by rendering an impurity doping amount smaller in the region in the vicinity of the active layer, the light loss in the region in which much light is distributed is decreased, resulting in the waveguide in which the light loss is small. Specifically, when the first light guiding layer and the second light guiding layer is divided at a region at half a thickness of each layer and a region near the active layer and a region far from the active layer are considered, the electrically conductive impurity concentration in the region near the active layer is rendered smaller than the impurity concentration in the region far from the active layer. The impurity concentration in the light guiding layer is not particularly limited but, specifically, is not greater than $5 \times 10^{17}/cm^3$ in the region near the active layer. Here, the aforementioned impurity doping indicates doping of the first light guiding layer with the first electrically conductive-type impurity and doping of the second lighting layer with the second electrically conductive-type impurity.

Examples of a form of changing a doping amount in the light guiding layer include, as shown as changes in a doping amount 42a, 42b and 42c in FIGS. 6A to 6D, a form of rendering a doping amount smaller mildly and continuously as approaching an active layer in each light guiding layer (42a), a form of rendering a doping layer discontinuously and stepwisely small (42b), a form of rendering a change in a step-wise doping amount and partially setting a change in a doping amount in a light guiding layer (42c), and a combination thereof. Preferably, rendering a region having a distance from an active layer side of not greater than 50 nm undoped in the light guiding layer, it becomes possible to decrease the light loss. Preferably, by rendering a region of 100 nm or smaller undoped, it becomes possible to reduce the light loss well and to decrease a threshold current density and a driving current. Upon this, when a region of 50 nm or smaller is rendered an undoped region, a thickness of the light guiding layer is not less than 50 nm. When a region of 100 nm or smaller is rendered an undoped region, it goes without saying that the thickness is not less than 100 nm. Upon this, when the aforementioned undoped region is provided in the light guiding layer, preferably, it is used in a combination with a light guiding layer having the aforementioned gradient composition structure. The reason is as follows: as shown in FIG. 4, by adopting a band structure in which the band gap energy grows smaller as approaching the active layer. Even when impurity-non-doped region is provided near the active layer, a light guiding layer is formed which suppresses the carrier injection efficacy low. Upon this, it is preferable that a light guiding layer having a gradient composition has the aforementioned GRIN structure. In addition, in the aforementioned multi-layered structure, even in a structure in which a band gap energy grows smaller as approaching an active layer, it has the effects of forming an undoped region. Here, in each light guiding layer, even when not doped with impurity at the growth, that is, even when a light guiding layer is grown undoped, the impurity is diffused from an adjacent layer in some cases. In such the case, even the aforementioned region grown undoped is doped with impurity. Specifically, in Mg preferably used as p-type impurity, such the diffusion phenomenon is easily caused. As shown in Example 1, even when a p-side light guiding layer is formed undoped, a p-type impurity is doped therein due to diffusion from adjacent electron confining layer and cladding layer. When impurity doping is effected by diffusion like this, as described above, the impurity concentration in a region near an active layer is rendered smaller than that of a remote region. It is preferable that such the doping region is provided in at least one of light guiding layers. More preferably, provision of such the doping region in both light guiding layers, a waveguide is obtained which reduces the light loss.

A layer construction, a form of impurity doping, a composition and a thickness in the aforementioned light guiding layer may be the same as or different from those for the first light guiding layer and the second light guiding layer. For example, the first light guiding layer is a single membrane and the second light guiding layer is a multi-layered membrane so that layer constructions in both light guiding layers are different.

(Cladding Layer)

The aforementioned the embodiments 1A and 1B be a nitride semiconductor device having a structure in which a first electrically conductive type of layer, an active layer and a second electrically conductive type of layer are laminated, a first electrically conductive type of layer has a lower cladding layer, and a second electrically conductive type of layer has an upper cladding layer. Specifically, as shown in FIG. 2A, a device has a structure in which a first electrically conductive type of layer 11, an active layer 12 and a second electrically conductive type of layer 13 are laminated on a substrate, and further has a structure in which at least a lower cladding layer 25 is provided in the first electrically conductive type of layer 11 and an upper cladding layer 30 is provided in the second electrically conductive type of layer 13, and the active layer is sandwiched between these upper and lower cladding layers 25 and 30. The aforementioned light guiding layer may be provided in a waveguide sandwiched between the upper cladding layer 25 and the lower cladding layer 30. A device structure having a cladding layer will be explained below.

A composition of the upper and lower cladding layers 25 and 30 are such that the band gap energy is greater than that of an active layer as shown as a band structure 41 in FIGS. 3B to 6A. In addition, when the aforementioned laser device and end light emitting device has first and second light guiding layers 26 and 29, the band gap energy is almost the same as or slightly greater than that of a light guiding layer. Whereby, upper and lower cladding layers function to confine carriers or confine the light and, when a light guiding layer is harbored, function as a layer for confining the light. As a nitride semiconductor used for a cladding layer, a nitride semiconductor containing Al is preferably used, and a nitride semiconductor represented by $In_aAl_bGa_{1-a-b}N$ ($0 \leq a$, $0 < b$, $a+b \leq 1$) is used. Preferably, by using a nitride semiconductor having an In ratio a of zero, there is a tendency that the loss of the light is easily generated due to absorption in a cladding layer in a nitride semiconductor containing In. For this reason, by using preferably a nitride semiconductor represented by $Al_bGa_{1-b}N$ ($0 < b \leq 1$), the light can be confined well and, when a guiding layer is not provided, carriers can be confined well. In a laser device and an end light emitting device, in a structure in which a waveguide is held by upper and lower cladding layers, by setting a sufficient difference in a refractive index between a waveguide and a cladding layer, specifically, between an active layer and/or a light guiding layer, such a construction is obtained that the light is confined in waveguide and the light is guided. In order to set such a difference in a refractive index, $Al_bGa_{1-b}N$ ($0 < b \leq 1$) is preferably used and, by satisfying at least the relationship: $\beta \leq b$ between an Al ratio (average composition) β in a light guiding layer, preferably, by adopting b−β≧0.05, a sufficient difference in a refractive index is set. Since light confinement by a cladding layer also depends upon a thickness of a cladding layer, a composition of a nitride semiconductor is determined considering also a thickness.

A cladding layer in the present invention may be formed of a single membrane, or may be formed of multi-layered membrane, or may have a multi-layered superlattice structure like the aforementioned light guiding layer. When a cladding layer is formed of a single membrane, by forming a single membrane comprising the aforementioned nitride semiconductor, it is easier to design a light and carrier confining structure and a necessary time for growing a cladding layer can be shortened as compared with formation of a multi-layered membrane. On the other hand, it is difficult to grow a nitride semiconductor containing Al such as AlGaN with the better crystallizing property. In particular, a nitride semiconductor is grown at a thickness greater than a constant thickness as in a single membrane, crack is easily caused.

When a cladding layer is formed of a multi-layered membrane, a plurality of nitride semiconductors having a different composition are laminated, specifically, a plurality of nitride semiconductors having a different Al ratio are laminated. When formed of a multi-layered membrane like this, deterioration of the crystallizing property and occurrence of crack as in a single membrane can be suppressed. Specifically, as a multi-layered membrane, a first layer and a second layer having a different composition therefrom are laminated to provide a plurality of layers having different refractive index and band gap energy. For example, a multi-layered membrane may be obtained which have a structure in which a first layer having an Al ratio b1 and a second layer having an Al ratio b2 (b1≠b2) are laminated. Upon this, by adopting a construction in which an Al ratio is b1<b2 (0≦b1, b2≦1), the first layer having a greater Al ratio can make a refractive index and a band gap energy greater, and the second layer having a smaller Al ratio can suppress deterioration of the crystallizing property due to formation of a first layer. Alternatively, plurality of layers having different composition may be further laminated by laminating a first layer and a second layer, and laminating a third layer having a different composition from that of the second layer. Alternatively, a structure may be adopted in which a plurality of a first layer and a second layer are laminated alternately, or a structure may be adopted in which a plurality of pairs of at least a first layer and a second layer may be formed. Since deterioration of the crystallizing property of a nitride semiconductor containing Al is suppressed and a thickness may be rendered greater in such a multi-layered structure, it becomes possible to obtain a thickness important for confining the light.

In a multi-layered structure cladding layer, by adopting a superlattice structure, a cladding layer can be formed with the much better crystallizing property, being preferable. Here, a superlattice structure is provided in at least a part of a cladding layer, preferably, a superlattice structure is provided in throughout a cladding layer, whereby, a cladding layer may be formed with the better crystallizing property. Upon this, a superlattice structure may be a structure in which a plurality of at least a first layer and a second layer are laminated alternately, or plurality of pairs of at least a first layer and a second layer are provided as in a light guiding layer. A thickness of each layer constituting a superlattice structure is different depending upon a composition and a combination of each layer but, specifically, is not greater than 10 nm, preferably not greater than 7.5 nm, whereby, the crystallizing property can be maintained better. More preferably, by adopting not greater than 5 nm, the much better crystallizing property can be obtained.

A cladding layer is preferably doped with at least each electrically conductive-type impurity, and may be doped totally or partially like a light guiding layer. In addition, also in the case of multi-layered membrane, for example, in a multi-layered membrane having the first layer and the second layer, both layers may be doped, or a first layer and the second layer may be doped at a different amount, or one of layers may be doped and the other may be undoped in a modified doping manner like the light guiding layer. For example, in the case of a superlattice multi-layered structure in which the aforementioned first layer/second layer is $Al_{b1}Ga_{1-b1}N$ (0≦b1≦1)/$Al_{b2}Ga_{1-b2}N$ (0<b2≦1, b1<b2), by doping the second layer having a smaller Al ratio with impurity and by rendering the first layer undoped, the crystallizing property can be made better like the light guiding layer.

A thickness of the cladding layer is not particularly limited but is in a range of not less than 10 nm and not greater than 2 μm, not less than 50 nm and not greater than 1 μm. When a thickness is not less than 10 nm, carriers can be confined. When a thickness is not greater than 2 μm, deterioration of the crystallizing property can be suppressed. Further, when a thickness is not less than 50 nm, the light can be confined. Whereby, a cladding layer can be used in a laser device and end light emitting device. When a thickness is not greater than 1 μm, a cladding layer can be formed with the better crystallizing property.

Here, as an upper cladding layer and a lower cladding layer, a nitride semiconductor containing Al is preferably used, whereby, a difference in a refractive index can be rendered great between a waveguide and both cladding layers. Upon this, it is preferable that a nitride semiconductor for a cladding layer contains no In because a nitride semiconductor containing In tends to deteriorate the crystallizing property as compared with a nitride semiconductor containing no In. In particular, in a structure having a p-side cladding layer on an active layer, when a nitride semiconductor containing In is used for a p-side cladding layer, the crystallizing property is remarkably deteriorated and the device properties are remarkably deteriorated. Upon this, as a nitride semiconductor used in a cladding layer, specifically $Al_bGa_{1-b}N$ (0<b<1) is preferably used.

(Carrier Confining Layer<p-Side Electron Confining Layer>)

In the present invention, a carrier confining layer 28 may be provided in the interior of the active layer 27 or in the vicinity of the active layer as shown by a band structure 41 in FIGS. 3 Band 4. As shown by the figures, in the case of a structure having the light guiding layers 26 and 29 and the cladding layers 25 and 30 such as a laser device and an end light emitting device, a carrier confining layer may be provided between the light guiding layers 26 and 29 and the active layer 27, or as a part of an active layer or a light guiding layer. Here, this carrier confining layer is to confine carriers in an active layer or in a well layer. In a laser device and high output light emitting device, overflow of carriers from an active layer due to a rise in temperature by device driving and increase in a current density can be prevented, resulting in a structure in which carriers are effectively injected in the active layer. Specifically, as shown in FIG. 4, carriers from the first electrically conductive type of layer are confined by a carrier confined layer 28b arranged on the second electrically conductive type of layer side, and carriers form the second electrically conductive type of layer are confined by a carrier confining layer 28a on the first electrically conductive type of layer side. It is preferable that this carrier confining layer is provided in at least one of them. As shown in Example 1, in the device in which the first electrically conductive type of layer is n-type and the second electrically layer is p-type, it is preferable that the carrier confining layer is provided at least on a p-type layer side. The reason is as follows: In a nitride semiconductor, since a diffusion length for an electron is longer as compared with a diffusion length for a hole, an electron is easier to overflow from an active layer and, for this reason, by providing the carrier confining layer 28 for confining electrons on the p-type layer side, high output laser device and light emitting device are obtained. An example in which a carrier confining layer as a p-side electron confining layer is provided on a p-type layer side will be explained below. This can be applied to an n-type layer side by substituting an electrically conductive type of layer. In particular, it is preferable that at least a p-side electron confining layer is provided because an electron as longer carrier diffusion length as compared with a hole and, therefore, an electron is easier to overflow from an active layer.

As this p-side electron confining layer, a nitride semiconductor containing Al, specifically $Al_cGa_{1-c}N$ (0<c<1) is used. Upon this, an Al ratio c is at least in a range of $0.1 \leq c<1$, preferably in a range of $0.2 \leq c<0.5$ because a carrier confining layer needs to have a sufficiently greater band gap energy than that of the active layer (offset is set). The reason is as follows: When c is not greater than 0.1, an electron confining layer does not sufficiently function in a laser device. When c is not less than 0.2, electrons are sufficiently confined (carrier confinement), and overflow of carriers are suppressed. In addition, when c is not greater than 0.5, an electron confining layer can be grown while occurrence of crack is suppressed low. More preferably, when c is not greater than 0.35, an electron confining layer can be grown with the better crystallizing property. In addition, when the aforementioned light guiding layer is harbored, it is preferable to adopt a carrier confining layer having a greater band gap energy than that of the light guiding layer. When the aforementioned cladding layer is harbored, it is preferable to adopt a carrier confining layer having a band gap energy approximately the same as or greater than that of a cladding layer. The reason is as follows: For confining carriers, a nitride semiconductor having a higher crystal mixing ratio than that of a cladding layer for confining the light is necessary. This p-side electron confining layer can be used in a nitride semiconductor device of the present invention. In particular, in the case where a large amount of carriers are injected in an active layer by driving by a great current as in a laser device, carriers can be more effectively confined as compared with no p-side electron confining layer, which can be used not only in a laser device but also in high output LED.

A thickness of the carrier confining layer in the present invention is at least not greater than 100 nm, preferably not greater than 40 nm. The reason is as follows: Since a nitride semiconductor containing Al has a greater bulk resistance as compared with other nitride semiconductors (containing no Al) and an Al crystal mixing ratio in a p-side electron confining layer is set at higher as described above, when a carrier confining layer is provided at a thickness exceeding 100 nm in a device, it becomes an extremely high resistant layer, leading to a remarkable increase in forward voltage Vf. When a thickness is greater than 40 nm, a rise in Vf can be suppressed low. More preferably, by adopting not greater than 20 nm, the rise can be suppressed lower. Here, a lower limit from a thickness of a p-side electron confining layer is at least not less than 1 nm, preferably not less than 5 nm, whereby, an electron confining layer functions well. Here, a carrier confining layer may be formed of a single membrane, or may be formed of a multi-layered membrane having a different composition.

In addition, in the nitride semiconductor device of the present invention, in the case where a light guiding layer is not provided and only a cladding layer is provided, when sufficient band offset for confining carriers exists between an active layer and a cladding layer as described above, it is not necessary to provide a carrier confining layer separately from a cladding layer. However, in the case where a cladding layer is arranged apart from an active layer as a structure having a light guiding layer, it is better to provide a carrier confining layer between an active layer and a cladding layer, preferably in the vicinity of an active layer. The reason is as follows: When a carrier confining layer is provided at a position apart from an active layer, the effects of suppressing the aforementioned overflow of carriers are lost. Specifically, by adopting a distance between an active layer and a p-side electron confining layer (carrier confining layer) of not greater than 100 nm, a carrier confining layer functions. More preferably, by adopting the distance of not greater than 500 Å, better carrier confinement becomes possible. When a carrier confining layer is arranged outside an active layer, most preferably, by arranging in contact with an active layer, carriers are most effectively confined in an active layer. When arranged in the interior of an active layer, it can be provided as a barrier layer or as a part of thereof. Specifically, by arranging at a position nearest each electrically conductive type of layer in an active layer, that is, as an outermost layer in an active layer, carriers are effectively injected in a well layer in the interior of an active layer. For example, in FIG. 4, by providing the carrier confining layer 28 as an outermost barrier layer in an active layer, it becomes a layer nearest each electrically conductive type of layer. In the case where a carrier confining layer is provided in an active layer like this, a band gap energy is rendered greater as compared with a barrier layer in the interior of an active layer. A barrier layer in the interior or an active layer is a barrier layer except for an outermost side and is a barrier layer held by well layers.

A p-side electron confining layer (carrier confining layer) in the present invention may be undoped or may be doped with p-type impurity (each electrically conductive-type impurity). Preferably, a layer is doped with each electrically conductive-type impurity. For example, by doping a p-side electron confining layer with p-type impurity, a mobility of a carrier is enhanced by doping and Vf can be decreased. When driven by a great current such as a laser device and high power LED, in order to enhance a mobility of a carrier, it is preferable to dope at the high concentration. A specific doping amount is at least $5 \times 10^{16}/cm^3$ or greater, preferably $1 \times 10^{18}/cm^3$ or greater. In the aforementioned device driven by a great current, the doping amount is $1 \times 10^{18}/cm^3$ or greater, preferably $1 \times 10^{19}/cm^3$ or greater. An upper limit of an amount of p-type impurity is not particularly limited but is not greater than $1 \times 10^{21}/cm^3$. When an amount of p-type impurity grows larger, a bulk resistance tends to increase and, as a result, Vf is increased. In order to avoid this, preferably, an upper limit is the minimum p-type impurity concentration which can maintain necessary carrier mobility. Alternatively, by forming a carrier confining layer undoped, doping may be done by diffusion of impurity from an adjacent layer.

In addition, when a p-type carrier confining layer is provided on an n-side, it is not necessary to set great band offset between an active layer and a barrier layer like the aforementioned p-side electron confining layer. When voltage is applied to a device, offset for confining electrons becomes smaller and, therefore, a confining layer of a nitride semiconductor having a great Al ratio is necessary. However, since offset for confining holes is slightly changed, it is not necessary to set an Al ratio as high as a p-side electron confining layer. Specifically, an n-side barrier layer arranged on a most n-side in an active layer can function as a hole confining layer. In particular, by adopting a thickness of not less than 10 nm, the excellent hole confining function is exerted. That is, as shown in Example, an n-side barrier layer 2a can function to confine carriers by rendering a thickness larger as compared with other barrier layers. In a multiple quantum well structure, since other barrier layers 2b and 2c have a structure in which they are held by well layers, when a thickness is rendered greater, carriers are prevented from injecting into a well layer effectively in some cases. On the other hand, since the n-side barrier layer 2a is formed not held by well layers, by enhancing the function of carrier confinement, a better structure of an active layer is obtained. Since this n-side barrier layer is preferably a layer arranged on an outermost side in an active layer, the n-side barrier layer effectively functions to confine carriers. An upper limit of a thickness is not particularly limited but is not greater than 30 nm. Alternatively, it may be formed of a multi-layered membrane. Also in a single quantum well structure, allowing an n-side barrier layer 2a to function to confine carriers, carriers can be suitably injected in a well layer.

In a laser device and an end light emitting device of the nitride semiconductor of the present invention, as shown in Examples, ridge is provided as a stripe-like waveguide and an insulating membrane which is to be an embedding layer is formed on a ridge-side. Upon this, an embedding layer is desirably formed of oxides containing at least one element selected from the group consisting of Ti, V, Zr, Nb, Hf and Ta in addition to $SiO_2$ as a material for a second protecting membrane, and at least one of SiN, Bn, SiC and AlN. Among them, it is particularly preferable to use an oxide of Zr and Hf, and Bn and SiC. Further, as an embedding layer, semi-insulating and i-type nitride semiconductor, an electrically conductive type which is reverse to a ridge part, in Examples, an n-type nitride semiconductor may be used. By setting a difference in a refractive index by a nitride semiconductor containing Al such as AlGaN and allowing to function as a current preventing layer, lateral light confinement is realized. By setting a difference in a light absorbing coefficient by a nitride semiconductor containing In, optical properties of a laser device are realized. In addition, without providing ridge with etching, a structure in which a current is flown can be obtained by injecting ions of B and Al and making a non-injecting region stripe-like.

In addition, by adopting a ridge width of not less than 1 μm and not greater than 3 μm, preferably not less than 1.5 μm and not greater than 2 μm, spot-shape or beam-shape laser light excellent as a light source for optical disk system is obtained.

(Embodiment 2)

Embodiment 2 of the present invention will be explained below, and the embodiment 2 may be used by combining with the aforementioned embodiment 1A and/or 1B.

(Active Layer)

An active layer in the present invention preferably has a quantum well structure, has a well structure comprising a nitride semiconductor containing GaN or Al, and has a barrier layer formed of a nitride semiconductor containing Al or a nitride semiconductor containing In and Al. In addition, in particular, as a wavelength in an active layer, a short wavelength having light emitting at 375 nm or shorter is preferably used and, more specifically, the band gap energy of the aforementioned well layer is of a wavelength of 375 nm or shorter. Upon this, a nitride semiconductor used in an active layer may be either non-doped, n-type impurity-doped, or p-type impurity-doped. Preferably, by provision of non-doped or undoped, or n-type impurity-doped nitride semiconductor, the high output can be realized in a nitride semiconductor device such as a laser device and a light emitting device. Preferably, by allowing a well layer to be undoped and a barrier layer to be n-type impurity-doped, such an device is obtained that a laser device and a light emitting device have the high output and the emitting efficacy is high. Here, a quantum well structure may be a multiple quantum well structure or a single quantum well structure. Preferably, a multiple quantum well structure makes it possible to improve the output and decrease an oscillating threshold. As a quantum well structure for an active layer, a structure in which at least one aforementioned well layer and at least one aforementioned barrier layer are laminated, can be used. Upon this, in the case of a quantum well structure, the number of well layers of not less than 1 and not greater than 4 enables to reduce a threshold current in a light emitting device, being preferable. More preferably, a multiple quantum well structure having the number of well layers tends to give a high output laser device and light emitting device.

It is preferable that a nitride semiconductor containing GaN or Al is used as a well layer in the present invention and that at least one well layer formed of a nitride semiconductor containing the GaN or Al is harbored in an active layer. In a multiple quantum well structure, preferably, by provision of all well layers comprising a well layer comprising the aforementioned nitride semiconductor, a shorter wavelength is permitted and high output light emitting devices and laser devices can be obtained. When an emitting spectrum has a nearly single peak, this construction is preferable and, on the other hand, in a multi-color light emitting device having a plurality of peaks, by provision of at least one well layer comprising a nitride semiconductor containing the GaN or Al, an emitting peak of a shorter wavelength can be obtained, and light emitting devices of various emitting colors, or a light emitting apparatus combined with a fluorescent substance which is excited at that shorter wavelength can be obtained. Upon this, in the case of a multi-color emitting device, by using $In_\alpha Ga_{1-\alpha}N$ ($0<\alpha \leq 1$) as a specific composition, a well layer which enables better emission and oscillation at a range of from an ultraviolet to a visible area is obtained. Upon this, an emitting wavelength can be determined by an In crystal mixing ratio.

A well layer comprising a nitride semiconductor containing Al in the present invention can give a wavelength range which is difficult in the previous InGaN well layer, specifically, a wavelength around 365 nm which corresponds to the band gap energy of GaN, or a shorter wavelength. A particular well layer has the band gap energy by which emission and oscillation is possible at a wavelength of 375 nm or shorter. In the previous InGaN well layer, at a wavelength of around 365 nm which corresponds to the band gap of GaN, for example, at 370 nm, it is necessary to adjust an In ratio around 1% or smaller and, when an In ratio becomes extremely small like this, the emitting efficacy is reduced and, thus, an emitting device and a laser device having the sufficient output is obtained with difficulty. In addition, when an In ratio is 1% or smaller, it is difficult to control the growth. In the present invention, by using preferably a well layer comprising a nitride semiconductor containing GaN or Al, an Al ratio is increased to increase the band gap energy in a wavelength area of 375 nm at which effective emission was difficult previously, which can be used in a shorter wavelength laser device.

Here, a specific composition of a nitride semiconductor containing Al used in a well layer is a composition represented by $Al_xIn_yGa_{1-x-y}N$ ($0<x\leq 1$, $0<y\leq 1$, $x+y<1$), and a preferable composition is $Al_xGa_{1-x}N$ ($0<x\leq 1$). A composition of a preferable well layer in the present invention including the case where the aforementioned well layer is GaN is in using a nitride semiconductor represented by $Al_xGa_{1-x}N$ ($0\leq x\leq 1$). In a method of vapor phase-growing such as MOCVD and the like used for growing a nitride semiconductor, when the number of constituent devices becomes larger, a reaction is easily caused between constituent elements. For this reason, although pluralization of quinary or more mixed crystal is possible by using B, P, As, Sb and the like as described above, preferably, by using quaternary mixed crystal of AlInGaN, a reaction between these elements is prevented to grow a crystal with the better crystallizing property. Further, in quaternary mixed crystal of the aforementioned composition $Al_xIn_yGa_{1-x-y}N$, since there is a tendency that a reaction between Al and In at growth becomes problematic in deterioration of the crystallizing property, preferably, by using $Al_xGa_{1-x}N$, it becomes possible to form a well layer with the further better crystallizing property. In these nitride semiconductors containing Al, by increasing an Al crystal mixing ratio, an device can be obtained which can be emitted and oscillated at the aforementioned shorter wavelength area ($\lambda \leq 375$ nm). Here, an Al ratio x is not particularly limited, but a wavelength corresponding to the desired band gap energy can be obtained by varying an Al ratio.

In a preferable embodiment, an active layer for a quantum well structure in the present invention has one or more pairs of a well layer comprising the aforementioned binary or ternary mixed crystal $Al_xGa_{1-x}N$ ($0\leq x\leq 1$), and a barrier layer comprising a quaternary mixed crystal $Al_uIn_vGa_{1-u-v}N$ ($0<u<1$, $0<v<1$, $u+v<1$) or ternary mixed crystal $Al_uGa_{1-u}N$ ($0<u<1$).

Figure 12A:
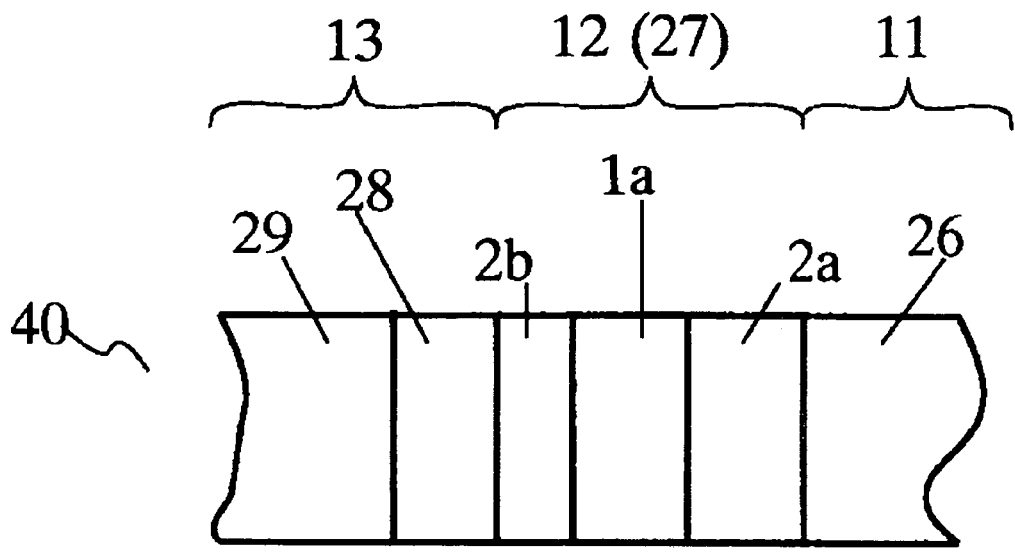
FIG. 12A is a schematic cross-sectional view explaining a laminated structure relating to one embodiment of the present invention and FIG. 12B is a schematic view explaining a band structure in the bias status corresponding to the laminated structure.

More specifically, as shown as an active layer 12 in FIGS. 12A, 12B and FIGS. 14A, 14B, an active layer has 1 or more AlGaN well layers 1 and 1 or more InAlGaN or AlGaN barrier layers 2. Whereby, a well layer excellent in the internal quantum efficacy and the light emitting efficacy is obtained. Further, by adjusting an Al ratio by a nitride semiconductor containing Al, as shown in FIG. 12A, a well layer is obtained which can be emitted at a shorter wavelength area of 375 nm or shorter. In addition, by adopting InAlGaN or AlGaN in a barrier layer 2 having the greater band gap energy than that of the well layer 1, a barrier layer can be provided which is also excellent in the aforementioned shorter wavelength area.

(Active Layer and Adjacent Layer)

In the embodiment 2 of the present invention, in a structure in which a first electrically conductive type of layer and a second electrically conductive type of layer on both sides of an active layer are laminated, in particular, the relationship will be explained in detail below between a layer arranged near an active layer, more specifically, a layer arranged adjacent to and in contact with an active layer, and an active layer.

Figure 13A:
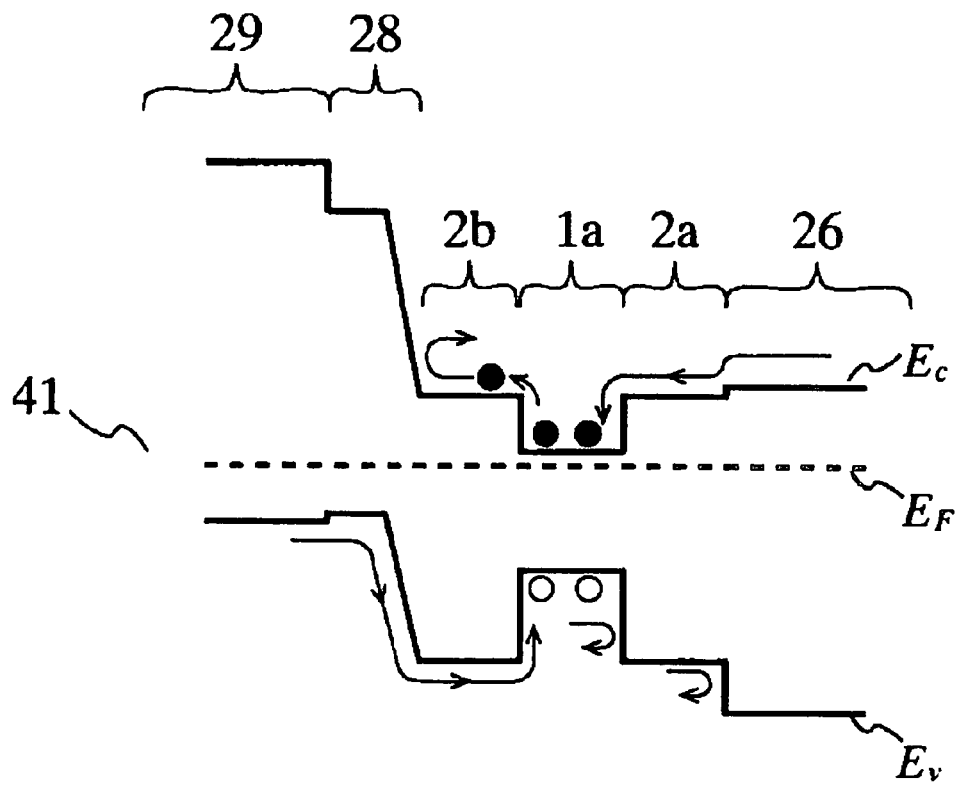
FIGS. 13A and 13B are schematic views explaining band structures in the bias status of a laser device of the prior art.
Figure 13B:
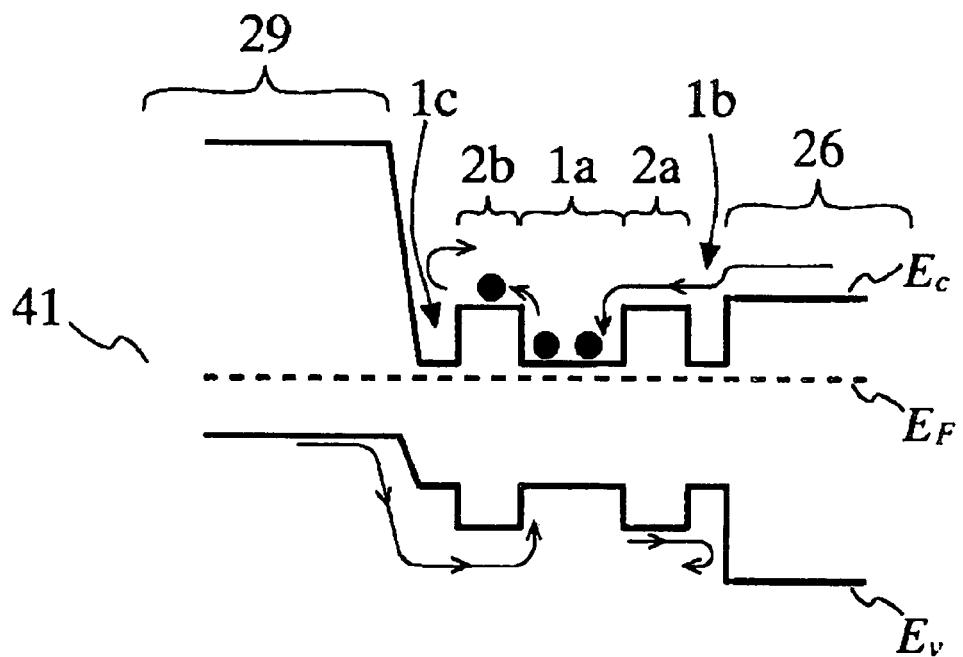
Figure 16:
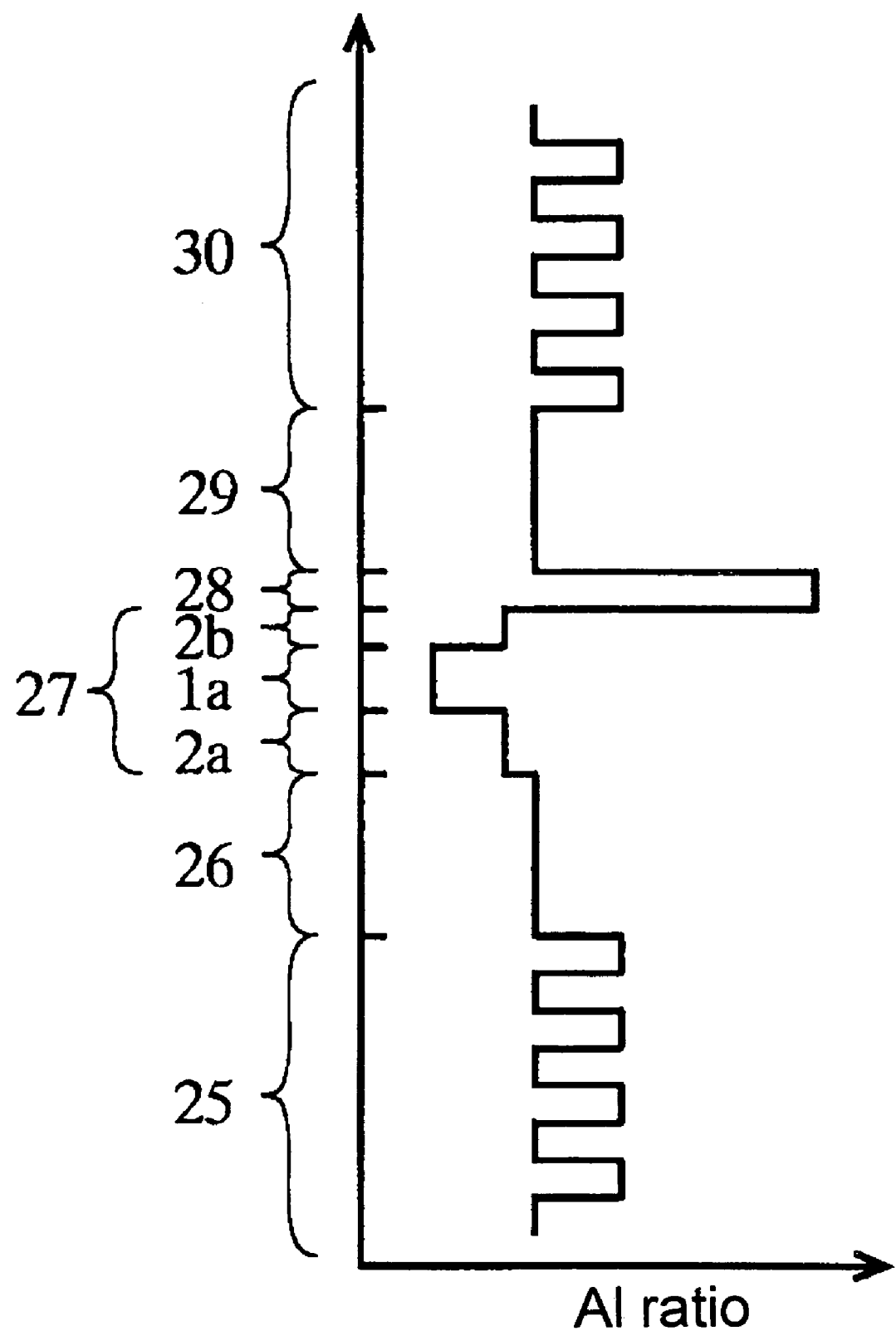
FIG. 16 is a view explaining the relationship with an Al ratio of each layer corresponding to a laminated structure of a laser device of the prior art.

The previously proposed laser device has a structure in which the band gap energy becomes larger in light guiding layers 26 and 29 on both sides of an active layer, and cladding layers 25 and 30 on both outer sides thereof in this order, as the band structure is shown in FIGS. 13A and 13B and, a change in an Al crystal mixing ratio in a laminated structure of FIG. 2A is shown in FIG. 16. For example, in an AlGaN/InGaN series nitride semiconductor laser device having a wavelength of 410 nm, in FIG. 16, by adopting an Al ratio in light guiding layers 26 and 29 of zero as an origin and substituting with an In crystal mixing ratio in an active layer having the smaller band gap energy than them, a band gap structure of the previous device is obtained. In addition, in the previous AlGaN series semiconductor laser device at a shorter wavelength in an ultraviolet area, as shown in FIG. 16, a structure has been proposed in which an Al crystal mixing ratio is increased in light guiding layers 26 and 39 outside an active layer, and a further external cladding layer in this order, whereby, the band gap energy is increased from an active layer toward an outside as shown in FIGS. 13A and 13B. In addition, in the previous AlGaN series nitride semiconductor light emitting device which emits in an ultraviolet area, a structure is proposed in which a cladding layer or a light guiding layer is omitted in the aforementioned laser device. More specifically, a structure has been proposed in which light guiding layers 26 and 29, and cladding layers 25 and 30 shown in FIG. 16 are used as a carrier confining layer, that is, an Al ratio is greater than that of a light emitting layer (active layer 27) and, thus, a layer having the great band gap energy is formed. However, in a structure in which an Al crystal mixing ratio is increased successively toward an outside of an active layer, there arises a serious problem from deterioration of the crystallizing property, in particular occurrence of crack.

In the present invention, as shown in FIG. 2A, by adopting a structure in which both light guiding layers 26 and 29 holding an active layer 27 have the smaller band gap energy than that of a barrier layer 2 in an active layer and an Al crystal mixing ratio is small, occurrence of crack in the aforementioned previous structure can be suitably suppressed, and a structure can be obtained in which continuous oscillation is possible at room temperature. More specifically, a first nitride semiconductor layer is provided in a first electrically conductive type of layer, and the band gap energy of the fist nitride semiconductor layer is smaller than that of a barrier layer in an active layer, that is, in an AlGaN series active layer, an Al crystal mixing ratio in a first nitride semiconductor layer which is smaller than that of a barrier layer is made small. Upon this, the relationship between a well layer and a first nitride semiconductor layer is that, in a well layer in an active layer, the band gap energy of a first nitride semiconductor layer is made larger than that of a well layer for light emitting recombination. In addition, this relationship can be also applied to a second electrically conductive type of layer. More specifically, the band gap energy of a second nitride semiconductor layer in a second electrically semiconductor layer is made smaller than that of a barrier layer in an active layer, an Al crystal mixing ratio of a second nitride semiconductor layer is made smaller. By using a first nitride semiconductor layer (second nitride semiconductor layer) having a smaller Al crystal mixing ratio than that of a barrier layer and arranging the nitride semiconductor layer near, preferably, adjacent to an active layer, an active layer having the better carrier confinement and the better crystallizing property can be realized. And, by using these layers as a light guiding layer, a waveguide structure which is suitable in a shorter wavelength is formed. This will be explained in more detail below.

As shown in FIGS. 2A and 12A, a nitride semiconductor device in accordance with one embodiment of the present invention has a structure in which an active layer 12 is provided between a first electrically conductive type of layer 11 and a second electrically conductive type of layer 13. As a specific laminate structure, as shown in figures, the device has a structure in which, as a first electrically conductive type of layer 11, a contact layer 23, a lower cladding layer 25 and a lower light guiding layer 26 are successively laminated and, thereabove, an active layer 27 and, above an active layer, as a second electrically conductive type of layer 13, a carrier-containment layer 28, an upper light guiding layer 29, an upper cladding layer 30 and a contact layer 24 are successively laminated. Here, mutually adjacent layers of the carrier confining layer, the light guiding layer, the cladding layer and the contact layer are not limited to the case where contacted as shown in figures, but they may be isolated by providing another layer between respective layers.

Figure 12B:
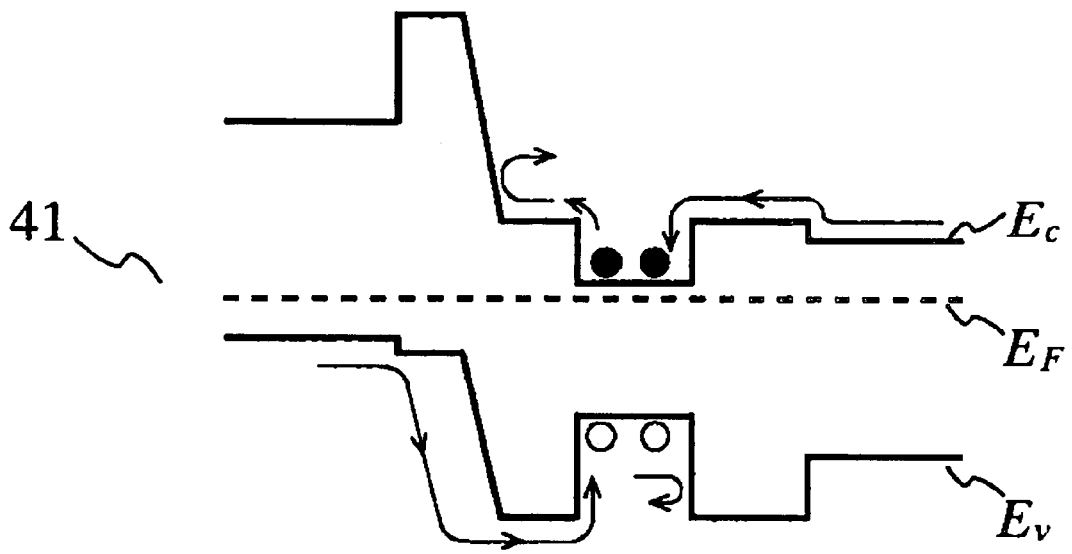

Here, FIG. 2A is a cross-sectional view showing a laminated structure of an device having a waveguide structure in the present invention, and FIGS. 12A and 12B show cases where an active layer and a laminated structure 40 of layers near the active layer arranged so as to hold the active layer, and a band structure 41 in a biased status corresponding to the laminated structure 40, in particular a first electrically conductive type of layer 11 are on a n-type layer side, and a second electrically conductive type of layer 13 is on a p-type layer side. A band structure 41 in FIGS. 13A, 13B and FIGS. 14A and 14B are the same as that in FIG. 12B. In figures, a white circle denotes a hole, a black circle denotes an electron, an arrow schematically denotes movement of each carrier, a solid line denotes a conduction band $E_c$ and a valance band $E_v$, and a dotted line denotes a pseudo-Fermi level $E_f$. As seen from FIGS. 12A and 12B, a first nitride semiconductor layer 26 and a second nitride semiconductor layer 29 which have the smaller band gap energy than that of barrier layers 2a and 2b holding a well layer 1, are arranged holding an active layer, and they are used as upper and lower light guiding layers. Here, a carrier confining layer 28 is provided near, preferably adjacent to an active layer, between a second nitride semiconductor layer 29 and an active layer 27, in a second electrically conductive type of layer (P-type layer side). That is, holes are confined in a well layer by a barrier layer 2a in an active layer, electrons are confined by a carrier confining layer 28 adjacent to a barrier layer 2b and/or an active layer 27. In FIGS. 13A and 13B showing the conventional structure, offset for confining carriers is provided between a layer 26 in a first electrically conductive type of layer, and an active layer 27 and a barrier layer 2a. A nitride semiconductor layer or a light guiding layer 26 having the greater band gap energy than that of an active layer 27 or a barrier layer 2a is provided adjacent to an active layer, and functions to confine carriers. However, in a nitride semiconductor layer 26 adjacent to an active layer 27 and a barrier layer 2a, there is no structure in which carriers are confined in an active layer. Carriers are confined in a well layer 1a by a first barrier layer 2a arranged on a most first electrically conductive type of layer side.

The relationship between a well layer, a barrier layer and a first nitride semiconductor layer (second nitride semiconductor layer) will be explained below. As described above, a nitride semiconductor device of the present invention has a structure in which a first electrically conductive type of layer, an active layer and a second electrically conductive type of layer are laminated. Here, a case will be explained where a first electrically conductive type of layer is a n-type layer having a n-type nitride semiconductor and a second electrically conductive type of layer is a p-type layer having a p-type nitride semiconductor. As described above, a case will be explained where, in an active layer for a quantum well structure, a n-side barrier layer arranged nearest a n-type layer side is a first barrier side and, on the other hand, a p-side barrier layer arranged nearest a p-type layer side is a second barrier layer. Here, in the present invention, in the relationship with a first nitride semiconductor layer provided in a first electrically conductive type of layer (n-type layer), preferably near a n-side barrier layer, a first nitride semiconductor layer has the greater band gap energy than that of a first barrier layer. Therefore, an active layer has at least a first barrier layer and a well layer. Upon this, it is necessary that a first barrier layer is provided on a n-type layer side rather than a well layer. For this reason, in the present invention, an active layer has at least a well layer, and a first barrier layer provided on n-type layer side rather than a well layer. Preferably, provision of a second barrier layer (p-side barrier layer) provided on a p-type layer side rather than a well layer, such a structure is provided that a well layer is held by at least a first barrier layer and a second barrier layer. The reason is as follows: Since a first barrier layer and a second barrier layer which are provided holding a well layer therebetween are a barrier layer provided nearest a n-type layer and nearest p-type layer, respectively, they have the different functions.

A first barrier layer is a barrier layer arranged nearest n-type layer in an active layer. More preferably, a first barrier layer is provided on an outermost side and nearest a n-type layer in an active layer, further preferably, it is provided in contact with a n-type layer and a first nitride semiconductor layer. The reason is as follows: Since a first barrier layer is provided apart from a n-type layer via a well layer, for example, in the form shown in FIG. 13B, carriers are injected into a well layer on a more n-type layer side than a first barrier layer 2a, and carriers are generated overflowing on a n-type layer side and, on the other hand, when overflow on a n-type layer side is inhibited by a thick first barrier layer, carriers are not injected into a well layer on a more n-type layer side, and the function of a well layer such as light emitting recombination is deteriorated. Conversely, a first barrier layer functions as a barrier for confining carriers in a well layer within an active layer held by a first barrier layer and a p-type layer, and a second barrier layer functions similarly for confining carriers into a well layer between a second barrier layer and a n-type layer, while a barrier layer held by well layers, for example, barrier layers 2c and 2d in FIGS. 14A and 14B has the function of dispersing and confining carriers into each well layer and, thus, a first barrier layer and a second barrier layer, and a barrier layer between well layers have the different functions. For this reason, in order to make a greatest use of the functions of a first barrier layer, it becomes possible to suitably confine carriers into an active layer by arranging a first barrier layer and a second barrier layer on an outermost side in an active layer.

Figure 14A:
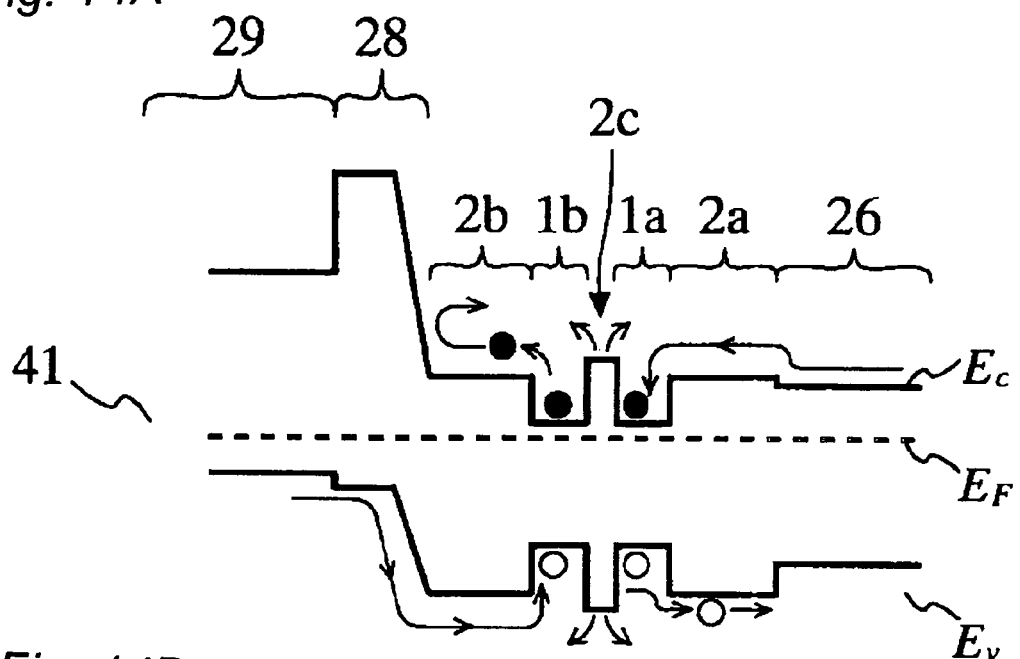
FIGS. 14A and 14B are schematic views explaining band structures in the bias status in an device relating to one embodiment of the present invention.
Figure 14B:
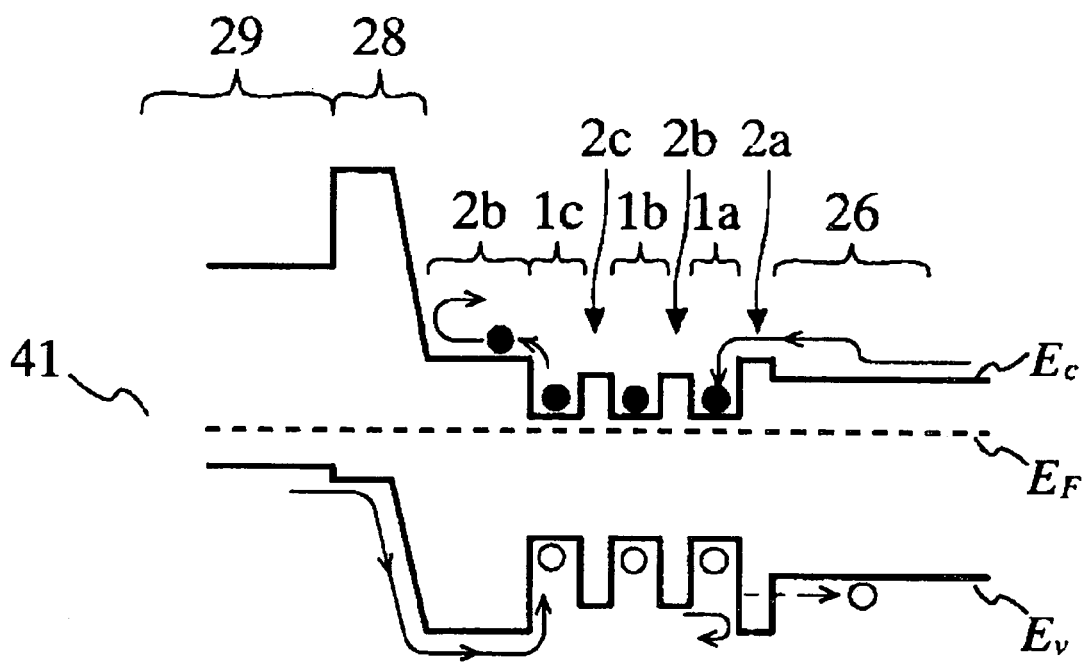

In addition, regarding a second barrier layer (second p-side barrier layer), instead of provision of this, by provision of a carrier confining described later outside an active layer, preferably in contact with an active layer, in a second electrically conductive type of layer (p-type layer), carriers may be confined in a well layer in an active layer. Preferably, by provision of a second barrier layer in addition to this carrier confining layer 28 in an active layer, the nature of easy diffusion of an electron as compared with a hole and a tendency of a carrier diffusion length in a nitrogen semiconductor can be improved and thus, a structure can be obtained in which carriers can be confined and injected suitably in an active layer, particularly in a well layer. Here, like a first barrier layer, a second barrier layer is arranged on a p-type layer (second electrically conductive type of layer) side rather than a well layer, more preferably, arranged nearest a p-type layer, most preferably, arranged on an outermost side and on a p-type layer side in an active layer, whereby, carriers can be suitably injected. Alternatively, in connection with a carrier confining layer, a second barrier layer may be arranged apart from a carrier confining layer. However, by forming a second barrier layer in contact with a carrier confining layer 28 in a p-type layer, supplemental confinement of carriers in a carrier confining layer by a second barrier layer, and injection into a well layer are possible, being preferable.

n addition, barrier layers other than an outermost barrier layer among barrier layers in an active layer, which are arranged nearer a first electrically conductive type of layer and a second electrically conductive type of layer than a well layer in an active layer like the aforementioned first barrier layer and second barrier layer may be provided such that a barrier layer 2c is held by a well layer 1a and a well layer 2b and a barrier layer 2d is held by a well layer 1b and a well layer 1c, for example, as shown in FIGS. 14A and 14B. In particular, in a multiple quantum well structure, by using such the barrier layer held by well layers, carriers are suitably dispersed, injected and confined in each well layer in a plurality of well layers. That is, they have the different functions from those of the aforementioned first barrier layer 2a and second barrier layer 2b. Even when a thickness is smaller than that of a first barrier layer or a second barrier layer, such the quantum well structure can be obtained that the function of a barrier layer held by well layers is not deteriorated, and a thickness of a whole active layer can be suppressed and increase in Vf can be suppressed, being preferable. In addition, by using a barrier layer 2c held by well layers instead of a first barrier layer 2a and a second barrier layer 2b as shown in FIG. 14A, carriers injected from each electrically conductive type of layer are directly and suitably confined and injected in an adjacent well layer by this barrier layer 2c having the great barrier intervening well layers, being preferable. Alternatively, by using barrier layers 2c and 2d held by well layers instead of a first barrier layer 2a and a second barrier layer 2b as shown in FIG. 14B, the function of confinement by a barrier layer situated in the interior of these barrier layers is weakened, and a first barrier layer 2a and a second barrier layer 2b situated in the outside thereof are strengthened as compared with these barrier layers. Whereby, even when the number of well layers is increased, outer barrier layers form the great barrier and, therefore, a structure can be obtained in which injection and confinement of carriers in each well layer are suitably realized.

As explained above, since a first barrier layer 2a and a second barrier layer 2c which are an external barrier layer have the different functions from those of an internal barrier layer held by well layers, a thickness, the band gap energy and the composition may be changed between an internal barrier layer and an external barrier layer and, thus, an device having the desired device properties can be obtained. Alternatively, in an active layer having a plurality of internal barrier layers as shown in FIG. 14B, the composition, the band gap energy and a thickness may be changed between respective internal barrier layers. Alternatively, the composition, the band gap energy and a thickness may be approximately the same between respective internal barrier layers. Preferably, by adopting approximately the same composition, band gap energy and thickness, the approximately uniform function are imparted to internal barrier layers and, thus, carriers are suitably injected in respective well layers.

In addition, as described above, for the aforementioned reasons, it is preferable that, regarding doping of respective barrier layers with impurity, a first barrier layer 2b situated on a most n-type layer side is doped with n-impurity. It is preferable that a second barrier layer arranged on a most p-type layer side is not substantially doped with n-type impurity, more specifically, is doped at the impurity concentration of $5\times10^{16}/cm^3$, rather than doped with n-type impurity. The reason is as follows: N-type impurities used in a nitride semiconductor have the high diffusibility in many cases. For example, there is a tendency that widely used Mg and Zn are extensively diffused in a laminated structure. When p-type impurity is doped in a barrier layer, diffusion into an adjacent well layer occurs, and there is a tendency that light emitting recombination of carriers in a well layer is suppressed. In addition, by making a second barrier layer near a p-type layer side undoped, diffusion of impurity from a p-type layer is terminated in a barrier layer, and further diffusion of impurity in a well layer is prevented, being preferable. In particular, when a carrier confining layer 28 is harbored in a p-type layer and arranged in the vicinity of a second barrier layer, preferably in contact with a second barrier layer, since there is a tendency that a carrier confining layer becomes a relatively high resistant layer, p-type impurity tends to be doped at the high concentration and, therefore, this impurity diffusion becomes problematic. However, making a second barrier layer undoped, deterioration of the function of a well layer due to the diffusion can be prevented, being preferable. In addition since there is a tendency that a p-n junction is formed in the vicinity of a carrier confining layer and, as shown in FIGS. 12B and 14A and the like, a carrier confining layer is formed at the greatest Al crystal mixing ratio in an device structure, a great piezoelectricity is applied by a nitride semiconductor having a high Al crystal mixing ratio, which tends to have adverse effect on a well layer. However, by forming a second barrier layer having a smaller Al crystal mixing ratio than that of a carrier confining layer, there is a tendency that adverse effect on a well layer can be suppressed, being preferable.

In addition, when a first barrier layer has a greater thickness than that of a second barrier layer in comparison with a first barrier layer and a second barrier layer, by provision of a carrier confining layer 28 in a second electrically conductive type of layer, the function of confining carriers in an active layer by a second barrier layer is reduced, that is, a barrier layer works like the aforementioned internal barrier layer. A structure is obtained in which confinement of carriers mainly in an active layer is realized by a carrier confining layer 28. Since a thickness of a whole active layer can be reduced, Vf is reduced. In addition, in a nitride semiconductor, since a diffusion length of a hole is sufficiently smaller than a diffusion length of an electron, when a thickness of a first barrier layer which is an inlet for holes is small, and carriers are effectively injected in a well layer, being preferable. On the other hand, when a carrier confining layer 28 doped with p-type impurity is provided, or when a second nitride semiconductor layer 29 arranged near an active layer, preferably in contact with an active layer has the greater band gap energy than that of a first barrier layer, a layer having a high Al crystal mixing ratio is provided adjacent to an active layer. For this reason, since a layer having a high Al crystal mixing ratio is highly resistant, the great heat is produced in this layer during device operation and, when it is near a well layer, adverse effect of the heat on a well layer occurs, which tends to decrease the device properties. In addition, at an interface between such the layer having a high Al crystal mixing ratio and an active layer, or at an interface on an active layer side of a layer having a high Al crystal mixing ratio, or in the vicinity thereof, when a p-n junction is formed and a well layer for an active layer is provided in the vicinity thereof as shown in FIGS. 12B, 14A and 14B, there is a tendency that bias may have adverse effect on light emitting recombination in a well layer. That is, it is preferable that a first barrier layer is made to function as a spacer for isolating a well layer and a layer having a high Al crystal mixing ratio so that the aforementioned layer having a high Al crystal mixing ratio has no adverse effect on a well layer. In this case, when a specific thickness of a first barrier layer is at least 20 Å or more, the aforementioned function as a spacer can be manifested. When a thickness is 40 Å or more, an active layer which has suppressed influence on a well layer is obtained, being preferable.

As a first light guiding layer 26 and a second light guiding layer 29 in the present invention, a nitride semiconductor containing Al. In addition, as shown as a band structure 41 in FIGS. 12B and FIGS. 14A and 14B, light guiding layers are made to have the greater band gap energy at least than that of a well layer 1 in an active layer 27 in a quantum well structure, and a difference in a refractive index between an active layer 27 and light guiding layers 26 and 29 is made to be small, whereby, a waveguide structure is obtained. In addition, as shown in FIGS. 12B and FIGS. 14A and 14B, a light guiding layer may have the smaller band gap energy than that of a barrier layer. Alternatively, as shown in FIGS. 13A and 13B, a part of light guiding layers may have the greater band gap energy than that of a barrier layer. In this case, light guide layers except for a first barrier layer, or a part thereof may have the greater band gap energy than that of a barrier layer. Alternatively, as shown in FIGS. 14A and 14B, a light guiding layer may have the greater band gap energy than that of an internal barrier layer, that is, a part of barrier layers in an active layer.

That is, preferably, when a light guiding layer has a first nitride semiconductor layer having the smaller band gap energy than that of a first barrier layer, more preferably, a light guiding layer comprises a first nitride semiconductor layer, or a whole light guiding layer has the smaller band gap energy than that of a first barrier layer in a multi-layered membrane light guiding layer having a layer other than a first nitride semiconductor layer, the function as the aforementioned carrier confining layer for a first barrier layer is suitably manifested. Further, when a light guiding layer having a low Al crystal mixing ratio is formed, for example, whereby, a lower light guiding layer is formed, an active layer can be formed while deterioration of the crystallizing property due to a nitride semiconductor containing Al is suppressed and, thus, an device excellent in the light emitting device and laser device properties can be obtained. Alternatively, in addition, like provision of a light guiding layer in a first electrically conductive type of layer in the case of a first nitride semiconductor layer, in the case where a light guiding layer is provided in a second electrically conductive type of layer, as described above, a second nitride semiconductor layer having the smaller band gap energy than that of a second barrier layer may be provided. The same effects as those of a first nitride semiconductor layer are exerted.

Further, in the case where a second nitride semiconductor layer is provided in an upper light guiding layer, as the composition of a light guiding layer, specifically, $In_\alpha Al_\beta Ga_{1-\alpha-\beta}N$ ($0 \leq \alpha$, $0 < \beta$, $\alpha+\beta \leq 1$) is used. Preferably, by using a nitride semiconductor containing no In, that is, by using nitride semiconductor having an In ratio of zero, absorption of the light due to inclusion of In can be prevented and, thus, a waveguide which can suppress the loss of the light low can be obtained. Further, by using preferably $Al_\beta Ga_{1-\beta}N$ ($0 \leq \beta \leq 1$), a waveguide is obtained which can be applied to a wide wavelength area from an ultraviolet area to a red area. In particular, in order to guide the light in a shorter wavelength area of 380 nm or shorter as described above, $Al_\beta Ga_{1-\beta}N$ ($0 \leq \beta \leq 1$) is preferably used because, in GaN, the aforementioned shorter wavelength area light is absorbed, resulting in the loss, and the threshold current density and the current-light output properties are deteriorated. In particular, it is preferable that an Al ratio β in a light guiding layer is adjusted so that the band gap energy $E_g$ of a light guiding layer is greater than the photon energy $E_p$ of light emitting of an active layer by 0.05 eV or greater ($E_g - E_p \geq 0.05$ eV). Whereby, a waveguide is obtained in which the loss of the light due to a guiding layer is suppressed in the aforementioned shorter wavelength area. More preferably, by adopting $E_g - E_p \geq 0.1$, a more excellent waveguide is formed.

In case where a first nitride semiconductor layer is provided in a light guiding layer, the light guiding layer may have a superlattice structure or be formed of a single membrane. The formation of a single membrane, in comparison to the superlattice structure, may facilitate flow of carrier current and decrease of Vf. In this case a thickness of the single membrane is as thick as at least no quantum effect occurs, preferably thicker than that of a first barrier layer (a second barrier layer in case of a second nitride semiconductor layer), more preferably 300 Å or greater.

In case where a light guiding layer has a superlattics, on the other hand, all of layers constituting the superlattics may preferably contain Al, or it is preferable that at least one of layers constituting the superlattics may preferably contain Al and whose bandgap energy is smaller than that of a outermost barrier layer in a active layer and larger than that of a inner barrier layer in the active layer. This can sufficiently facsilitate carriers to be confined into the active layer.

The interface between the first electrically conductive type of layer and the first barrier layer is preferably lattice-mismatched. More specifically, where the first barrier layer is formed of $Al_u In_v Ga_{1-u-v}N$ ($0 < u < 1$, $0 < v < 1$, $u+v < 1$), the first nitride semiconductor layer may be formed of $Al_x Ga_{1-x}N$ ($0 \leq x < 1$). Where the first electrically conductive type of layer is formed of quaternary mixed crystal of nitride semiconductor to be lattice-matched with the first barrier layer, the layer is intended to contain In and the quaternary mixed crystal of nitride semiconductor containing In may be difficult to form a thickness of, for example, 300 Å or greater. Thus the first electrically conductive type of layer is preferable formed of AlGaN excluding In, which has a lattice-mismatching character.

(Embodiment 3)

A third embodiment of the present invention will be explained below, describing specific examples of device structures.

(Embodiment 3-1)

Active layer (AlGaN barrier layer/GaN well layer/AlGaN barrier layer) SCH structure
 p-GaN contact layer
 p-Al$_{0.1}$Ga$_{0.9}$N/Al$_{0.05}$Ga$_{0.95}$N superlattice cladding layer (upper cladding layer 30)
 p-Al$_{0.04}$Ga$_{0.96}$N guiding layer (upper guiding layer 29)
 p-Al$_{0.3}$Ga$_{0.7}$N (carrier confining layer 28)
 Active layer (Al$_{0.15}$Ga$_{0.85}$N barrier layer (first barrier layer)(100 Å)/GaN well layer (100 Å)/Al$_{0.15}$Ga$_{0.85}$N barrier layer (second barrier layer)(45 Å))
 n-Al$_{0.04}$Ga$_{0.96}$N guiding layer (lower guiding layer 26)
 n-Al$_{0.1}$Ga$_{0.9}$N/Al$_{0.05}$Ga$_{0.95}$N superlattice cladding layer (lower cladding lower 25)
 n-InGaN crack preventing layer
 n-Al$_{0.02-0.03}$GaN (Si doped: carrier concentration 2×10$^{18}$ cm$^{-3}$)
 Substrate (defect density 5×10$^5$/cm$^3$: substrate obtained by crystal-growing GaN on an ELOG substrate by a HVPE method)

(Embodiment 3-2)

Active layer (AlInGaN barrier layer/GaN well layer/AlInGaN barrier layer) SCH structure
 An active layer is shown below, and others have the same structure as in Embodiment 3-1.
 Active layer (Al$_{0.15}$In$_{0.03}$Ga$_{0.82}$N barrier layer (first barrier layer) (100 Å)/GaN well layer (100 Å)/Al$_{0.15}$In$_{0.03}$Ga$_{0.82}$N barrier layer (second barrier layer) (45 Å))

(Embodiment 3-3)

Active layer (AlGaN barrier layer/AlGaN well layer/AlGaN barrier layer) SCH structure (oscilating wavelength 360 nm)
 An active layer is shown below, and others have the same structure as in Embodiment 3-1.
 Active layer (Al$_{0.20}$Ga$_{0.80}$N barrier layer (first barrier layer) (100 Å)/Al$_{0.05}$Ga$_{0.95}$N well layer (100 Å)/Al$_{0.20}$Ga$_{0.80}$N barrier layer (second barrier layer)(45 Å))

(Embodiment 3-4)

Active layer (AlInGaN barrier layer/AlGaN well layer/AlInGaN barrier layer) SCH structure (oscillating wavelength 360 nm)
 An active layer is shown below, and others have the same structure as in Embodiment 3-1.
 Active layer (Al$_{0.15}$In$_{0.03}$Ga$_{0.82}$N barrier layer (first barrier layer)(100 Å)/GaN well layer (100 Å)/Al$_{0.15}$In$_{0.03}$Ga$_{0.82}$N barrier layer (second barrier layer) (45 Å))

(Embodiment 3-5)

Active layer (AlGaN barrier layer/GaN well layer/AlGaN barrier layer) GRIN structure
P-GaN Contact Layer
 No light guiding layer is used, a cladding layer is shown below, and others have the same structure as in Embodiment 3-1.
 p-Al$_a$Ga$_{1-a}$N/Al$_b$Ga$_{1-b}$N superlattice cladding layer (upper cladding layer 30)
 n-Al$_c$Ga$_{1-c}$N/Al$_d$Ga$_{1-d}$N superlattice cladding layer (lower cladding layer 25)

(Embodiment 3-6)

Active layer (AlInGaN barrier layer/GaN well layer/AlInGaN barrier layer) GRIN structure
 No light guiding layer is used, a cladding layer and an active layer are shown below, and others have the same structure as in Embodiment 3-1.
 p-Al$_a$Ga$_{1-a}$N/Al$_b$Ga$_{1-b}$N superlattice cladding layer (upper cladding layer 30)
 Active layer (Al$_{0.15}$In0.03Ga$_{0.82}$N barrier layer (first barrier layer) (45 Å)/GaN well layer (100 Å)/Al$_{0.15}$In$_{0.03}$Ga$_{0.82}$N barrier layer (second barrier layer) (45 Å))
 n-Al$_c$Ga$_{1-c}$N/Al$_d$Ga$_{1-d}$N superlattice cladding layer (lower cladding layer 25)

(Embodiment 3-7)

Active layer (AlGaN barrier layer/AlGaN well layer/AlGaN barrier layer) GRIN structure (oscillating wavelength 360 nm)
 No light guiding layer is used, a cladding layer and an active layer are shown below, and others have the same structure as in Embodiment 3-1.
 p-Al$_a$Ga$_{1-a}$M/Al$_b$Ga$_{1-b}$N superlattice cladding layer (upper cladding layer 30)
 Active layer (Al$_{0.20}$Ga$_{0.80}$N barrier layer (first barrier layer)(100 Å)/Al$_{0.05}$Ga$_{0.95}$N well layer (100 Å)/Al$_{0.20}$Ga$_{0.80}$N barrier layer (second barrier layer)(45 Å))
 n-Al$_c$Ga$_{1-c}$N/Al$_d$Ga$_{1-d}$N superlattice cladding layer (lower cladding layer 25)

(Embodiment 3-8)

Active layer (AlInGaN barrier layer/AlGaN well layer/AlInGaN barrier layer) GRIN structure (oscillating wavelength 360 nm)
 No light guiding layer is used, a cladding layer and an active layer are shown below, and others have the same structure as in Embodiment 3-1.
 p-Al$_e$Ga$_{1-e}$N gradient ratio cladding layer (upper cladding layer 30)
 Active layer (Al$_{0.15}$In$_{0.03}$Ga$_{0.82}$N barrier layer (first barrier layer)(100 Å)/GaN well layer (100 Å)/Al$_{0.15}$In$_{0.03}$Ga$_{0.82}$N barrier layer (second barrier layer) (45 Å))
 n-Al$_f$Ga$_{1-f}$N gradient ratio cladding layer (lower cladding layer 25)

(Embodiment 3-9)

Active layer (AlGaN barrier layer/GaN well layer/AlGaN barrier layer) GRIN-SCH structure
 A light guiding layer is shown below, and others have the same structure as in Embodiment 3-1.
 p-Al$_g$Ga$_{1-g}$N gradient ratio guiding layer (upper guiding layer 29)
 Active layer (Al$_{0.15}$Ga$_{0.85}$N barrier layer (first barrier layer)(100 Å)/GaN well layer (100 Å)/Al$_{0.15}$Ga$_{0.85}$N barrier layer (second barrier layer)(45 Å))
 n-Al$_h$Ga$_{1-h}$N gradient ratio guiding layer (lower guiding layer 26)

(Embodiment 3-10)

Active layer (AlInGaN barrier layer/GaN well layer/AlInGaN barrier layer) GRIN-SCH structure (oscillating wavelength 360 nm)
 A cladding layer and an active layer are shown below, and others have the same structure as in Embodiment 3-1.
 p-Al$_g$Ga$_{1-g}$N gradient ratio guiding layer (upper guiding layer 29)

Active layer ($Al_{0.15}In_{0.03}Ga_{0.82}N$ barrier layer (first barrier layer)(100 Å)/GaN well layer (100 Å)/$Al_{0.15}In_{0.03}Ga_{0.82}N$ barrier layer (second barrier layer) (45 Å))

n-$Al_hGa_{i-h}N$ gradient ratio guiding layer (lower guiding layer 26)

(Embodiment 3-11)

Active layer (AlGaN barrier layer/AlGaN well layer/AlGaN barrier layer) GRIN-SCH structure (oscillating wavelength 360 nm)

A cladding layer and an active layer are shown below, and others have the same structure as in Embodiment 3-1.

p-$Al_gGa_{1-g}N$ gradient ratio guiding layer (upper guiding layer 29)

Active layer ($Al_{0.20}Ga_{0.80}N$ barrier layer (first barrier layer)(100 Å)/$Al_{0.05}Ga_{0.95}N$ well layer (100 Å)/$Al_{0.20}Ga_{0.80}N$ barrier layer (second barrier layer)(45 Å))

n-$Al_hGa_{i-h}N$ gradient ratio guiding layer (lower guiding layer 26)

(Embodiment 3-12)

Active layer (AlInGaN barrier layer/AlGaN well layer/AlInGaN barrier layer) GRIN-SCH structure (oscillating wavelength 360 nm)

A cladding layer and an active layer are shown below, and others have the same structure as in Embodiment 3-1.

p-$Al_gGa_{1-g}N$ gradient ratio guiding layer (upper guiding layer 29)

Active layer ($Al_{0.15}In_{0.03}Ga_{0.82}N$ barrier layer (first barrier layer)(100 Å)/GaN well layer (100 Å)/$Al_{0.15}In_{0.03}Ga_{0.82}N$ barrier layer (second barrier layer) (45 Å))

p-$Al_gGa_{1-g}N$ gradient ratio guiding layer (lower guiding layer 26)

The characteristics of the aforementioned Embodiments 3-1~3-12 will be explained, respectively.

Embodiment 3-1 has a superlattice structure in which an active layer is held by upper and lower cladding layers, an upper light guiding layer and a lower light guiding layer are provided between respective cladding layers and an active layer, one of cladding layers is modification-doped, respective light guiding layers have the smaller band gap energy than that of a first barrier layer or a second barrier layer and have a smaller Al crystal mixing ratio, and a barrier layer is formed of an AlGaN ternary mixed crystal. A different point in embodiment 3-2 from embodiment 3-1 is that a first barrier layer and a second barrier layer are formed of an AlInGaN quaternary mixed crystal. A different point in embodiment 3-3 from embodiments 3-1 and 3-2 is that a well layer is an AlGaN ternary mixed crystal. A different point in embodiment 3-4 from embodiments 3-1, 2 and 3 is that a well layer is an AlGaN ternary mixed crystal and a barrier layer is an AlInGaN quaternary mixed crystal. A different point in embodiment 3-5 from embodiments 3-1, 2, 3 and 4 is that one of an upper cladding layer and a lower cladding layer is doped in a modified doping manner to form a superlattice cladding layer, Al ratios A and C in one of cladding layers are rendered smaller as approaching an active layer, the band gap energy $E_c$ in the vicinity of an active layer (area having a distance from an active layer of 0.1 μm or smaller) is greater than $E_p$ by 0.05 Ev or greater and, on the other hand, in this vicinity, an Al ratio and the band gap energy are rendered smaller than those of a first barrier layer and a second barrier layer. Upon this, an Al ratio is a>b, c>d. A different point in embodiment 3-8 from embodiments 3-1~7 is that, in an AlGaN layer as an upper cladding layer and a lower cladding layer, Al crystal mixing ratios e and f are rendered smaller as approaching an active layer, the band gap energy $E_c$ in the vicinity of an active layer (area having a distance from an active layer of 0.1 μm or smaller) is greater than $E_p$ by 0.05 eV or greater and, on the other hand, in this vicinity, an Al crystal mixing ratio and the band gap energy are rendered smaller than those of a first barrier layer and a second barrier layer. A different point in embodiment 3-9 from embodiments 3-1~8 is in that a guiding layer has a gradient ratio structure, Al crystal mixing ratios g and h are rendered smaller as approaching an active layer, a part of the guiding layer has smaller Al crystal mixing ratio and band gap energy than those of a first barrier layer and a second barrier layer.

EXAMPLE 1

As Example, a laser device in which a nitride semiconductor is used in a laser device structure as shown in FIG. 1, and in a waveguide structure as shown in FIG. 1, will be explained below. Here, a first electrically conductive type of layer is formed of an n-type nitride semiconductor and a second electrically conductive type layer is formed of a p-type nitride semiconductor. However, the present invention is not limited to this, but conversely a first electrically conductive type of layer may be p-type and a second electrically conductive type of layer may be n-type.

A GaN substrate is used in this Example. Alternatively, a different heterogeneous substrate from a nitride semiconductor may be used as a substrate. As a heterogeneous substrate, substrate materials different from a nitride semiconductor, which have been known that a nitride semiconductor can be grown thereon, can be used, such as sapphire, spinel (insulating substrate such as $MgAl_2O_4$), SiC (including 6H, 4H and 3C), ZnS, ZnO, GaAs and Si, and oxide substrates which are lattice-compatible with a nitride semiconductor, having a main plane of either of C-plane, R-plane and A-plane. Preferable heterogeneous substrates are sapphire and spinel. In addition, a heterogeneous substrate may be off angle. In this case, when a heterogeneous substrate which is step-like off angle is used, a ground layer comprising gallium nitride is grown with the better crystallizing property, being preferable. Further, when a heterogeneous substrate is used, a device structure as a nitride semiconductor single substrate may be formed by growing a nitride semiconductor which is to be a ground layer before formation of a device structure, and removing a heterogeneous substrate by a method such as abrasion. Alternatively, after formation of a device structure, a heterogeneous substrate may be removed. In addition to a GaN substrate, a substrate of a nitride semiconductor such as AlN and the like may be used.

In the case where a heterogeneous substrate is used, when a device structure is formed via a buffering layer (low temperature growing layer) and a ground layer comprising a nitride semiconductor (preferably GaN), a nitride semiconductor is grown better. In addition, when a nitride semiconductor grown by ELOG (Epitaxially Laterally Overgrowth) is used as a ground layer (growing substrate) provided on a heterogeneous substrate, a growing substrate having the better crystallizing property is obtained. As an example of ELOG layer, a mask region formed by growing a nitride semiconductor layer on a heterogeneous substrate and providing a protecting membrane on which a nitride semiconductor is difficult to be grown, and a non-mask region on which a nitride semiconductor is to be grown are provided stripe-like, a nitride semiconductor is grown from the non-mask region. Whereby, lateral direction growth is effected in addition to a thickness direction growth. Whereby, a nitride semiconductor is also grown on a mask region to obtain an example of ELOG layer. In other form, an opening is provided in a nitride semiconductor layer grown on a heterogeneous substrate, and lateral direction growth is effected from a side of the opening to obtain an example of ELOG layer.

(Substrate 101)

After a nitride semiconductor, GaN in this Example, grown on a heterogeneous substrate as a substrate is grown at a thickness of 100 µm, a heterogeneous substrate is removed, and a nitride semiconductor substrate comprising GaN of 80 µm is used. The details of a method for forming a substrate is as follows: a heterogeneous substrate comprising 2 inch φ sapphire having C plane as a main plane is placed in a MOVPE reactor, a temperature is maintained at 500° C., trimethylgallium (TMG) and ammonia ($NH_3$) are used to grow a low temperature growing buffering layer comprising GaN at a thickness of 200 Å and, thereafter, a temperature is risen, undoped GaN is grown at a thickness of 1.5 µm to obtain a ground layer. Then, a plurality of stripe-like masks are formed on the surface of a ground layer, a nitride semiconductor, GaN is selectively grown from a mask opening (window part) to form a nitride semiconductor layer (lateral growing layer) obtained by growth with lateral growing (ELOG), subsequently, GaN is grown at a thickness of 100 µm by HVPE, and a heterogeneous substrate, a buffering layer and a ground layer are removed to obtain a nitride semiconductor substrate comprising GaN.

Upon this, a mask at selective growth comprises $SiO_2$. A mask width of 15 µm and an opening (window part) width of 5 µm can reduce penetration rearrangement. Specifically, in a region in which laterally grown such as an upper part of a mask, penetration rearrangement is reduced. At a mask opening, a membrane is obtained by approximate membrane growth. Therefore, there is no change in penetration rearrangement, resulting in a layer in which a region having a great penetration rearrangement density and a region having a small density are distributed. For forming a thick nitride semiconductor layer, a HVPE method is preferable owing to great growing rate. By using GaN or AlN as a nitride semiconductor to be grown by HVPE, a thick membrane is grown with the better crystallizing property. When the GaN substrate is formed by HVPE, there is a tendency of three dimensional growing form in which as a domain grown from a produced nucleus is grown in a thickness direction, respective domains are combined to form a membrane. In such the case, since penetration rearrangement is transmitted with nucleus growth, there is a tendency that penetration rearrangement distributed by the aforementioned lateral growing layer is dispersed.

(Buffering Layer 102)

At a temperature of 1050° C., TMG (trimethylgallium), TMA (trimethylaluminium) and ammonia are used to grow a buffering layer 102 comprising $Al_{0.05}Ga_{0.95}N$ at a thickness of 4 µm on a nitride semiconductor substrate. This layer functions as a buffering layer between an AlGaN n-side contact layer and a nitride semiconductor substrate comprising GaN.

Specifically, when a lateral growing layer or a substrate formed by using the layer is GaN, a buffering layer 102 comprising a nitride semiconductor having a smaller thermal expansion coefficient than that of GaN, $Al_aGa_{1-a}N$ ($0<a\leq1$) can be used to reduce pit. Preferably, it is provided on GaN which is a lateral growing layer of a nitride semiconductor. Further, when an Al crystal mixing ratio a in the buffering layer 102 is $0<a<0.3$, a buffering layer can be formed with the better crystallizing property. This buffering layer may be formed as an n-side contact layer. After the buffering layer 102 is formed, an n-side contact layer represented by a composition equation of the aforementioned buffering layer is formed, thus, the buffering layer 102 and an n-side contact layer 104 thereon allow to have the buffering effect. That is, this buffering layer 102 is provided between a nitride semiconductor substrate using lateral growth or a lateral growing layer formed thereon and a device structure, or between an active layer in a device structure and a lateral growing layer (substrate), or a lateral growing layer formed therein (substrate), more preferably, is provided between a substrate-side lower cladding layer in a device structure and a lateral growing layer (substrate) at least one layer, whereby, pit can be reduced and the device properties can be improved.

In addition, when an n-side contact layer is a buffering layer, in order to obtain better ohmic contact with an electrode, it is preferable that an Al crystal mixing ratio a in an n-side contact layer is 0.1 or smaller. This first nitride semiconductor layer, or a buffering layer to be provided on a lateral growing layer formed thereon, may be grown at a low temperature of not lower than 300° C. and not higher than 900° C., at a temperature of not lower than 800° C. and not higher than 1200° C., like a buffering layer to be provided on the aforementioned heterogeneous substrate. Preferably, when single crystal is grown at a temperature of not lower than 800° C. and not higher than 1200° C., there is a tendency that the aforementioned pit reducing effects can be obtained. This buffering layer may be doped with n-type or p-type impurity, or may be undoped. In order to obtain the better crystallizing property, it is preferable that this buffering layer is formed undoped. When 2 or more buffering layers are provided, the n-type or p-type impurity concentration, and an Al crystal mixing ratio can be changed.

Then, respective layers which are to be a device structure are laminated on a ground layer comprising a nitride semiconductor. Here, as a first electrically conductive type of layer, n-side contact layer 110 to n-side light guiding layer are provided and, as a second electrically conductive type of layer, p-side electron confining layer 108 to p-side contact layer 111 are provided.

(N-Side Contact Layer 103)

Then, on the resulting buffering layer 102, TMG, TMA, ammonia, and silane gas as impurity gas are used to grow an n-side contact layer 103 comprising Si-doped $Al_{0.05}Ga_{0.95}N$ at a thickness of 4 µm at 1050° C. By using a nitride semiconductor containing Al, specifically, $Al_xGa_{1-x}N$ ($0<x\leq1$) in an n-side contact layer or a ground layer such as a buffering layer, there is a tendency that deterioration of the crystallizing property due to use of ELOG, in particular, occurrence of pit are suppressed and, thus, a better ground layer surface can be provided as compared with a nitride semiconductor containing no Al such as GaN, whereby, it is preferable to use a nitride semiconductor containing Al.

(Crack Preventing Layer 104)

Then, TMG, TMI (trimethylindium) and ammonia are used to grow a crack preventing layer 104 comprising $In_{0.06}Ga_{0.94}N$ at a thickness of 0.15 µm at a temperature of 800° C. This crack preventing layer may be omitted.

(N-Side Cladding Layer 105) (Lower Cladding Layer 25))

Then, TMA, TMG and ammonia as a raw material are used to grow an A layer comprising undoped $Al_{0.14}Ga_{0.86}N$ at a thickness of 25 Å at a temperature of 1050° C. Subsequently, TMA is stopped, a silane gas is used as impurity gas to grow a B layer comprising GaN doped with Si at $5\times10^{18}/cm^3$ at a thickness of 25 Å. A procedure of laminating an A layer and a B layer alternately is repeated 120 times to laminate an A layer and a B layer, to grow an n-side cladding layer 106 comprising a multi-layered membrane (superlattice structure) having a total thickness of 0.6 μm.

(N-Side Light Guiding Layer 106 (First Light Guiding Layer 26))

Then, at the same temperature, TMG and ammonia are used as a raw material gas to alternately laminate an A layer comprising Si-doped GaN of thickness of 25 Å and a B layer comprising $Al_{0.06}Ga_{0.95}N$ of a thickness of 25 Å (by adding TMA as a raw material gas) 30 times, to grow an n-side light guiding layer 106 comprising a superlattice multi-layered membrane having a thickness of a 0.15 μm.

(Active Layer 107)

Then, as shown in FIG. 7, TMI (trimethylindium), TMG and TMA are used as a raw material gas to laminate a barrier layer comprising Si-doped $Al_{0.1}Ga_{0.9}N$ and a well layer comprising undoped $In_{0.03}Al_{0.02}Ga_{0.95}N$ thereon in an order of barrier layer 2a/well layer 1a/barrier layer 2b/well layer 1b/barrier layer 2c at a temperature of 800° C. Upon this, as shown in FIG. 7, the barrier layer 2a is formed at a thickness of 200 Å, the barrier layers 2b and 2c are formed at a thickness of 40 Å, and the well layers 1a and 1b are formed at a thickness of 70 Å. An active layer 107 has a multiple quantum well structure (MQW) having a total thickness of about 420 Å.

(P-Side Electron Confining Layer 108 (Carrier Confining Layer 28))

Then, at the same temperature, TMA, TMG and ammonia are used as a raw material gas, and $Cp_2Mg$ (cyclopentadienylmagnesium) is used as an impurity gas to grow a p-side electron confining layer 108 comprising $Al_{0.3}Ga_{0.7}N$ doped with Mg at $1\times10^{19}/cm^3$ at a thickness of 10 mm. This layer needs not to be provided. However, by provision, this layer functions to confine electrons, and contributes to decrease in a threshold.

(P-Side Light Guiding Layer 109 (Second Light Guiding Layer 29))

Then, at a temperature of 1050° C., TMG and ammonia are used as a raw material gas to alternately laminate an A layer comprising Mg-doped GaN of a thickness of 25 Å and a B layer comprising $Al_{0.06}Ga_{0.94}N$ of a thickness of 25 Å (by adding TMA as a raw material) 20 times, to grow a p-side light guiding layer 109 having a superlattice multi-layered structure of a thickness of 0.15 μm.

Since this p-side light guiding layer 109 is doped with Mg by diffusion of Mg from an adjacent layer such as the p-side electron confining layer 108, the p-side cladding layer 109 and the like, even when formed undoped, the guiding layer 109 can be rendered a Mg-doped layer.

(P-Side Cladding Layer 110 (Upper Cladding Layer 30))

Subsequently, at 1050° C., an A layer comprising undoped $Al_{0.14}Ga_{0.86}N$ is grown at a thickness of 25 Å. Subsequently, $Cp_2Mg$ is used to grow a B layer comprising Mg-doped $Al_{0.14}Ga_{0.86}N$ at a thickness of 25 Å. A procedure of laminating an A layer and a B layer alternately is repeated 100 times to grow a p-side cladding layer 110 comprising a superlattice multi-layered membrane of a total thickness of 0.5 μm.

(P-Side Contact Layer 111)

Finally, at 1050° C., a p-side contact layer 111 comprising a p-type GaN doped with Mg at $1\times10^{20}/cm^3$ is grown at a thickness of 150 Å on a p-side cladding layer 110. The p-side contact layer 111 may be composed of p-type $In_XAl_YGa_{1-X-Y}N$ ($0\leq X$, $0\leq Y$, $X+Y\leq 1$), preferably, GaN doped with p-type impurity, or AlGaN having an Al ratio of 0.3 or smaller. Whereby, most preferable ohmic contact with a p-electrode 120 is obtained and, most preferably, by adopting GaN, best ohmic contact becomes possible. Since the contact layer 111 is a layer on which an electrode is formed, the high carrier concentration of $1\times10^{17}/cm^3$ or greater is desirable. When the concentration is less than $1\times10^{17}/cm^3$, there is a tendency that it becomes difficult to obtain preferable ohmic contact with an electrode. Further, by adopting GaN as a composition for a contact layer, preferable ohmic contact with an electrode material is easily obtained. After completion of a reaction, a wafer is annealed in a reactor in the nitrogen atmosphere at 700° C., to render a p-type layer lower resistant.

After a nitride semiconductor is grown to laminate respective layers as described above, a wafer is removed from a reactor, a protecting membrane comprising $SiO_2$ is formed on the surface of an uppermost p-side contact layer, which is etched with $SiCl_4$ gas using RIE (reactive ion etching) to expose the surface of an n-side contact layer 103 on which an n-electrode is to be formed as shown in FIG. 1. Like this, in order to etch a nitride semiconductor deep, $SiO_2$ is best as a protecting membrane.

Then, as the aforementioned stripe-like waveguide region, ridge stripe is formed. First, a first protecting membrane 161 comprising a Si oxide (mainly $SiO_2$) is formed at a thickness of 0.5 μm on the almost surface of an uppermost p-side contact layer (upper contact layer) using a PVD apparatus, a mask having a prescribed shape is placed on a first protecting membrane, which is subjected to the photolithography technique with a RIE (reactive ion etching) apparatus using $CF_4$ gas to obtain a first protecting membrane 161 having a stripe width of 1.6 μm. Upon this, a height of ridge stripe (etching depth) is formed by etching a part of the p-side contact layer 111, the p-side cladding layer 109, and the p-side light guiding layer 110, and etching the p-side light guiding layer 109 to a thickness of 0.1 μm.

Then, after formation of ridge stripe, a second protecting membrane 162 comprising a Zr oxide (mainly ZrO2) is continuously formed at a thickness of 0.5 μm on the first protecting membrane 161 and a p-side light guiding layer 109 exposed by etching.

After formation of the second protecting membrane 162, a wafer is heat-treated at 600° C. When a material other than $SiO_2$ is formed as a second protecting membrane like this, after formation of the second protecting membrane, by heat treatment at a temperature of not lower than 300° C., preferably not lower than 400° C. and not higher than a degrading temperature of a nitride semiconductor (1200° C.), the second protecting membrane becomes difficult to be solved in a material (hydrofluoric acid) for dissolving the first protecting membrane and, therefore, it is more desirable to add this step.

Then, a wafer is soaked in hydrofluoric acid to remove the first protecting membrane 161 by a lift off method. This removes the first protecting membrane 161 provided on the p-side contact layer 111, to expose a p-side contact layer. Like this, as shown in FIG. 1, the second protecting membrane (embedding layer) 162 is formed on a side of ridge stripe and sequential plane (exposed plane of the p-side light guiding layer 109).

Like this, after the first protecting membrane 161 provided on the p-side contact layer 112 is removed, as shown in FIG. 1, the p-electrode 120 comprising Ni/Au is formed on the surface of the exposed p-side contact layer 111. The p-electrode 120 has a stripe width of 100 µm and, as shown in FIG. 1, is formed over the second protecting membrane 162. After formation of the second protecting membrane 162, the stripe-like n-electrode 121 comprising Ti/Al is formed on the surface of the already exposed n-side contact layer 103 parallel with stripe.

Then, in order to provide a take out electrode in a p, n-electrode on a side exposed by etching to form an n-electrode, a desired region is masked, a dielectric multi-layered membrane 164 comprising $SiO_2$ and $TiO_2$ is provided thereon, and take out (pat) electrodes 122 and 123 comprising Ni—Ti—Au (1000 Å-1000 Å-8000 Å) are provided on a p, n-electrode, respectively. Upon this, the width of the active layer 107 is 200 µm (width in a direction vertical to a resonator direction), and a dielectric multi-layered membrane comprising $SiO_2$ and $TiO_2$ is provided on the surface of a resonator (reflective side). Like this, after the n-electrode and the p-electrode are formed, the M plane of a nitride semiconductor (M plane of GaN, such as (11-00)) is divided into bar-like in a direction vertical to a stripe-like electrode, and a bar-like wafer is further divided to obtain a laser device. Upon this, a length of a resonator is 650 µm.

Upon conversion into bar-like, cleavage is performed in a waveguide region held by etching ends, and the resulting cleaved plane may be a resonator plane. Alternatively, cleavage is performed outside a waveguide region, and an etched end may be a resonator plane. A pair of resonator planes having one plane as an etched end and other plane as a cleaved plane may be formed. In addition, a reflective membrane comprising a dielectric multi-layered membrane is provided on a resonating plane of the aforementioned etched end. Alternatively, a reflective membrane may be provided also on a resonator plane of a cleaved plane after cleavage. Upon this, as a reflective membrane, at least one selected from the group consisting of $SiO_2$, $TiO_2$, $ZrO_2$, ZnO, $Al_2O_3$, MgO and polyimide is used. Alternatively, a multi-layered membrane obtained by laminating at a thickness of $\lambda/4n$ ($\lambda$ is a wavelength, and n is a refractive index of a material) may be used, or only one layer may be used, or a reflective membrane functions also as a surface protecting membrane for preventing a resonator end from exposing. In order to function as a surface protecting membrane, a membrane is formed at a thickness of $\lambda/2n$. In addition, an etched end is not formed in a device processing step, that is, only an n-electrode forming plane (n-side contact layer) is exposed, and a laser device having a pair of cleaved planes as a resonator plane may be obtained.

Also upon further division of a bar-like wafer, a cleaved plane of a nitride semiconductor (single substrate) may be used. A nitride semiconductor (GaN) which is vertical to a cleaved plane when cleaved into bar-like may be cleaved at an M plane or an A plane ({1010}) which is approximated by hexagonal system, and a chip may be taken out. Alternatively, upon cleaved into bar-like, an A plane of a nitride semiconductor may be used.

The resulting laser device is a nitride semiconductor device which is continuously oscillated at a wavelength of 370 nm at room temperature. In addition, an n-side or p-side light guiding layer is composed of AlGaN having an Al average ratio of 0.03, and a waveguide is formed in which a difference between a band gap energy $E_g$ of a first light guiding layer and a second light guiding layer and the photon energy $E_p$ of laser light (emitting wavelength of an active layer), $E_g - E_p$, is 0.05 eV or greater.

EXAMPLE 2

According to the same manner as that of Example 1 except that an active layer is formed as described below in Example 1, a laser device is obtained.

(Active Layer 107)

A barrier layer comprising Si-doped $In_{0.01}Al_{0.1}Ga_{0.89}N$, and a well layer comprising undoped $In_{0.03}Al_{0.02}Ga_{0.95}L$ thereon are laminated in an order of barrier layer 2a/well layer 1a/barrier layer 2b/well layer 1b/barrier layer 2c. Upon this, as shown in FIG. 7, the barrier layer 2a is formed at a thickness of 200 Å, the barrier layers 2b and 2c are formed at a thickness of 40 Å, and the well layers 1a and 1b are formed at a thickness of 70 Å. An active layer 107 has a multiple quantum well structure (MQW) having a total thickness of about 420 Å.

The resulting laser device is a nitride semiconductor device which is continuously oscillated at a wavelength of 370 nm at room temperature as in Example 1.

EXAMPLE 3

According to the same manner as that of Example 1 except that an active layer, a light guiding layer and a cladding layer are formed as described below in Example 1, a laser device is obtained.

(N-Side Cladding Layer 105 (Lower Cladding Layer 25))

A procedure of alternately laminating an Å layer comprising undoped $Al_{0.3}Ga_{0.7}N$ at a thickness of 25 Å and a B layer comprising $Al_{0.2}Ga_{0.8}N$ doped with Si at $5 \times 10^{18}/cm^3$ at a thickness of 25 Å is repeated 120 times to laminate an A layer and a B layer, to form an n-side cladding layer 106 comprising a multi-layered membrane (superlattice structure) at a total thickness of 0.6 µm.

(N-Side Light Guiding Layer 106 (First Light Guiding Layer 26))

An A layer comprising Si-doped $Al_{0.1}Ga_{0.9}N$ having a thickness of 25 Å and a B layer comprising $Al_{0.03}Ga_{0.1}N$ having a thickness of 25 Å are alternately laminated 30 times to grow an n-side light guiding layer 106 comprising a superlattice multi-layered membrane having a thickness of 0.15 µm.

(Active Layer 107)

A barrier layer comprising Si-doped $Al_{0.2}Ga_{0.8}N$ and a well layer comprising undoped $In_{0.03}Al_{0.02}Ga_{0.95}N$ thereon are laminated in an order of barrier layer 2a/well layer 1a/barrier layer 2b/well layer 1b/barrier layer 2c. Upon this, as shown in FIG. 7, the barrier layer 2a is formed at a thickness of 200 Å, the barrier layers 2b and 2c are formed at a thickness of 40 Å, and the well layers 1a and 1b are formed at a thickness of 70 Å. An active layer 107 becomes a multiple quantum well structure (MQW) having a total thickness of about 420 Å.

(P-Side Light Guiding Layer 109 (Second Light Guiding Layer 29))

An A layer comprising Mg-doped $Al_{0.1}Ga_{0.9}N$ having a thickness of 25 Å and a B layer comprising $Al_{0.1}Ga_{0.9}N$ having a thickness of 25 Å are alternately laminated 30 times to grow a p-side light guiding layer 109 of a superlattice multi-layered structure having a thickness of 0.15 µm.

(P-Side Cladding Layer 110 (Upper Cladding Layer 30))

An A layer comprising undoped $Al_{0.3}Ga_{0.7}N$ is grown at a thickness of 25 Å, and a B layer comprising Mg-doped $Al_{0.1}Ga_{0.9}N$ is grown at a thickness of 25 Å, and a procedure of alternately laminating An A layer and a B layer is repeated 100 times to grow a p-side cladding layer 110 comprising a superlattice multi-layered membrane having a total thickness of 0.5 μm.

The resulting laser device is a nitride semiconductor device which is continuously oscillated at a shorter wavelength region than Example 1, a wavelength of 350 nm, at room temperature. An n-side or p-side light guiding layer is composed of AlGaN having an Al average ratio of 0.2. A waveguide is formed in which a difference between a band gap energy $E_g$ of a first light guiding layer and a second light guiding layer and a photon energy $E_p$ of laser light, $E_g-E_p$, is 0.05 eV or greater.

EXAMPLE 4

According to the same manner as that of Example 1 except that respective light guiding layers are formed as described below in Example 1, a laser device is obtained.

(N-Side Light Guiding Layer 106 (First Light Guiding Layer 26))

An n-side light guiding layer 106 comprising Si-doped $Al_{0.03}Ga_{0.97}N$ (Al average ratio of Example 1) is formed at a thickness of 0.15 μm, to provide a single membrane light guiding layer.

(P-Side Light Guiding Layer 109 (Second Light Guiding Layer 29))

A p-side light guiding layer 109 comprising Mg-doped $Al_{0.03}Ga_{0.97}N$ (Al average ratio of Example 1) is formed at a thickness of 0.15 μm, to provide a single membrane light guiding layer.

Although the resulting laser device has the same Al average ratio as compared with Example 1, there is a tendency that the crystallizing property is deteriorated due to provision of a single membrane light guiding layer. In addition, since a doping region of a light guiding layer is large, there is a tendency that the light loss occurs greatly due to impurity doping and a threshold current density is increased.

In addition, as another single membrane light guiding layer, in Example 1, a p-side light guiding layer and an n-side light guiding layer are formed of undoped $Al_{0.035}Ga_{0.965}N$ at a thickness of 75 nm to form an active layer having a single quantum well structure in which a barrier layer 2c and a well layer 1b are not provided. In the resulting laser device, since a light guiding layer is a single membrane as compared with Example 1, the crystallizing property is deteriorated. On the other hand, by adopting about half a thickness, deterioration of a device due to deterioration of the crystallizing property can be suppressed. In addition, by forming a light guiding layer undoped, a structure is obtained in which the light loss in a waveguide is suppressed. In addition, since an active layer has a single quantum well structure, by suppressing deterioration of the crystallizing property in an active layer, a laser device approximately equivalent to that of Example 1 is obtained. Here, undoped indicates that doping is not performed intentionally at growth. As described above, a p-side light guiding layer is slightly doped with Mg due to Mg diffusion from an adjacent p-side electron confining layer and p-side cladding layer. Si is slightly diffused, whereby, an n-side light guiding layer becomes undoped. In a nitride semiconductor, since a diffusion length for an n-type carrier is longer as compared with p-type, and an undoped nitride semiconductor shows n-type although high resistant due to N atom vacancy, even when converted into undoped n-side light guiding layer, carriers can be injected into an active layer.

EXAMPLE 5

According to the same manner as that of Example 1 except that a light guiding layer is formed by gradient composition as described below as shown in FIG. 4 in Example 1, a laser device is obtained.

(N-Side Light Guiding Layer 106 (First Light Guiding Layer 26))

$Al_xGa_{1-x}N$ is formed at a thickness of 0.15 μm. Upon this, an Al ratio x is changed from 0.05 to 0.01 with growing, to provide an n-side light guiding layer 106 having gradient composition in a thickness of direction. Upon this, an n-side light guiding layer is formed by Si doping at a region of a first thickness of 50 nm and is formed undoped at a remaining region of a thickness of 0.1 μm (region of 0.1 μm on an active layer side).

(P-Side Light Guiding Layer 109 (Second Light Guiding Layer 29))

$Al_xGa_{1-x}N$ is formed at a thickness of 0.15 μm. Upon this, an Al ratio x is changed from 0.01 to 0.05 with growing, to provide a p-side light guiding layer 109 having gradient composition in a thickness direction. Here, a p-side light guiding layer is formed undoped at a first thickness of 0.1 μm (region of 0.1 μm on an active layer side) and is formed by Mg doping at a remaining region of a thickness of 50 nm.

The resulting laser device has almost the same Al average ratio as compared with Example 1. However, as shown in FIG. 4, by providing a light guiding layer having gradient band gap energy, effects of injecting carriers in an active layer becomes better and the internal quantum efficacy is improved. In addition, since an undoped region is provided on a side near an active layer in a light guiding layer (active layer side), a waveguide structure is obtained in which the light loss due to impurity doping is suppressed low, and there is a tendency that a threshold current density is decreased.

EXAMPLE 6

According to the same manner as that of Example 1 except that a light guiding layer is formed by gradient composition as described below as shown in FIG. 4 in Example 5, a laser device is obtained.

(N-Side Light Guiding Layer 106 (First Light Guiding Layer 26))

An A layer comprising $Al_xGa_{1-x}N$ having a thickness of 25 Å and a B layer comprising $Al_yGa_{1-y}N$ (x>y) having a thickness of 25 Å are alternately laminated 30 times to form an n-side light guiding layer of a superlattice multi-layered structure having a thickness of 0.15 μm. Upon this, an Al ratio x is changed from 0.05 to 0.03 with growing, and an Al ratio y is constant at 0.015, to provide an n-side light guiding layer 106 having gradient composition. Upon this, in an n-side light guiding layer, both the A layer and the B layer are formed by Si doping at a first thickness of 50 nm, and only the A layer is formed by Si doping and the B layer is formed undoped in a modified doping manner at a remaining region of a thickness of 0.1 μm (region of 0.1 μm on an active layer side).

(P-Side Light Guiding Layer 109 (Second Light Guiding Layer 29))

An A layer comprising $Al_yGa_{1-x}N$ having a thickness of 25 Å and a B layer comprising $Al_yGa_{1-y}N$ (x>y) having a thickness of 25 Å are alternately laminated 30 times to form a p-side light guiding layer 109 of a superlattice multi-layered structure having a thickness of 0.15 μm. Here, in a p-side light guiding layer, the A layer is formed by Mg doping and the B layer is formed undoped at a first thickness of 0.1 μm (region of 0.1 μm on an active layer side), and both the A layer and the B layer are formed by Mg doping at a remaining region of a thickness of 50 nm.

The resulting laser device has almost the same Al average ratio as compared with Example 4. However, the crystallizing property becomes better due to superlattice structure and the device properties are improved. On the other hand, since an undoped region for a light guiding layer is small as compared with Example 4, there is a tendency that the light loss becomes larger and a threshold current density is slightly increased.

EXAMPLE 7

Figure 8:
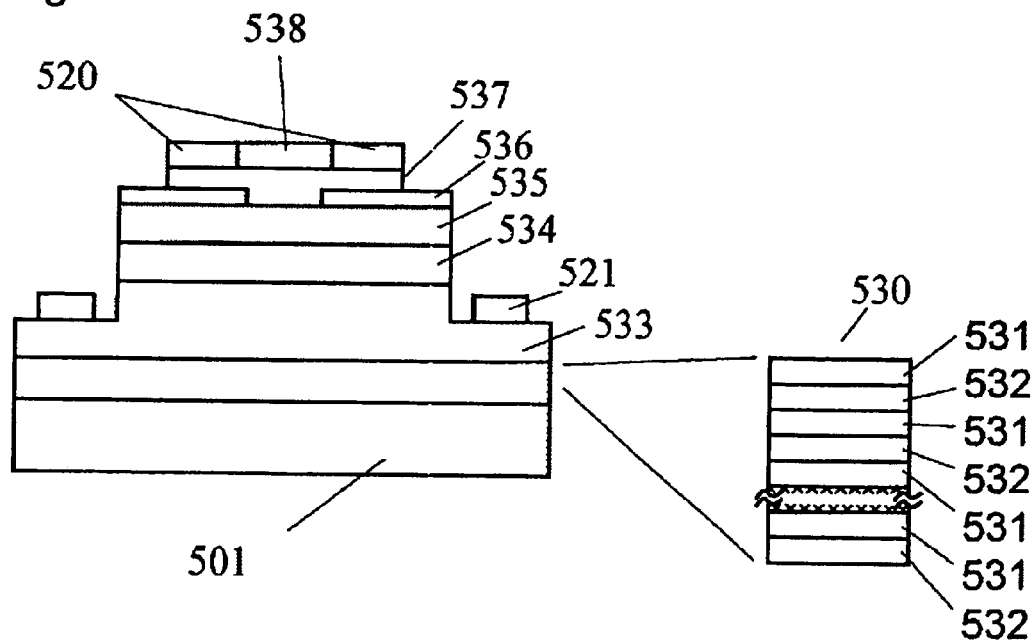
FIG. 8 is a schematic cross-sectional view explaining a device structure according to one embodiment of the present invention.

An end emitting laser device shown in FIG. 8 will be explained below.

(Substrate 501)

The same substrate 501 as the nitride semiconductor substrate 101 used in Example 1 is used.

Each three layers of a first layer 531 comprising $Al_xGa_{1-x}N$ ($0 \leq x \leq 1$) and a second layer 532 comprising $Al_yGa_{1-y}N$ ($0 < y \leq 1$, x<y) having a different composition from that of the first layer are alternately laminated as a reflective membrane 530 on the nitride semiconductor substrate 501. Upon this, respective layers are provided at such a thickness that satisfies an equation: $\lambda/(4n)$ ($\lambda$ is a light wavelength, and n is a refractive index of a material). As a reflective membrane of a nitride semiconductor, a multi-layered membrane in which first and second layers and a nitride semiconductor represented by $Al_xGa_{1-x}N$ ($0 \leq x \leq 1$) having a different composition are alternately laminated, may be used. Upon this, one or more of respective layers, and one or more pairs of first layer/second layer may be formed. Specifically, first layer/second layer may be formed of AlGaN/AlGaN, GaN/AlGaN, AlGaN/AlN, GaN/AlN or the like. In the case of $Al_xGa_{1-x}N/Al_yGa_{1-y}N$ (0<x, x<y<1), since it is an AlGaN multi-layered membrane, a difference in a thermal expansion coefficient can be rendered small and it can be formed with the better crystallizing property. In the case of GaN/$Al_yGa_{1-y}N$ (0<y<1), a multi-layered membrane having the improved crystallizing property can be obtained due to a GaN layer. In addition, when a difference in an Al ratio (y−x) is rendered large, a difference in a refractive index between the first layer and the second layer becomes large and a reflective rate becomes high. Specifically, adopting y−x≧0.3, preferably y−x≧0.5, a multi-layered reflective membrane having a high reflective rate can be formed. In addition, as in Example 1, by forming $Al_yGa_{1-y}N$ ($0<y \leq 1$) as a multi-layered membrane, it functions as a buffering layer 102, and the pit reducing effects can be obtained. In addition, a reflective membrane can be provided between a substrate and an active layer, or on an active layer. The aforementioned dielectric multi-layered membrane can be applied to a reflective membrane on an active layer. Further, it can be applied to an end emitting light emitting device in which a reflective membrane is divided between a substrate and an active layer.

Subsequently, under the same conditions as those of Example 1, an n-side contact layer 533, an active layer 534, a p-side electron confining layer (not shown) and a p-side contact layer 535 are laminated to provide a block layer 536 comprising $SiO_2$ having a circular opening. Mg-doped GaN is grown from the circular opening to form a second p-side contact layer 537. Upon this, either of a p-side contact layer 535 or a second p-side contact layer 537 may be formed. A dielectric multi-layered membrane comprising $SiO_2/TiO_2$ is formed on the second p-side contact layer 537 to obtain a reflective membrane 538, which is provided on an opening of the aforementioned block layer 536 in the circular shape. And, etching is performed to such a depth that the n-side contact layer 533 is exposed, and a ring-like n-electrode 521 is formed on the exposed n-side contact layer 533, and a p-electrode 520 surrounding the reflective membrane 538 is formed on the second p-side contact layer 537, respectively. An end emitting laser device thus obtained is a laser device which is oscillated at a short wavelength as in Example 1.

EXAMPLE 8

According to the same manner as that of Example 1 except that a cladding layer, a light guiding layer and an active layer are formed as described below in Example 1, a laser device having a device structure is obtained.

As upper and lower cladding layers, $Al_{0.1}Ga_{0.9}N$ having a thickness of 25 Å and $Al_{0.05}Ga_{0.95}N$ having a thickness of 25 Å are alternately laminated 100 times to obtain a superlattice multi-layered structure (500 Å). Upon this, in p-side and n-side cladding layers, one of a superlattice layer is doped with Mg and Si as a dopant, respectively.

As upper and lower light guiding layers, undoped $Al_{0.04}Ga_{0.96}N$ is formed at a thickness of 0.15 μm.

A barrier layer comprising $Al_{0.15}In_{0.01}Ga_{0.84}N$ (200 Å), a well layer having a thickness of 100 Å and a barrier layer comprising $Al0.15In_{0.01}Ga_{0.84}N$ (45 Å) are laminated as an active layer to obtain a quantum well structure.

Dependency of an Al crystal mixing ratio x (x=0.03, 0.06, 0.08) shown in FIG. 10 shows a threshold current density and a change in a wavelength under pulse oscillation using $Al_xIn_{0.04}Ga_{0.96-x}N$ as a well layer. Dependency of an In crystal mixing ratio y (y=0.02, 0.03, 0.04, 0.07) shown in FIG. 11 shows a threshold current density and a change in a wavelength under pulse oscillation using $Al_{0.03}In_yGa_{0.97-y}N$.

As shown in FIG. 11, in a threshold current density $J_{th}$, as an In crystal mixing ratio y grows larger from around 0.02, a falling curve is shown, a minimum value is seen in a range of 0.03 to 0.05 and, in a region exceeding 0.05, an increasing tendency is shown. In addition, regarding an Al crystal mixing ratio x, as shown in FIG. 10, in a range of x≦0.1, there is an increasing tendency with increase in an Al crystal mixing ratio x and, in a range of 0<x≦0.6, a threshold current can be preferably decreased.

EXAMPLE 9

The details of a structure of a ridge-type nitride semiconductor laser shown in FIG. 1 are explained below.

A n-type contact layer 103, a crack preventing layer 104, a n-type cladding layer 105 and a n-type light guiding layer 106 which are a n-type nitride semiconductor layer, are formed on a substrate 101 via a buffering layer 102. Other layers except for a n-type cladding layer 105 can be omitted depending upon a device. It is necessary that a n-type nitride semiconductor layer has the wider band gap than that of an active layer at least its part in contact with an active layer. For this reason, a composition containing Al is preferable. In addition, each layer may be a n-type by grown while doping with n-type impurity, or may be n-type grown undoped.

An active layer 107 is formed on n-type nitride semiconductor layers 103~106. As described above, an active layer 107 has a MQW structure in which an $Al_{x1}Ga_{1-x2}N$ well layer ($0 \leq x1 < 1$) and an $Al_{x2}Ga_{1-x2}N$ barrier layer ($0 < x2 < 1$, $x1 < x2$) are repeatedly laminated alternately suitable times, and there are a barrier layer at both ends of an active layer. A well layer is formed undoped, and all barrier layers are doped with n-type impurity such as Si, Sn or the like preferably at the concentration of $1 \times 10^{17} \sim 1 \times 10^{19}$ cm$^{-3}$.

A final barrier layer is formed undoped, and contains p-type impurity such as Mg or the like diffused from a p-type electron confining layer 108 which is to be grown next, at the concentration of $1 \times 10^{16} \sim 1 \times 10^{19}$ cm$^{-3}$ in some cases. A final barrier layer may be grown while doping with p-type impurity such as Mg or the like at the concentration of $1 \times 10^{19}$ cm$^{-3}$ or smaller. Like other barrier layers, a final barrier layer may be doped with n-type impurity such as Si.

A p-type electron confining layer 108, a p-type light guiding layer 109, a p-type cladding layer 110 and a p-type contact layer 111 as a p-type nitride semiconductor layer are formed on a final barrier layer. Other layers except for a p-type cladding layer may be omitted depending upon an device. It is necessary that a p-type nitride semiconductor layer has the wider band gap than that of an active layer at least at its part in contact with an active layer. For that reason, a composition containing Al is preferable. Each layer may be rendered a p-type by growing while doping with p-type impurity, or may be rendered p-type by diffusing p-type impurity from an adjacent other layer.

A p-type electron confining layer 108 comprises a p-type nitride semiconductor having a higher Al crystal mixing ratio than that of a p-type cladding layer 110, and preferably has a composition of $Al_xGa_{1-x}N$ ($0.1 < x < 0.5$). In addition, the layer 108 may be doped with p-type impurity such as Mg or the like at the high concentration, preferably at the concentration of $5 \times 10^{17} \sim 1 \times 10^{19}$ cm$^{-3}$. Whereby, a p-type electron confining layer 108 can effectively confine electrons into an active layer, leading to decrease in a threshold for laser. In addition, a p-type electron confining layer 108 may be grown at a thickness of around 30~200 Å and, when a thickness is smaller a layer 108 may be grown at a lower temperature than that for a p-type light guiding layer 109 or a p-type light cladding layer 110.

In addition, a p-type electron confining layer 108 plays a role in supplying p-type impurity to a final barrier layer grown in undoped by diffusion. Both cooperate to protect an active layer 107 from degrading and, at the same time, may have a role in enhancing the efficacy for injecting holes into an active layer 107.

Among p-type nitride semiconductor layers, ridge stripe is formed to a mid way of a p-type light guiding layer 109, and protecting membranes 161 and 162, a p-type electrode 120, a n-type electrode 121, a p-pat electrode 121 and n-pat electrode 123 are formed to construct a semiconductor laser.

The present Example has same structure and manufacturing process as in Example 1, the composition of the quantum well layer in the active layer 107 is changed into ternary material of AlGaN as below in order to set a oscillation wavelength (366 nm) shorter than the oscillation wavelength (370 nm) of Example 1. Further, each composition of the n-side cladding layer 105, the n-side light guiding layer 106, the p-side light guiding layer 109 and the p-side cladding layer 110 is also changed as follows.

(N-Side Cladding Layer 105: Lower Cladding Layer 25)

Then, a temperature is risen to 1050° C., TMA, TMG and ammonia as a raw material gas, and silane gas as impurity gas are used to grow an A layer comprising $Al_{0.05}Ga_{0.95}N$ doped with Si at $5 \times 10^{18}$/cm$^3$ at a thickness of 25 Å. Subsequently, the impurity gas is stopped. A B layer comprising undoped $Al_{0.1}Ga_{0.9}N$ is grown at a thickness of 25 Å. Then, this procedure is repeated 100 times to laminate an A layer and a B layer to grow a n-type cladding layer 106 comprising a multi-layered membrane (superlattice structure). Upon this, when an Al crystal mixing ratio for undoped AlGaN is in a range of not less than 0 05 and not greater than 0.3, a difference in a refractive index which functions sufficiently as a cladding layer can be set.

(N-Side Light Guiding Layer 106: Lower Light Guiding Layer 26)

Then, at the same temperature, TMA, TMG and ammonia as a raw material gas are used to grow a n-type light guiding layer 106 comprising undoped $Al_{0.05}Ga_{0.95}N$ at a thickness of 0.15 μm. Alternatively, n-type impurity may be doped therein. This layer serves as a first nitride semiconductor layer.

(Active Layer 107 (27, 12))

Then, at the same temperature, TMA, TMG and ammonia as a raw material gas, and silane gas as impurity gas are used to laminate a barrier layer (first barrier layer 2a) comprising $Al_{0.15}Ga_{0.85}N$ doped with Si at $5 \times 10^{18}$/cm$^3$ (B) at a thickness of 100 Å and, after stoppage of TMA and silane gas, a well layer comprising undoped GaN (W) at a thickness of 100 Å and, as a final barrier layer (second barrier layer 2b), undoped $Al_{0.15}Ga_{0.85}N$ at a thickness of 45 Å in an order of (B)/(W)/(B). An active layer 107 may be rendered a multiple quantum well structure (MQW) by repeating lamination in an order of (B)/(W)/(B).

(P-Side Light Guiding Layer 109: Upper Light Guiding Layer 29)

Then, a temperature is maintained at 1050° C., TMA, TMG and ammonia as a raw material gas are used to grow a p-side light guiding layer 109 comprising undoped $Al_{0.05}Ga_{0.95}N$ at a thickness of 0.15 μm. This p-type light guiding layer 109 is grown undoped, and the layer 109 has the Mg concentration of $5 \times 10^{16}$/cm$^3$ by diffusion of Mg from an adjacent layer such as a p-type electron confining layer 108, a p-type cladding layer 110 and the like, indicating p-type. Alternatively, this layer may be intentionally doped with Mg at growth. This layer serves as a second nitride semiconductor layer (P-Side Cladding Layer 110: Upper Cladding Layer 30)

Subsequently, TMA is stopped, Cp$_2$Mg is to grow a layer comprising Mg-doped $Al_{0.05}Ga_{0.95}N$ at a thickness of 25 Å at 1050° C. Subsequently, Cp$_2$Mg is stopped, and a layer comprising undoped $Al_{0.10}Ga_{0.90}N$ is grown at a thickness of 25 Å. This is repeated 100 times to grow a p-type cladding layer 115 comprising a superlattice layer having a total thickness of 0.45 μm. When made of a superlattice in which at least one of p-type cladding layers comprises a nitride semiconductor layer containing Al, and nitride semiconductor layers having a different band gap energy, any one of layers is doped with impurity at a greater amount to effect so-called modified doping, whereby, there is a tendency that the crystallizing property becomes better. Alternatively, both layers may be doped in the same manner. Since an Al crystal mixing ratio for a hole cladding layer can be increased by allowing a p-side cladding layer 110 to have a superlattice structure, a refractive index of a cladding layer itself is decreased and, further, the band gap energy is increased, being very effective in decreasing a threshold, further, superlattice decreases pit produced in a cladding layer itself as compared with no superlattice, reducing occurrence of short circuit.

A continuously oscillating laser device having a threshold current of 53 mA, a current density of 3.5 kA/cm$^2$ and an oscillating wavelength of 366 nm at room temperature is obtained.

EXAMPLE 10

The present Example is as same as Example 9 except that an active layer is described below, a laser device is obtained.

(Active Layer 107 (27, 12))

An active layer having a single quantum well structure used is obtained by laminating a first barrier layer 2a comprising Si-doped $Al_{0.15}Ga_{0.85}N$ having a thickness of 200 Å, a well layer 1b comprising undoped GaN having a thickness of 100 Å and a second barrier layer 2b comprising undoped $Al_{0.15}Ga_{0.85}N$ having a thickness of 45 Å successively.

The resulting laser device has a tendency that the crystallizing property of a well layer is deteriorated due to increase in a thickness of a first barrier layer, and there is a tendency that threshold current $J_{th}$ is increased to 100 mA.

EXAMPLE 11

The present Example is as same as Example 9 except that an active layer is described below, a laser device is obtained.

(Active Layer 27)

An active layer having a single quantum well structure used is obtained by laminating a first barrier layer 2a comprising Si-doped $Al_{0.15}Ga_{0.85}N$ having a thickness of 100 Å, a well layer 1b having a thickness of 100 Å and a second barrier layer 2b comprising undoped $Al_{0.15}Ga_{0.85}N$ having a thickness of 150 Å successively.

The resulting laser device has a tendency that Vf is increased due to increase in a thickness of a second barrier layer as compared with Example 1, and there is a tendency that a threshold current $J_{th}$ is increased to 100 Ma. Here, a structure is obtained in which a second barrier has a greater thickness (100 Å or greater) than that of a first barrier layer, a p-side electron confining layer in the vicinity of a p-n junction has high resistance, and a layer producing the great heat is isolated from a well layer with a second barrier layer, whereby, influence of a second barrier layer can be increased and, on the other hand, increase in resistance due to a second barrier layer is influenced.

EXAMPLE 12

The present Example is as same as Example 9 except that an active layer is described below, a laser device is obtained.

(Active Layer 27)

An active layer having a single quantum well structure used is obtained by laminating a first barrier layer 2a comprising Si-doped $Al_{0.05}Ga_{0.95}N$ having a thickness of 100 Å, a well layer 1b comprising undoped GaN having a thickness of 100 Å and a second barrier layer 2b comprising undoped $Al_{0.05}Ga_{0.95}N$ having a thickness of 150 Å successively.

The resulting laser device has a tendency that, since an Al crystal mixing ratio in a first barrier layer and a second layer is rendered smaller, the band gap energy is rendered smaller, and a difference in the band gap energy from a well layer is rendered smaller as compared with Example 1, confinement of carriers into a well layer is deteriorated, and a threshold current $J_{th}$ is increased to 200 mA. Here, a difference in an Al crystal mixing ratio between a well layer and a barrier layer (first barrier layer), $X_{B1}-X_W$ is 0.05. By using this Al crystal mixing ratio difference as a boundary and increasing a difference in an Al crystal mixing ratio between a barrier layer and a well layer, there is a tendency that a threshold is decreased.

EXAMPLE 13

Figure 6A:
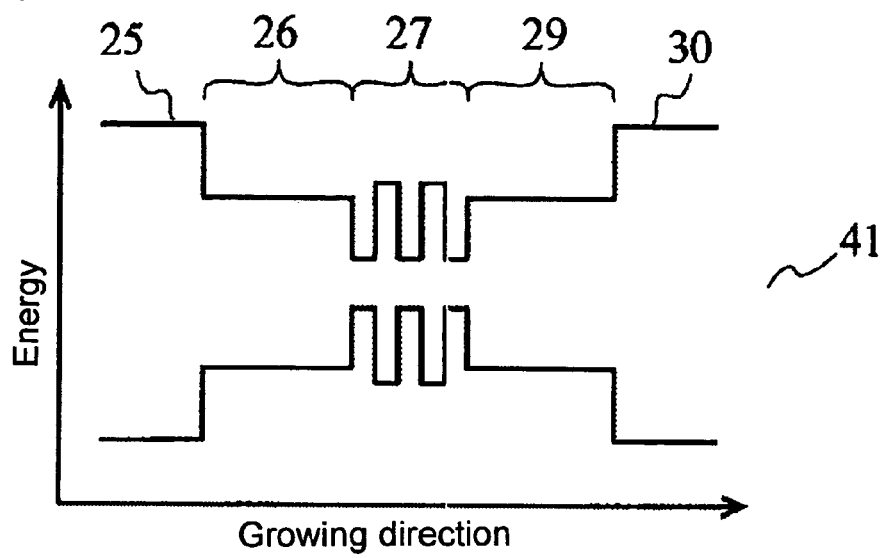
FIG. 6A is a schematic view explaining an energy band according to one embodiment of the present invention.
Figure 6B:
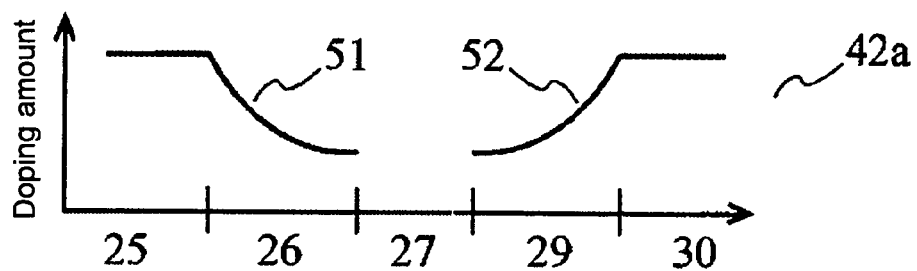
FIGS. 6B to 6D show change in a doping amount of each electrically conductive-type impurity (dopant).
Figure 6C:
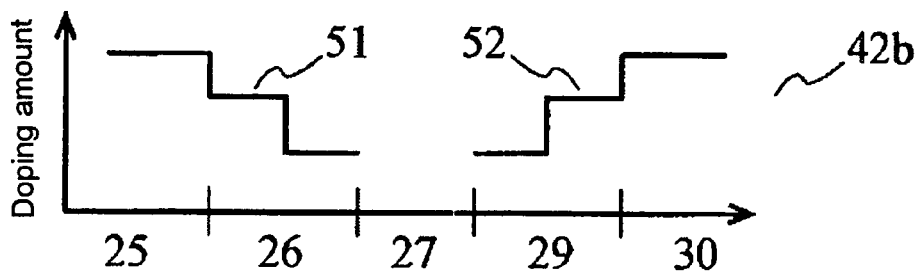
Figure 6D:
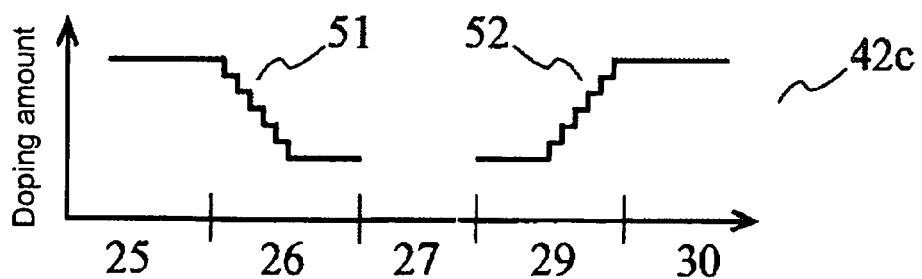

The present Example is as same as Example 9 except that a light guiding layer is formed by gradient ratio as described below as shown in FIG. 6B, a laser device is obtained.

(N-Side Light Guiding Layer 106 (First Layer Guiding Layer 26))

By forming $Al_xGa_{1-x}N$ at a thickness of 0.15 µm and, upon this, varying an Al ratio x from 0.1 to 0.02 as growing, that is, as approaching an active layer, a n-side light guiding layer 106 having a gradient ratio in a thickness direction is provided. Upon this, a n-side light guiding layer is formed by Si doping at a first region of a thickness of 50 nm and formed undoped at a remaining region of a thickness of 0.1 µm (region of a thickness of 0.1 µm on an active layer side). Here, in a light guiding layer in the vicinity of an active layer, a part region having the smaller band gap energy than that of a first barrier layer becomes a first nitride semiconductor layer.

(P-Side Light Guiding Layer 109 (Second Light Guiding Layer 29))

By forming $Al_xGa_{1-x}N$ at a thickness of 0.15 µm and, upon this, varying an Al ratio x from 0.02 to 0.1 with growing to form a ratio gradient in a thickness direction, a p-side light gradient layer 109 is provided in which an Al crystal mixing ratio becomes smaller and the band gap energy becomes smaller as approaching an active layer. Here, a p-side light guiding layer is formed undoped at a first region of a thickness of 0.1 µm (region of a thickness of 0.1 µ m on an active layer side) and is formed by doping with Mg at a remaining region of a thickness of 50 nm. Upon this, in a p-side light guiding layer 29 in the vicinity of an active layer and a p-side electron confining layer, a part region having a smaller Al crystal mixing ratio and band gap energy than those of a second barrier layer becomes a second nitride semiconductor layer.

The resulting laser device has approximately the same Al average ratio as compared with Example 1. However, as shown in FIG. 4, by provision of a light guiding layer having gradient band gap energy, there is a tendency that the efficacy of injecting carriers into an active layer becomes better and the internal quantum efficacy is improved. In addition, since an undoped region is provided on a side near an active layer (active layer side) in a light guiding layer, a waveguide structure is obtained by which the light loss due to impurity doping is suppressed low, and, there is a tendency that a threshold current density is decreased.

EXAMPLE 14

The present Example is as same as Example 9 except that a light guiding layer is formed by gradient ratio as described below as shown in FIG. 6B, a laser device is obtained.

(N-side Light Guiding Layer 106 (First Light Guiding Layer 26))

An A layer comprising $Al_xGa_{1-x}N$ having a thickness of 25 Å and a B layer comprising $Al_yGa_{1-y}N$ (x>y) having a thickness of 25 Å are laminated alternately 30 times to form a n-side light guiding layer of a superlattice multi-layered structure having a thickness of 0.15 µm. Upon this, by changing an Al ratio x in an A layer from 0.05 to 0.03 and rendering an Al ratio y in a B layer constant at 0.015 with growing, a n-side light guiding layer 106 having a gradient composition is provided. Upon this, in a n-side light guiding layer, at a first region having a thickness of 50 nm, an A layer and a B layer are both formed by Si doping and, at a remaining region having a thickness of 0.1 µm (a region on an active layer side having a thickness or 0.1 µm), only an A layer is doped with Si and a B layer is formed undoped in a modified doping manner. Here, a n-side light guiding layer has smaller band gap energy and Al crystal mixing ratio than those of a first barrier layer in an active layer, resulting in a first nitride semiconductor layer.

(P-Side Light Guiding Layer 109 (Second Light Guiding Layer 29))

an A layer comprising $Al_xGa_{1-x}N$ having a thickness of 25 Å and a B layer comprising $Al_yGa_{1-y}N$ (x>y) are laminated alternately 30 times to form a p-side light guiding layer 109 of a superlattice multi-layered structure having a thickness of 0.15 µm. Upon this, by changing an Al ratio x in an A layer from 0.03 to 0.05 and rendering an Al ratio y in a B layer constant at 0.015 with growing, a p-side light guiding layer 109 having a gradient composition is provided in which the band gap energy grows greater and an Al average ratio grows greater as going away from an active layer and a p-side electron confining layer 108. Here, in a p-side light guiding layer, at a first region having a thickness of 0.1 µm (region on an active layer side having a thickness of 0.1 µm), only an A layer is doped with Mg and a B layer is formed undoped, at a remaining region having a thickness of 50 nm, both an A layer and B layer are doped with Mg. Here, in a multi-layered membrane in which an A layer and a B layer are laminated periodically, only one of layers has a gradient composition. Alternatively, both layers may have a gradient composition.

The resulting laser device has approximately the same Al average ratio as compared with Example 13. However, the crystallizing property becomes better due to a superlattice structure and the device property is improved. On the other hand, since an undoped region in a light guiding layer is smaller as compared with Example 13, there is a tendency that the light loss is increased and a threshold current density is slightly increased.

COMPARATIVE EXAMPLE 1

A laser device is manufactured which has a structure in which a light guiding layer has the greater band gap energy than that of a well layer and a barrier layer in an active layer as shown in FIG. 14A, and an Al crystal mixing ratio in a light guiding layer is greater than that of an active layer and, further, an Al crystal mixing ratio in a cladding layer is greater than that of a light guiding layer as shown in FIG. 16. According to the same manner as that of Example 9 except that a light guiding layer and a cladding layer are as described below in Example 9, a laser device is obtained.

(N-Side Cladding Layer [Lower Cladding Layer 25])

An A layer comprising Si-doped n-type $Al_{0.17}Ga_{0.83}N$ having a thickness of 25 Å and a B layer comprising Si-doped N-type $Al_{0.20}Ga_{0.75}N$ having a thickness of 25 Å are laminated alternately 100 times to form a superlattice multi-layered cladding layer.

(N-Side Light Guiding Layer [Lower Light Guiding Layer 26])

Undoped $Al_{0.17}Ga_{0.8}N$ is formed at a thickness of 0.15 µm.

(P-Side Light Guiding Layer [Upper Light Guiding Layer 29)]

Undoped $Al_{0.17}Ga_{0.8}N$ is formed at a thickness of 0.15 µm.

(P-Side Cladding Layer [Upper Cladding Layer 30])

An A layer comprising Mg-doped p-type $Al_{0.2}Ga_{0.8}N$ having a thickness of 25 Å and a B layer comprising Mg-doped p-type $Al_{0.25}Ga_{0.75}N$ having a thickness of 25 Å are repeatedly laminated alternately 100 times to form a superlattice multi-layered cladding layer.

Crack is produced throughout the resulting laser device and the laser device can not operate. In addition, even when the device can operate, a leaking current due to deterioration of the crystallizing property is produced much and, thus, laser oscillation can not be obtained.

EXAMPLE 15

A light emitting device 200 of the present invention will be explained by referring to FIGS. 15A and 15B. Here, as shown by 200b, a light emitting device having a structure in which one pair of a positive electrode and a negative electrode are provided on the same side of a substrate is manufactured.

A substrate 201 composed of sapphire (C plane) is set in a reactor for MOVPE, and a temperature of a substrate is risen to 1050° C. while hydrogen is flowing, to clean a substrate.

Buffering layer (not shown): subsequently, a low temperature-growing buffering layer comprising GaN is grown on a substrate 1 at a thickness of about 100 Å. This low temperature-growing layer is grown at a lower temperature as compared with a layer to be grown next, whereby, lattice incompatibility with a substrate is alleviated, and this low temperature growing can be omitted depending upon a kind of substrate.

Ground layer (not shown): after growth of a buffering layer, an undoped GaN layer is grown at a thickness of 1.5 µm at a temperature of 1050° C. This layer is grown as an undoped layer and serves as a ground layer for a device structure to be formed thereon and functions as a growing substrate.

N-type contact layer 202: subsequently, a n-type contact layer (electron injecting layer) 202 comprising $Al_{0.05}Ga_{0.95}N$ doped with Si at $4.5×10^{18}/cm^3$ is grown at a thickness of 2 µm at 1050° C. Here, a n-side contact layer 202 serves as a first nitride semiconductor layer.

Active layer 203: a barrier layer (first barrier layer 2A) comprising undoped $Al_{0.15}Ga_{0.85}N$ is grown at a thickness of 100 Å and subsequently, a well layer comprising undoped $Al_{0.05}Ga_{0.95}N$ is grown at a thickness of 30 Å. Subsequently, an internal barrier layer (not shown) comprising $Al_{0.1}Ga_{0.9}N$ having a thickness of 30 Å is grown, four layers of a well layer (not shown) and three layers of an internal barrier layer (not shown) are laminated alternately and, finally, $Al_{0.15}Ga_{0.85}N$ as a second barrier layer 2b is grown at a thickness of 40 Å to grow an active layer 203 of a multiple quantum well structure having a total thickness of 380 Å. As shown in FIG. 14B, this active layer has a structure in which an internal barrier layer (such as 2b) having smaller Al crystal mixing ratio and band gap energy than those of a first barrier layer 2a and a second barrier layer 2b is formed.

P-side cladding layer 204: An A layer 204 comprising undoped $Al_{0.2}Ga_{0.8}N$ is grown at a thickness of 40 Å and subsequently, a B layer 205 comprising $Al_{0.05}Ga_{0.95}N$ doped with Mg at $5 \times 10^{19}/cm^3$ is grown at a thickness of 25 Å. These procedures are repeated to laminate each five layers of an A layer and a B layer in this order and, finally, an A layer is grown at a thickness of 40 Å to obtain a multi-layered superlattice structure. Thus, a p-side multi-layered cladding layer 204 comprising such the multi-layered membrane is grown at a thickness of 365 Å. Upon this, a first B layer has smaller band gap energy than that of a second barrier layer, and serves as a second nitride layer having a small Al crystal mixing ratio.

P-side contact layer 205: Subsequently, a p-type contact layer 205 comprising GaN doped with Mg at $1 \times 10^{20}/cm^3$ is grown at a thickness of 200 Å.

After completion of the reaction, a temperature is dropped to room temperature, and a wafer is annealed at 700° C. in the nitrogen atmosphere in a reactor, to make a p-type layer less resistant.

Figures 15A, 15B:
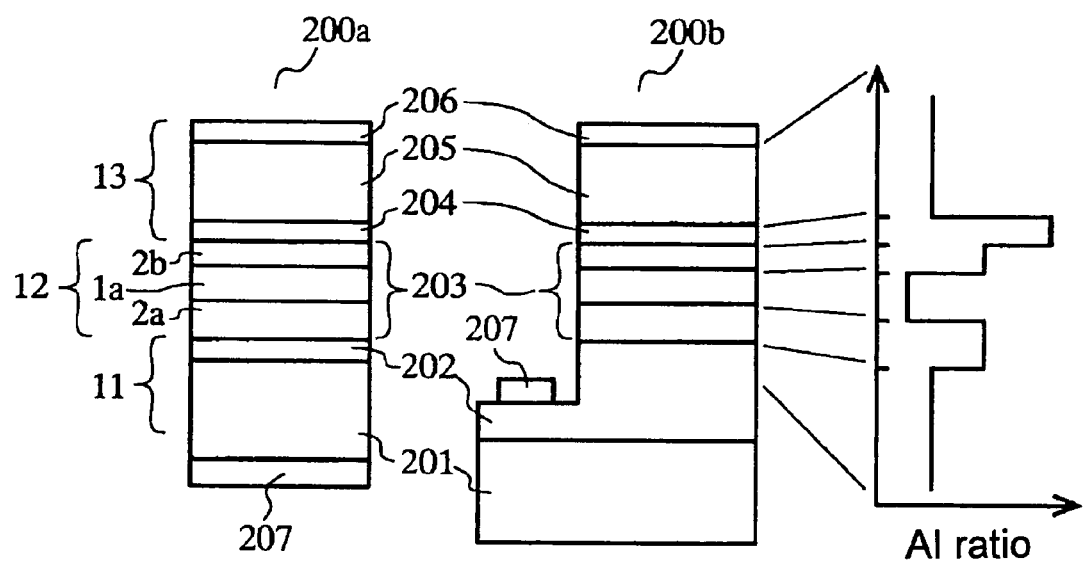
FIG. 15A is a schematic cross-sectional view explaining a laminated structure of a light emitting device relating to one embodiment of the present invention and FIG. 15B is a view explaining the relationship between each layer and an Al ratio.

After annealing, a wafer is removed from a reactor, a mask having a prescribed shape is formed on the surface of an uppermost p-side contact layer 205, etching is performed from a p-side contact layer 205 with RIE (reactive ion etching) apparatus to expose the surface of a n-side contact layer 202 as shown in FIG. 15A.

After etching, a light-transmittable p-electrode 206 containing Ni and Au having a thickness of 200 Å is formed on almost all the side of an uppermost p-side contact layer 205, and a p-pad electrode (not shown) comprising Au for bonding is formed on the p-electrode 206 at a thickness of 0.5 μm. On the other hand, a n-electrode 207 containing W and Al is formed on the surface of a n-side contact layer 202 exposed by etching, to obtain LED device.

This LED device indicates ultraviolet emitting at a wavelength of 355 nm. In particular, by provision of the aforementioned first nitride semiconductor layer, an active layer can be formed with the better crystallizing property and a light emitting device excellent in the emitting property is obtained.

INDUSTRIAL APPLICABILITY

Effect of the Invention

A nitride semiconductor device of the present invention can afford an active layer and a waveguide structure which can be laser-oscillated at a short wavelength region of 380 nm or shorter. In particular, in a well layer of InAlGaN, by adopting an In crystal mixing ratio in a range of 0.02 to 0.05, preferably 0.03 to 0.05 and changing an Al ratio to form a forbidden band having a desired emitting wavelength, whereby, a light emitting device and a laser device having a short wavelength region can be obtained and a device excellent in the internal quantum efficacy and the emitting efficacy can be obtained.

In addition, a nitride semiconductor device of the present invention can afford a light emitting device and a laser device of a shorter wavelength of 375 nm or shorter which have a low threshold current. Therefore, a light emitting diode in combination with a prescribed fluorescent body can provide a substitute for a fluorescent lamp. On the other hand, a laser device shows excellent FWHM and can afford excellent resolution and, as a result, it is useful as a photo-lithography device.

What is claimed is:

1. A nitride semiconductor device comprising an active layer provided between a first electrically conductive type of layer and a second electrically conductive type of layer, wherein said active layer has a quantum well structure including at least a well layer formed of a nitride semiconductor containing In and Al, and a barrier layer formed of a nitride semiconductor containing Al, wherein an emitting wavelength of said active layer is 380 nm or shorter, and said device has a laser device structure in which said first electrically conductive type of layer has a first light guiding layer, said second electrically conductive type of layer has a second light guiding layer, and said active layer is provided between said first light guiding layer and said second light guiding layer, and the band gap energies $E_g$ of both said first light guiding layer and said second light guiding layer are greater than the photon energy $E_p$ of laser light by 0.05 eV or greater ($E_g - E_p \geq 0.05$ eV).

2. The nitride semiconductor device according to claim 1, wherein said well layer is formed of $Al_xIn_yGa_{1-x-y}N$ ($0 < x \leq 1$, $0 < y \leq 1$, $x+y<1$) and said barrier layer is formed of $Al_uIn_vGa_{1-u-v}N$ ($0 < u \leq 1$, $0 \leq v \leq 1$, $u+v<1$).

3. The nitride semiconductor device according to claim 2, wherein a thickness of said well layer is smaller than that of the barrier layer.

4. The nitride semiconductor device according to claim 3, wherein an In composition ratio y in said well layer is in a range of not less than 0.02 and not greater than 0.05.

5. The nitride semiconductor device according to claim 3, wherein an In composition ratio y in said well layer is in a range of not less than 0.03 and not greater than 0.05.

6. The nitride semiconductor device according to claim 1, wherein said first light guiding layer and/or said second light guiding layer are formed of $Al_xGa_{1-x}N$ ($0 \leq x \leq 1$).

7. The nitride semiconductor device according to claim 4, wherein said active layer emits light of wavelength of 380 nm or shorter, and said first electrically conductive type of layer and/or said second electrically conductive type of layer are formed of $Al_xGa_{1-x}N$ ($0 < x \leq 1$).

8. A nitride semiconductor device having an active layer between a first electrically conductive type of layer and a second electrically conductive type of layer, wherein said active layer has a quantum well structure including at least a well layer formed of a nitride semiconductor containing Al, and a first barrier layer formed of a nitride semiconductor having a band gap energy larger than that of the well layer in a side near to the first electrically conductive type of layer from the well layer, and said first electrically conductive type of layer includes a first nitride semiconductor layer having a band gap energy smaller than that of said first barrier layer, and said first nitride semiconductor layer is provided near said first barrier layer, wherein said device is operable to oscillate light of wavelength of 375 nm or shorter, an $Al_xGa_{1-x}N$ quantum well layer ($x \geq 0$) is provided between barrier layers which are formed of $Al_yIn_zGa_{1-y-z}N$ ($z \geq 0$), and a band gap energy $E_w$ of the well layer is larger than a band gap energy $E_b$ of the barrier layer by 0.2 eV or greater, and said device has a SCH structure in which a light guiding layer and a cladding layer are provided apart from each other, and the band gap energy $E_g$ of the guiding layer is greater than the photon energy $E_p$ at oscillation by 0.05 eV.

9. The nitride semiconductor device according to claim 8, wherein said first barrier is arranged in a side nearest to the first electrically conductive type of layer within the active layer, and said first nitride semiconductor layer is contacted with the active layer.

10. The nitride semiconductor device according to claim 9, wherein said first electrically conductive type of layer is of n-type, and said second electrically conductive type of layer is of p-type.

11. The nitride semiconductor device according to claim 10, wherein an Al crystal mixing ratio $X_{B1}$ in said first barrier layer and an Al crystal mixing ratio $X_w$ in the well layer satisfy the following relation: $X_{B1}-X_W \geq 0.05$.

12. The nitride semiconductor device according to claim 11, wherein a thickness of said first barrier layer is 30 Å or greater.

13. The nitride semiconductor device according to claim 12, wherein a waveguide is constructed of a pair of light guiding layers and an active layer therebetween, and the light guiding layer is provided in the first electrically conductive type of layer, and has said first nitride semiconductor layer.

14. The nitride semiconductor device according to claim 8, wherein a thickness of the well layer is 300 Å or smaller.

15. The nitride semiconductor device according to claim 14, wherein a thickness of the barrier layer is 300 Å or smaller.

16. The nitride semiconductor device according to claim 8, wherein the light guiding layer comprises an $Al_aGa_{1-a}N/Al_bGa_{1-b}N$ (a≠b) superlattice layers.

17. The nitride semiconductor device according to claim 16, wherein the cladding layer comprises an $Al_cGa_{1-c}N/Al_dGa_{1-d}N$ (c≠d) superlattice layers, and the band gap energy $E_c$ of the cladding layer is greater than that of the light guiding layer.

18. The nitride semiconductor device according to claim 15, wherein said device has a GRIN structure in which a light confining layer with a stepwise varying refractive index is formed outside the quantum well layer, and non-doped layers are provided above and below the active layer.

19. A nitride semiconductor device having an active layer between a first electrically conductive type of layer and a second electrically conductive type of layer, wherein said active layer has a quantum well structure including at least a well layer formed of a nitride semiconductor containing Al, and a first barrier layer formed of a nitride semiconductor having a band gap energy larger than that of the well layer in a side near to the first electrically conductive type of layer from the well layer, and said first electrically conductive type of layer includes a first nitride semiconductor layer having a band gap energy smaller than that of said first barrier layer, and said first nitride semiconductor layer is provided near said first barrier layer, wherein said device is operable to oscillate light of wavelength of 380 nm or shorter, and an active layer is provided between a first electrically conductive type of layer and a second electrically conductive type of layer, and said active layer has a quantum well structure including at least a well layer formed of a nitride semiconductor containing In and Al, and a barrier layer formed of a nitride semiconductor containing Al, and said device has a laser device structure in which said first electrically conductive type of layer has a first light guiding layer, said second electrically conductive type of layer has a second light guiding layer, and said active layer is provided between said first light guiding layer and said second light guiding layer, and the band gap energies $E_g$ of both said first light guiding layer and said second light guiding layer are greater than the photon energy $E_p$ of laser light by 0.05 eV or greater ($E_g-E_p$ 0.05 eV).

20. The nitride semiconductor device according to claim 19, wherein said well layer is formed of $Al_xIn_yGa_{1-x-y}N$ (0<x≦1, 0<y≦1, x+y<1) and said barrier layer is formed of $Al_uIn_vGa_{1-u-v}N$ (0<u≦1, 0≦v≦1, u+v<1).

21. The nitride semiconductor device according to claim 20, wherein a thickness of said well layer is smaller than that of the barrier layer.

22. The nitride semiconductor device according to claim 21, wherein an In composition ratio y in said well layer is in a range of not less than 0.02 and not greater than 0.05.

23. The nitride semiconductor device according to claim 21, wherein an In composition ratio y in said well layer is in a range of not less than 0.03 and not greater than 0.05.

24. The nitride semiconductor device according to claim 19, wherein said first light guiding layer and/or said second light guiding layer are formed of $Al_xGa_{1-x}N$ (0≦x≦1).

25. The nitride semiconductor device according to claim 22, wherein said active layer emits light of wavelength of 380 nm or shorter, and said first electrically conductive type of layer and/or said second electrically conductive type of layer are formed of $Al_xGa_{1-x}N$ (0<x≦1).

26. The nitride semiconductor device according to claim 1, wherein the Al composition ratio x and the In composition ratio y in said well layer satisfy the following relation: x≧y.

27. The nitride semiconductor device according to claim 19, wherein the Al composition ratio x and the In composition ratio y in said well layer satisfy the following relation: x≧y.

* * * * *